US012080990B2

United States Patent
Yamaguchi et al.

(10) Patent No.: US 12,080,990 B2
(45) Date of Patent: Sep. 3, 2024

(54) SEMICONDUCTOR LASER DEVICE

(71) Applicant: ROHM CO., LTD., Kyoto (JP)

(72) Inventors: Atsushi Yamaguchi, Kyoto (JP); Koki Sakamoto, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 799 days.

(21) Appl. No.: 17/289,671

(22) PCT Filed: Nov. 20, 2019

(86) PCT No.: PCT/JP2019/045434
§ 371 (c)(1),
(2) Date: Apr. 28, 2021

(87) PCT Pub. No.: WO2020/116165
PCT Pub. Date: Jun. 11, 2020

(65) Prior Publication Data
US 2021/0408758 A1  Dec. 30, 2021

(30) Foreign Application Priority Data
Dec. 5, 2018 (JP) .................................. 2018-227796

(51) Int. Cl.
*H01S 5/02345* (2021.01)
*H01S 5/02315* (2021.01)
(Continued)

(52) U.S. Cl.
CPC ...... *H01S 5/02345* (2021.01); *H01S 5/02315* (2021.01); *H01S 5/042* (2013.01); *H01S 5/0608* (2013.01)

(58) Field of Classification Search
CPC .. H01S 5/02345; H01S 5/02315; H01S 5/042; H01S 5/0608
See application file for complete search history.

(56) References Cited

U.S. PATENT DOCUMENTS

| 2003/0160258 A1* | 8/2003 | Oohata | H01S 5/32325 |
| | | | 257/E33.059 |
| 2018/0254605 A1* | 9/2018 | Wojcik | H01S 5/0231 |

(Continued)

FOREIGN PATENT DOCUMENTS

| JP | 2005-50896 A | 2/2005 |
| JP | 2009-59929 A | 3/2009 |
| JP | 2018-128432 A | 8/2018 |

OTHER PUBLICATIONS

International Search Report issued in PCT/JP2019/045434, Feb. 18, 2020 (2 pages).

*Primary Examiner* — Yuanda Zhang
(74) *Attorney, Agent, or Firm* — HSML P.C.

(57) ABSTRACT

Semiconductor laser device A1 includes semiconductor laser element 4, switching element 5 having gate electrode 52, source electrode 53 and drain electrode 54, and support member 1 having conductive part 3 that forms a conduction path to switching element 5 and semiconductor laser element 4 and supports semiconductor laser element 4 and switching element 5. Conductive part 3 has front surface first section 311 spaced apart from semiconductor laser element 4. Semiconductor laser device A1 includes at least one first wire 71 connected to source electrode 53 of switching element 5 and semiconductor laser element 4 and also at least one second wire 72 connected to source electrode 53 of switching element 5 and front surface first section 311 of conductive part 3. Such an arrangement reduces the inductance component of semiconductor laser device A1.

19 Claims, 53 Drawing Sheets

(51) Int. Cl.
*H01S 5/042* (2006.01)
*H01S 5/06* (2006.01)

(56) References Cited

U.S. PATENT DOCUMENTS

| 2018/0278011 A1* | 9/2018 | Galvano | G01S 7/4813 |
| 2020/0136611 A1* | 4/2020 | Godfrey | H05K 7/2039 |
| 2021/0288464 A1* | 9/2021 | Fröhlich | H01S 5/0261 |

* cited by examiner

SEMICONDUCTOR LASER DEVICE

TECHNICAL FIELD

The present disclosure relates to a semiconductor laser device.

BACKGROUND ART

Systems using LiDAR (Light Detection and Ranging, Laser Imaging Detection and Ranging) have been proposed as a means for three-dimensional distance measurement in e.g. automobiles (see e.g., Patent Document 1). However, semiconductor laser devices used as the light source of LiDAR emit pulsed laser light having a pulse width of not more than several tens of nanoseconds. Thus, the rate of change of the current with time is considerably high, which increases the loss due to the inductance component in the semiconductor laser device.

TECHNICAL REFERENCE

Patent Document

Patent Document 1: JP-A-2018-128432

SUMMARY OF THE INVENTION

Problems to be Solved by the Invention

The present disclosure has been proposed under the above-noted circumstances, and an object thereof is to provide a semiconductor laser device capable of reducing the inductance component.

Means to Solve the Problem

According to the present disclosure, there is provided a semiconductor laser device comprising: a semiconductor laser element; a switching element with a gate electrode, a source electrode and a drain electrode; and a support member including a conductive part that forms a conduction path to the switching element and the semiconductor laser element and supports the semiconductor laser element and the switching element. The conductive part has a first section spaced apart from the semiconductor laser element. The semiconductor laser device further comprises: at least one first wire connected to the source electrode of the switching element and the semiconductor laser element; and at least one second wire connected to the source electrode of the switching element and the first section of the conductive part.

Advantages of Invention

The semiconductor laser device of the present disclosure is capable of reducing the inductance component.

Other features and advantages of the present disclosure will become clearer from the detailed description given below with reference to the accompanying drawings.

MODE FOR CARRYING OUT THE INVENTION

Figure 1:
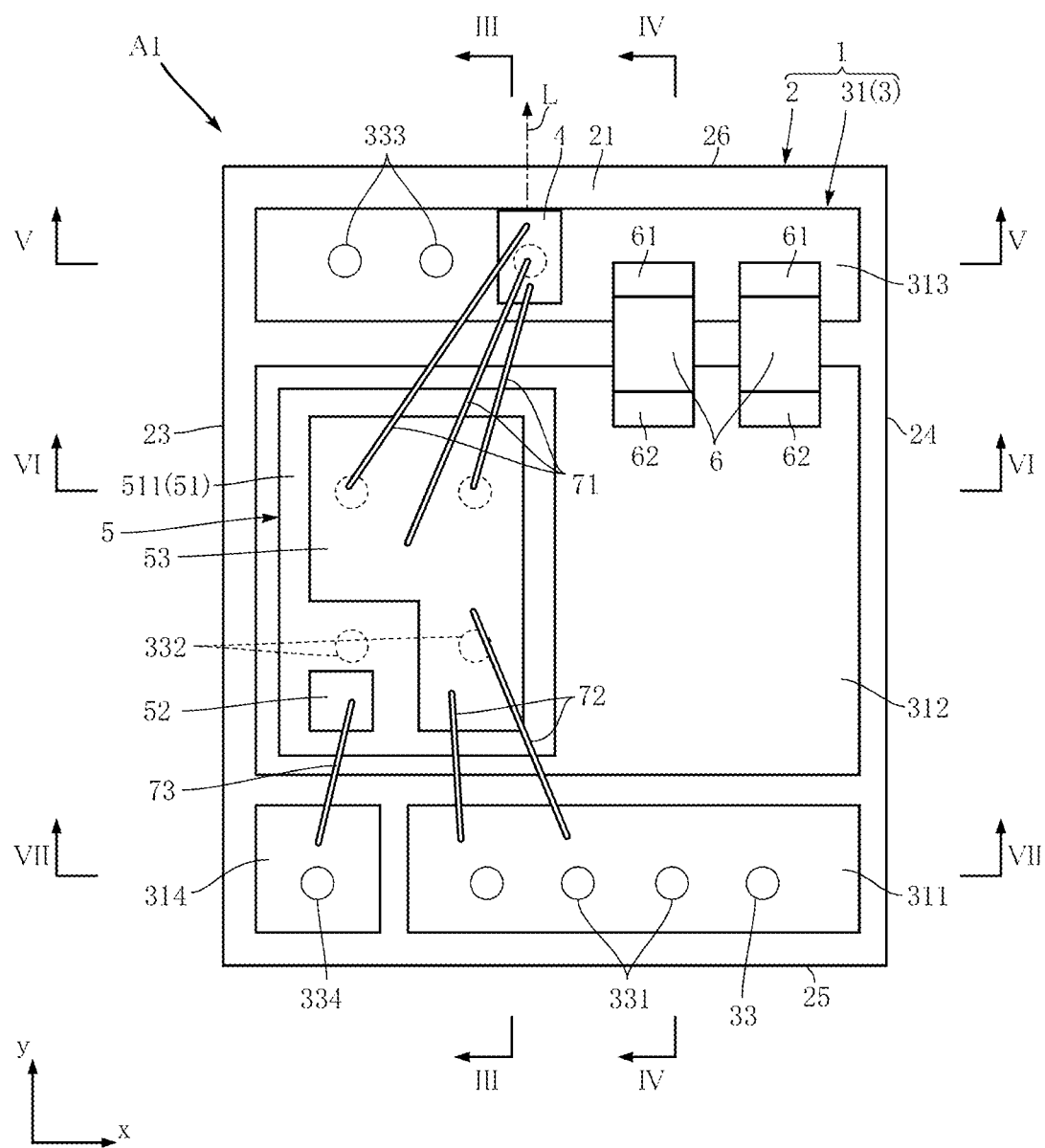
FIG. 1 is a schematic plan view showing a semiconductor laser device according to a first embodiment of the present disclosure.

Preferred embodiments of the present disclosure are described below with reference to the accompanying drawings.

In the present disclosure, the terms such as "first", "second", and "third" are used merely as labels and are not necessarily intended to order the objects.

First Embodiment

FIGS. 1-8 show a semiconductor laser device according to a first embodiment of the present disclosure. The semiconductor laser device A1 of the present embodiment includes a support member 1, a semiconductor laser element 4, a switching element 5, a capacitor 6, first wires 71, second wires 72, a third wire 73 and a light-transmitting resin 8. The semiconductor laser device A1 constitutes a laser system B1 shown in FIG. 8, for example, and is used as a pulsed laser source for LiDAR as an example of two-dimensional distance measurement. However, the use of the semiconductor laser device of the present disclosure is not limited in any way.

Figure 2:
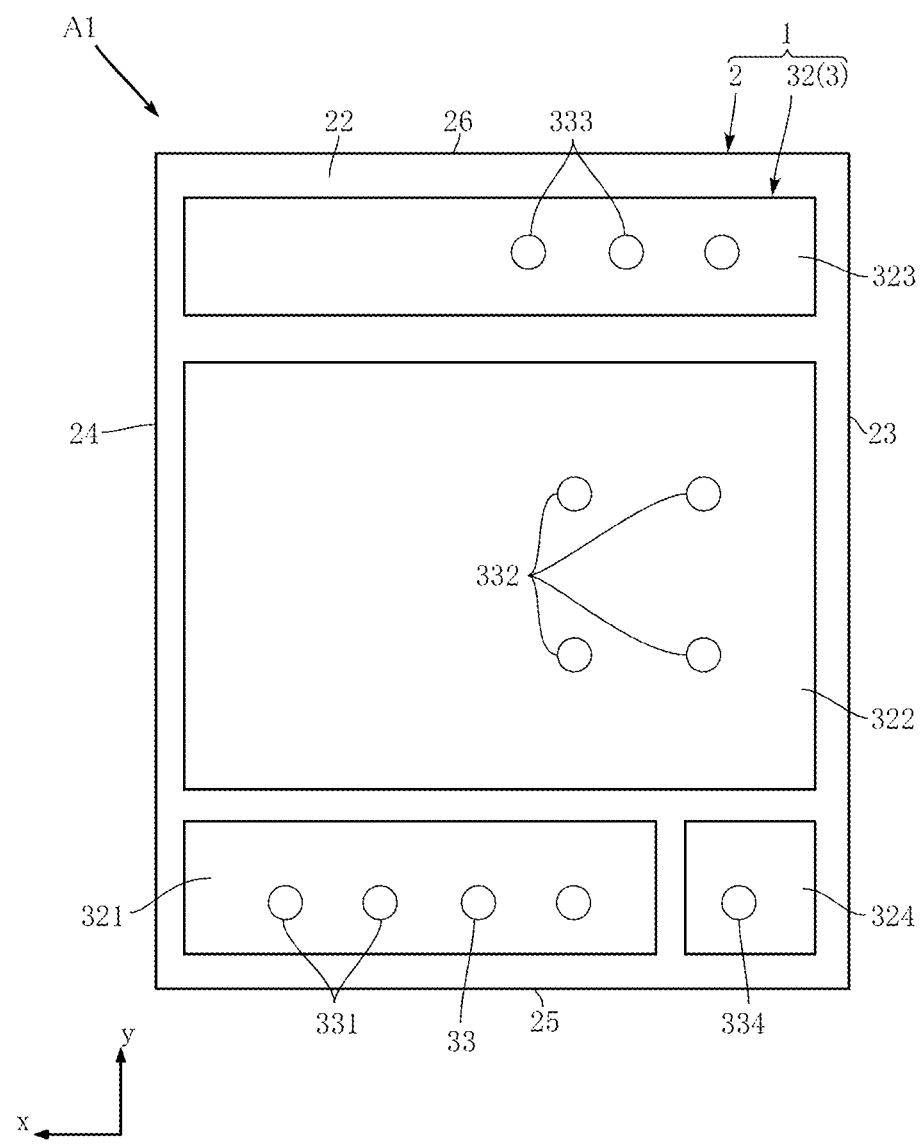
FIG. 2 is a bottom view showing the semiconductor laser device according to the first embodiment of the present disclosure.
Figure 3:
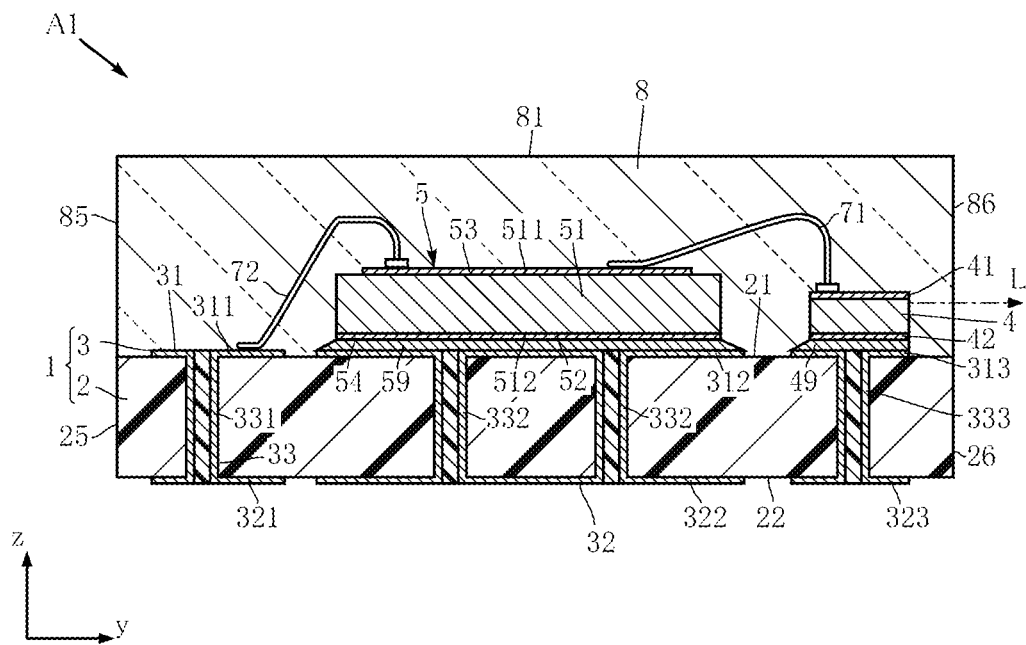
FIG. 3 is a sectional view taken along line III-III in FIG. 1.
Figure 4:
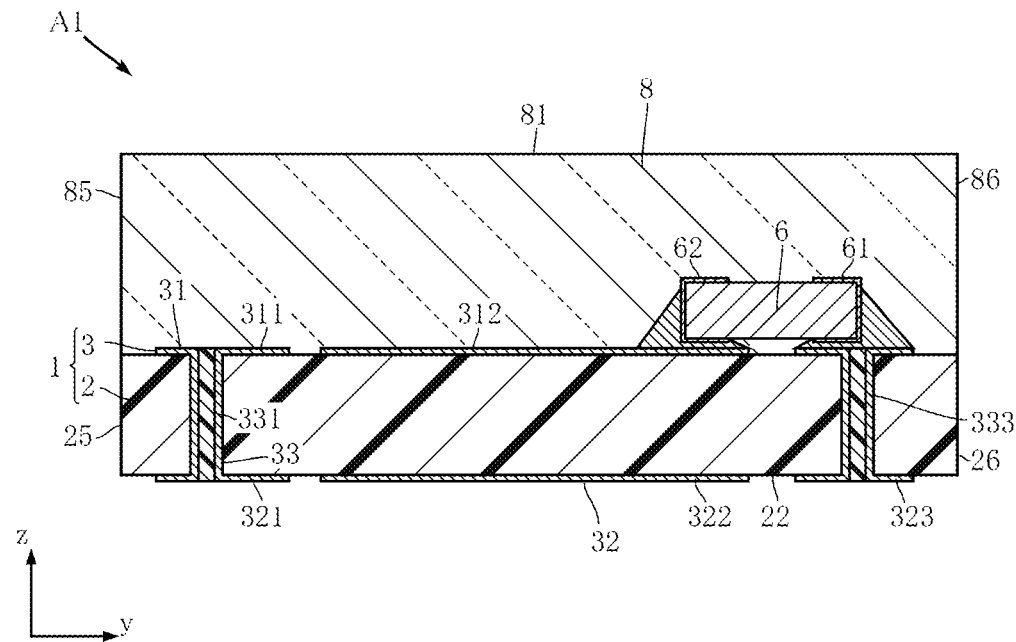
FIG. 4 is a sectional view taken along line IV-IV in FIG. 1.
Figure 5:
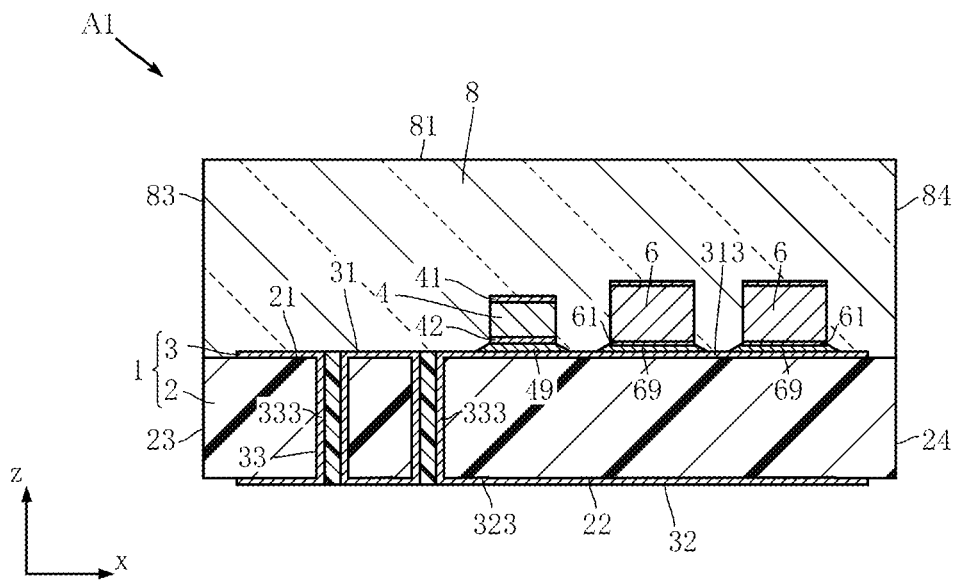
FIG. 5 is a sectional view taken along line V-V in FIG. 1.
Figure 6:
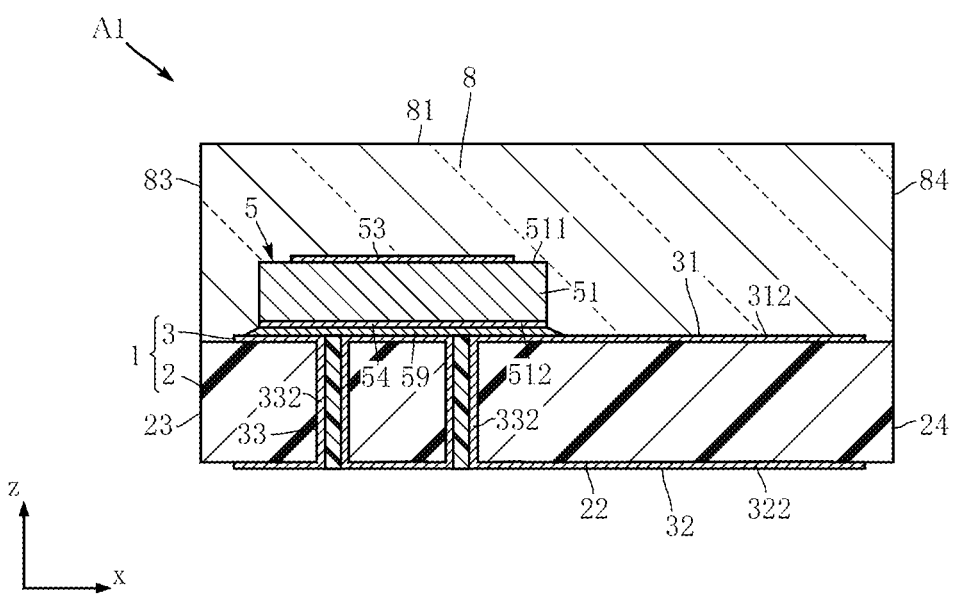
FIG. 6 is a sectional view taken along line VI-VI in FIG. 1.
Figure 7:
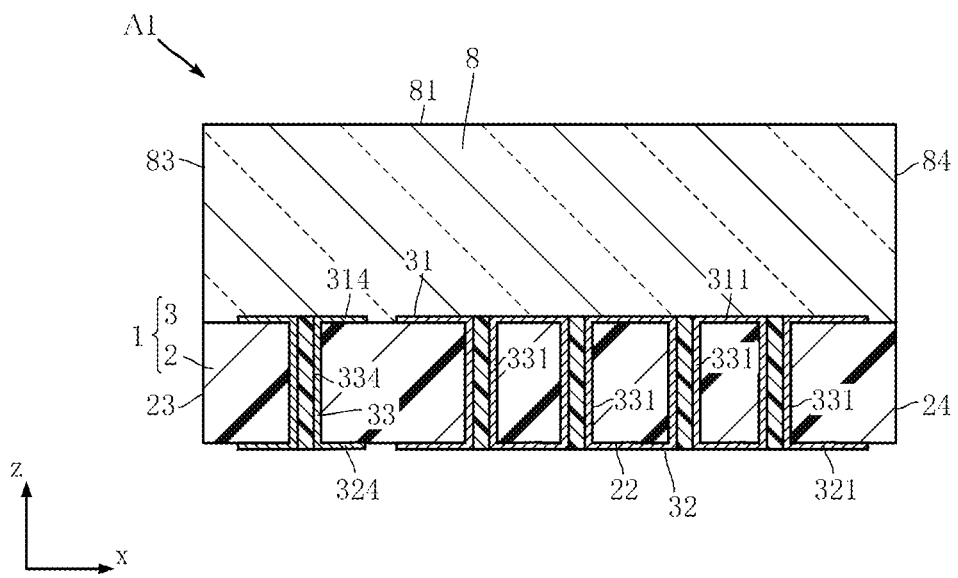
FIG. 7 is a sectional view taken along line VII-VII in FIG. 1.
Figure 8:
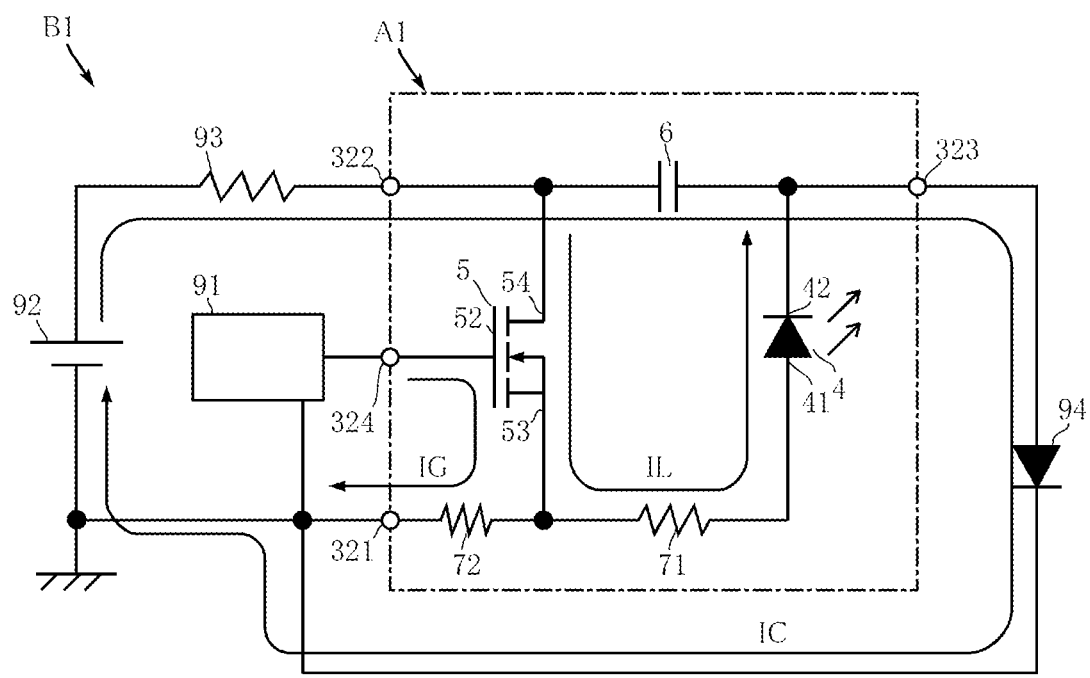
FIG. 8 is a circuit diagram showing a laser system including the semiconductor laser device according to the first embodiment of the present disclosure.

FIG. 1 is a schematic plan view of the semiconductor laser device A1. FIG. 2 is a bottom view of the semiconductor laser device A1. FIG. 3 is a sectional view taken along line III-III in FIG. 1. FIG. 4 is a sectional view taken along line IV-IV in FIG. 1. FIG. 5 is a sectional view taken along line V-V in FIG. 1. FIG. 6 is a sectional view taken along line VI-VI in FIG. 1. FIG. 7 is a sectional view taken along line VII-VII in FIG. 1. FIG. 8 is a circuit diagram showing a laser system B1 incorporating the semiconductor laser device A1. In these figures, the z direction corresponds to the "first direction" according to the present disclosure. In FIG. 1, the illustration of the light-transmitting resin 8 is omitted for convenience of explanation.

The support member 1 supports the semiconductor laser element 4 and the switching element 5 while forming a conduction path to the semiconductor laser element 4 and the switching element 5. The specific configuration of the support member 1 is not particularly limited. In the present embodiment, the support member 1 includes a base 2 and a conductive part 3.

The base 2 is made of an insulating material. The material for the base 2 is not particularly limited and may be an epoxy resin or a ceramic material, for example. Hereinafter, the base 2 made of glass epoxy resin is described as an example. In the present embodiment, the base 2 has a front surface 21, a back surface 22, a first surface 23, a second surface 24, a third surface 25 and a fourth surface 26 and may be rectangular as viewed in the z direction.

The front surface 21 faces one side in the z direction and is flat in the illustrated example. The back surface 22 faces the other side in the z direction or faces away from the front surface 21 and is flat in the illustrated example. The first surface 23 faces one side in the x direction and is flat in the illustrated example. The second surface 24 faces the other side in the x direction or faces away from the first surface 23 and is flat in the illustrated example. The third surface 25 faces one side in the y direction and is flat in the illustrated example. The fourth surface 26 faces the other side in the y direction or face away from the third surface 25 and is flat in the illustrated example.

The conductive part 3 forms a conduction path to the semiconductor laser element 4 and the switching element 5. The material for the conductive part 3 is not particularly limited and may be a metal such as Cu, Ni, Ti or Au. The method for forming the conductive part 3 is not particularly limited, and plating may be employed in the illustrated example.

The conductive part 3 of the present embodiment includes a front surface portion 31, a back surface portion 32 and a connecting portion 33.

The front surface portion 31 is disposed on the front surface 21 of the base 2. In the illustrated example, the front surface portion 31 includes a front surface first section 311, a front surface second section 312, a front surface third section 313 and a front surface fourth section 314.

As shown in FIGS. 1, 3, 4 and 7, the front surface first section 311 is disposed on the front surface 21 of the base 2 at a location offset toward the second surface 24 in the x direction and toward the third surface 25 in the y direction. The shape of front surface first section 311 is not particularly limited and is an elongated rectangle with the longer side extending in the x direction in the illustrated example. The front surface first section 311 is an example of the "first section" according to the present disclosure. The front surface first section 311 of the present embodiment is spaced apart from the second surface 24 and the third surface 25.

As shown in FIGS. 1, 3, 4 and 6, the front surface second section 312 is located closer to the fourth surface 26 than is the front surface first section 311 in the y direction. The dimension of the front surface second section 312 in the x direction is larger than that of the front surface first section 311. The front surface second section 312 overlaps with the front surface first section 311 as viewed in the y direction. The shape of the front surface second section 312 is not particularly limited and is rectangular in the illustrated example. The area of the front surface second section 312 is larger than those of the front surface first section 311, the front surface third section 313 and the front surface fourth section 314. The front surface second section 312 of the present embodiment is spaced apart from the first surface 23 and the second surface 24.

As shown in FIGS. 1, 3, 4 and 5, the front surface third section 313 is located closer to the fourth surface 26 than is the front surface second section 312 in the y direction. The shape of the front surface third section 313 is not particularly limited and is an elongated rectangle with the longer side extending in the x direction in the illustrated example. In the illustrated example, the dimension of the front surface third section 313 in the x direction is generally the same as that of the front surface second section 312. The front surface third section 313 overlaps with the front surface first section 311 and the front surface second section 312 as viewed in the y direction. The front surface third section 313 of the present embodiment is spaced apart from the first surface 23, the second surface 24 and the fourth surface 26.

As shown in FIGS. 1 and 7, the front surface fourth section 314 is located closer to the first surface 23 than is the front surface first section 311 in the x direction and closer to the third surface 25 than is the front surface second section 312 in the y direction. The shape of the front surface fourth section 314 is not particularly limited and is rectangular in the illustrated example. In the illustrated example, the dimension of the front surface fourth section 314 in the y direction is generally the same as that of the front surface first section 311. The dimension of the front surface fourth section 314 in the x direction is smaller than that of the front surface first section 311. The area of the front surface fourth section 314 is smaller than that of the front surface first section 311. The front surface fourth section 314 overlaps with the front surface first section 311 as viewed in the x direction. The front surface fourth section 314 overlaps with the front surface second section 312 and the front surface third section 313 as viewed in the y direction. The front surface fourth section 314 of the present embodiment is spaced apart from the first surface 23 and the third surface 25.

The back surface portion 32 is disposed on the back surface 22 of the base 2. In the illustrated example, the back surface portion 32 includes a back surface first section 321, a back surface second section 322, a back surface third section 323 and a back surface fourth section 324. In the present embodiment, the back surface portion 32 is used as a mount terminal for mounting the semiconductor laser device A1 onto e.g. a circuit board (not shown).

As shown in FIGS. 2, 3, 4 and 7, the back surface first section 321 is disposed on the back surface 22 of the base 2 at a location offset toward the second surface 24 in the x direction and toward the third surface 25 in the y direction. The shape of the back surface first section 321 is not particularly limited and is an elongated rectangle with the longer side extending in the x direction in the illustrated example. The back surface first section 321 of the present embodiment is spaced apart from the second surface 24 and the third surface 25.

As shown in FIGS. 2, 3, 4 and 6, the back surface second section 322 is located closer to the fourth surface 26 than is the back surface first section 321 in the y direction. The dimension of the back surface second section 322 in the x direction is larger than that of the back surface first section 321. The back surface second section 322 overlaps with the back surface first section 321 as viewed in the y direction. The shape of the back surface second section 322 is not particularly limited and is rectangular in the illustrated example. The area of the back surface second section 322 is larger than those of the back surface first section 321, the back surface third section 323 and the back surface fourth section 324. The back surface second section 322 of the present embodiment is spaced apart from the first surface 23 and the second surface 24.

As shown in FIGS. 2, 3, 4 and 5, the back surface third section 323 is located closer to the fourth surface 26 than is the back surface second section 322 in the y direction. The shape of the back surface third section 323 is not particularly limited and is an elongated rectangle with the longer side extending in the x direction in the illustrated example. In the illustrated example, the dimension of the back surface third section 323 in the x direction is generally the same as that of the back surface second section 322. The back surface third section 323 overlaps with the back surface first section 321 and the back surface second section 322 as viewed in the y direction. The back surface third section 323 of the present embodiment is spaced apart from the first surface 23, the second surface 24 and the fourth surface 26.

As shown in FIGS. 2 and 7, the back surface fourth section 324 is located closer to the first surface 23 than is the back surface first section 321 in the x direction and closer to the third surface 25 than is the back surface second section 322 in the y direction. The shape of the back surface fourth section 324 is not particularly limited and is rectangular in the illustrated example. In the illustrated example, the dimension of the back surface fourth section 324 in the y direction is generally the same as that of the back surface first section 321. The dimension of the back surface fourth section 324 in the x direction is smaller than that of the back surface first section 321. The area of the back surface fourth section 324 is smaller than that of the back surface first section 321. The back surface fourth section 324 overlaps with the back surface first section 321 as viewed in the x direction. The back surface fourth section 324 overlaps with the back surface second section 322 and the back surface third section 323 as viewed in the y direction. The back surface fourth section 324 of the present embodiment is spaced apart from the first surface 23 and the third surface 25.

The connecting portion 33 electrically connects respective sections of the front surface portion 31 and relevant sections of the back surface portion 32. The specific configuration of the connecting portion 33 is not particularly limited. In the illustrated example, as shown in FIGS. 1 and 2, the connecting portion 33 includes a plurality of first connecting portions 331, a plurality of second connecting portions 332, a plurality of third connecting portions 333 and a fourth connecting portion 334. Note that the numbers of the first connecting portions 331, the second connecting portions 332, the third connecting portions 333 and the fourth connecting portion 334 are not limited.

The specific configuration of the first connecting portions 331, the second connecting portions 332, the third connecting portions 333 and the fourth connecting portion 334 is not particularly limited. In the present embodiment, in an inner region (i.e., the region spaced apart from the first surface 23, the second surface 24, the third surface 25 and the fourth surface 26) of the base 2 as viewed in the z direction, these connecting portions penetrate the base 2 in the thickness direction, as shown in FIGS. 1-7. The first connecting portions 331, the second connecting portions 332, the third connecting portions 333 and the fourth connecting portion 334 having such a configuration are provided by forming a metal plating layer on the inner surfaces of the through-holes formed in the base 2 and reach the front surface 21 and the back surface 22. Though the portions on the inner side of the first connecting portions 331, the second connecting portions 332, the third connecting portions 333 and the fourth connecting portion 334 are filed with resin in the illustrated example, it may be filled with a metal, for example.

As shown in FIGS. 1, 2, 3, 4 and 7, the first connecting portions 331 are connected to the front surface first section 311 and the back surface first section 321, connecting the front surface first section 311 and the back surface first section 321 to each other. In the present embodiment, the first connecting portions 331 are aligned in the x direction.

As shown in FIGS. 1, 2 and 6, the second connecting portions 332 are connected to the front surface second section 312 and the back surface second section 322, connecting the front surface second section 312 and the back surface second section 322 to each other. In the present embodiment, the second connecting portions 332 are offset toward the first surface 23 in the x direction. In the illustrated example, the second connecting portions 332 are arranged in a matrix along the x direction and the y direction.

As shown in FIGS. 1, 2, 3 and 5, the third connecting portions 333 are connected to the front surface third section 313 and the back surface third section 323, connecting the front surface third section 313 and the back surface third section 323 to each other. In the present embodiment, the third connecting portions 333 are aligned in the x direction. The third connecting portions 333 are offset toward the first surface 23 in the x direction.

As shown in FIGS. 1, 2 and 7, the fourth connecting portion 334 is connected to the front surface fourth section 314 and the back surface fourth section 324, connecting the front surface fourth section 314 and the back surface fourth section 324 to each other. Unlike the illustrated example, a plurality of fourth connecting portions 334 may be provided.

The semiconductor laser element 4 is the light source of the semiconductor laser device A1 and includes, for example, an active layer made of a semiconductor layer. In the present embodiment, as shown in FIG. 3, the semiconductor laser element 4 includes a first laser electrode 41 and a second laser electrode 42. The first laser electrode 41 is provided on the side in the z direction to which the front surface 21 faces. The second laser electrode 42 is provided on the side in the z direction to which the back surface 22 faces. In FIG. 1, the illustration of the first laser electrode 41 is omitted. In the present embodiment, the first laser electrode 41 is an anode electrode, and the second laser electrode 42 is a cathode electrode.

As shown in FIGS. 1 and 3, in the present embodiment, the semiconductor laser element 4 is disposed on the front surface third section 313. Specifically, the second laser electrode 42 of the semiconductor laser element 4 is bonded for electrical connection to the front surface third section 313 with a conductive bonding material 49. The conductive bonding material 49 may be solder or silver paste, for example. In the illustrated example, the semiconductor laser element 4 is contained in the front surface third section 313 as viewed in the z direction. The semiconductor laser element 4 emits laser light L in the sense of the y direction in which the fourth surface 26 faces. In the illustrated example, as viewed in the z direction, the semiconductor laser element 4 overlaps with the one of the third connecting portions 333 that is closest to the second surface 24 in the x direction.

The switching element 5 performs on/off control of the current to the semiconductor laser element 4. The switching element 5 is a transistor such as a FET made from Si, SiC or GaN, for example. Making the switching element 5 from SiC is suitable for increasing the switching speed. As shown in FIGS. 1, 3 and 6, the switching element 5 of the present embodiment has an element body 51, a gate electrode 52, a source electrode 53 and a drain electrode 54. The element body 51 is made of a semiconductor material such as Si or SiC and has an element front surface 511 and an element back surface 512. The element front surface 511 faces toward the side to which the front surface 21 faces in the z direction. The element back surface 512 faces toward the side to which the back surface 22 faces in the z direction.

The gate electrode 52 is disposed on the element front surface 511. In the illustrated example, the gate electrode 52 is offset toward the first surface 23 in the x direction and offset toward the third surface 25 in the y direction. The shape of gate electrode 52 is not particularly limited and is rectangular as viewed in the z direction in the illustrated example.

The source electrode 53 is disposed on the element front surface 511. In the illustrated example, the source electrode 53 is L-shaped as viewed in the z direction and disposed in a region offset from the gate electrode 52 toward the second surface 24 in the x direction and in a region offset from the gate electrode toward the fourth surface 26 in the y direction.

The drain electrode 54 is disposed on the element back surface 512 and covers almost the entirety of the element back surface 512 in the illustrated example.

The switching element 5 is disposed on the front surface second section 312, with the drain electrode 54 bonded for electrical connection to the front surface second section 312 with a conductive bonding material 59. The conductive bonding material 59 may be solder or silver paste, for example. In the present embodiment, the switching element 5 is disposed on the front surface second section 312 at a location offset toward the first surface 23 in the x direction. As viewed in z direction, the switching element 5 overlaps with all second connecting portions 332. As viewed in the y direction, the switching element 5 overlaps with the semiconductor laser element 4.

The capacitor 6 temporarily stores an electric charge to become a current flowing to the semiconductor laser element 4. As shown in FIGS. 1 and 4, in the illustrated example, the capacitor 6 has an electrode 61 and an electrode 62. The electrode 61 is bonded for electrical connection to the front surface third section 313 with a conductive bonding material 69. The electrode 62 is bonded for electrical connection to the front surface second section 312 with a conductive bonding material 69. The conductive bonding material 69 may be solder, for example. In FIG. 1, the illustration of the conductive bonding material 69 is omitted for the convenience of explanation. In the present embodiment, the semiconductor laser device A1 is provided with two capacitors 6. The two capacitors 6 are connected in parallel to each other. In the present embodiment, the capacitors 6 are located closer to the second surface 24 than are the semiconductor laser element 4 and the switching element 5 in the x direction.

As shown in FIGS. 1 and 3, the first wires 71 are connected to the source electrode 53 of the switching element 5 and the first laser electrode 41 of the semiconductor laser element 4. The first wires 71 may be made of a metal such as Au, Cu or Al. The number of the first wires 71 is not particularly limited and three in the illustrated example. The first wires 71 are connected to a portion of the source electrode 53 which is offset toward the fourth surface 26 in the y direction. The first wires are connected to the first laser electrode 41 of the semiconductor laser element 4 so as to align in the y direction.

As shown in FIGS. 1 and 3, the second wires 72 are connected to the source electrode 53 of the switching element 5 and the front surface first section 311 of the front surface portion 31 of the conductive part 3. The second wires 72 may be made of a metal such as Au, Cu or Al and, in the present embodiment, is made of Au as with the first wires 71. The number of the second wires 72 is not particularly limited and two in the illustrated example, which is smaller than the number of the first wires 71. Thus, the resistance of the first wires 71 is lower than that of the second wires 72. The second wires 72 are connected to a portion of the source electrode 53 which is offset toward the third surface 25 in the y direction. The second wires 72 are connected to front surface first section 311 so as to align in the x direction.

As shown in FIG. 1, the third wire 73 is connected to the gate electrode 52 of the switching element 5 and the front surface fourth section 314 of the front surface portion 31 of the conductive part 3. The third wire 72 may be made of a metal such as Au, Cu or Al and is made of Au in the present embodiment. The number of the third wire 73 is not particularly limited and one in the illustrated example.

The light-transmitting resin 8 is disposed on the front surface 21 to cover the semiconductor laser element 4, the switching element 5, the capacitors 6, the first wires 71, the second wires 72 and the third wire 73. The light-transmitting resin 8 is made of a material that transmits laser light L from the semiconductor laser element 4 and may be made of a transparent epoxy resin or silicone resin, for example.

The shape of the light-transmitting resin 8 is not particularly limited. In the present embodiment, the light-transmitting resin 8 includes a front surface 81, a resin first surface 83, a resin second surface 84, a resin third surface 85 and a resin fourth surface 86.

The front surface 81 faces toward the side to which the front surface 21 faces in the z direction and is flat in the illustrated example. The resin first surface 83 faces toward the side to which the first surface 23 faces in the x direction. In the illustrated example, the resin first surface 83 is flat and flush with the first surface 23. The resin second surface 84 faces toward the side to which the second surface 24 faces in the x direction. In the illustrated example, the resin second surface 84 is flat and flush with the second surface 24. The resin third surface 85 faces toward the side to which the third surface 25 faces in the y direction. In the illustrated example, the resin third surface 85 is flat and flush with the third surface 25. The resin fourth surface 86 faces toward the side to which the fourth surface 26 faces in the y direction. In the illustrated example, the resin fourth surface 86 is flat and flush with the fourth surface 26. In the present embodiment, the laser light L from the semiconductor laser element 4 is emitted through the resin fourth surface 86 of the light-transmitting resin 8. Making the resin surface flat and smooth prevents the laser light L from scattering and increases the emission efficiency.

As shown in FIG. 8, the semiconductor laser device A1 can be used in the laser system B1. The laser system B1 includes a gate driver 91, a DC power supply 92, a resistor 93 and a diode 94 in addition to the semiconductor laser device A1.

The gate driver 91 is connected to the gate electrode 52 of the switching element 5 via the back surface fourth section 324, the fourth connecting portion 334, the front surface fourth section 314 and the third wire 73. The gate driver 91 controls the driving voltage applied to the gate electrode 52.

The DC power supply 92 is a power supply for causing the semiconductor laser element 4 to emit light. The anode electrode of the DC power supply 92 is connected to the back surface second section 322 via the resistor 93.

The diode 94 is provided between the back surface first section 321 and the back surface third section 323 and allows the current to flow from the back surface third section 323 to the back surface first section 321. The diode 94 prevents the application of an excessive reverse voltage to the semiconductor laser element 4 while realizing charging of the capacitors 6.

In the laser system B1 having such a configuration, when the switching element 5 is OFF, the current IC flows from the DC power supply 92 through the path including the resistor 93, the back surface second section 322, the capacitor 6, the back surface third section 323, the diode 94 and the back surface first section 321 to be charged in the capacitor 6. When the switching element 5 is ON, the electric charge stored in the capacitor 6 flows as current IL through the path including the switching element 5, the first wires 71 and the semiconductor laser element 4, so that the semiconductor laser element 4 emits light.

The advantages of the semiconductor laser device A1 are described below.

According to the present embodiment, as shown in FIGS. 1 and 8, the current IG, which flows due to the voltage application by the gate driver 91 to the gate electrode 52 of the switching element 5, flows mainly from the source electrode 53 to the back surface first section 321 through the second wires 72. In contrast, the current IL, which causes the semiconductor laser element 4 to emit light, flows mainly from the source electrode 53 to the semiconductor laser element 4 through the first wires 71. In this way, the current IL and the current IG flow through different paths. Thus, the current IL is prevented from flowing through the current path for applying a gate voltage to the gate electrode 52. Moreover, the source electrode 53 and the semiconductor laser element 4 are connected in series to each other by the first wires 71. With such an arrangement, the inductance component of the path of the current IL can be reduced. This allows faster switching while also achieving a further increase in the peak current value of the current IL. This is advantageous in emitting laser beam L with a smaller pulse width at a higher output and suitable for use as the light source device for LiDAR.

The front surface portion 31, to which the semiconductor laser element 4, the switching element 5 and the capacitor 6 are mounted and the first wires 71, the second wires 72 and the third wire 73 are connected, is arranged on the front surface 21 so as to overlap with the back surface portion 32 used as the connection terminal with the outside, as viewed in the z direction. Such an arrangement is suitable for size reduction of the semiconductor laser device A1 as viewed in the z direction. Moreover, the front surface portion 31 and the back surface portion 32 are connected by the connecting portion 33. The connecting portion 33 includes the first connecting portions 331, the second connecting portions 332, the third connecting portions 333 and the fourth connecting portion 334 that penetrate the base 2. All of the first connecting portions 331, the second connecting portions 332, the third connecting portions 333 and the fourth connecting portion 334 have a shape along the z direction and are not bent. Such an arrangement is advantageous in reducing the inductance component of the current path through the semiconductor laser device A1.

As shown in FIG. 1, the switching element 5 and the capacitors 6 are arranged side by side in the x direction. The semiconductor laser element 4 is mounted on the front surface third section 313, which is closer to the fourth surface 26 than are the switching element 5 and the capacitors 6 in the y direction. Such an arrangement makes the length of the path relatively short that extends from the source electrode 53 of the switching element 5 to the front surface second section 312 through the first wires 71, the semiconductor laser element 4, the front surface third section 313 and the capacitors 6. This is suitable for reducing the inductance component of the path of the current IL in FIG. 8.

The number of the first wires 71 is larger than that of the second wires 72, and the resistance of the first wires 71 is lower than that of the second wires 72. The current IL for causing the semiconductor laser element 4 to emit light flows through the first wires 71. The current IL is considerably larger than the current IG. Lowering the resistance of the first wires 71 leads to reduction of electrical loss.

The number of the second wires 72 is larger than that of the third wire 73. Thus reduces electrical loss related to the current IG.

FIGS. 9-59 show variations and other embodiments of the present disclosure. In these figures, the elements that are identical or similar to those of the foregoing embodiment are denoted by the same reference signs as those used for the foregoing embodiment.

<Laser System B1 First Variation>

Figure 9:
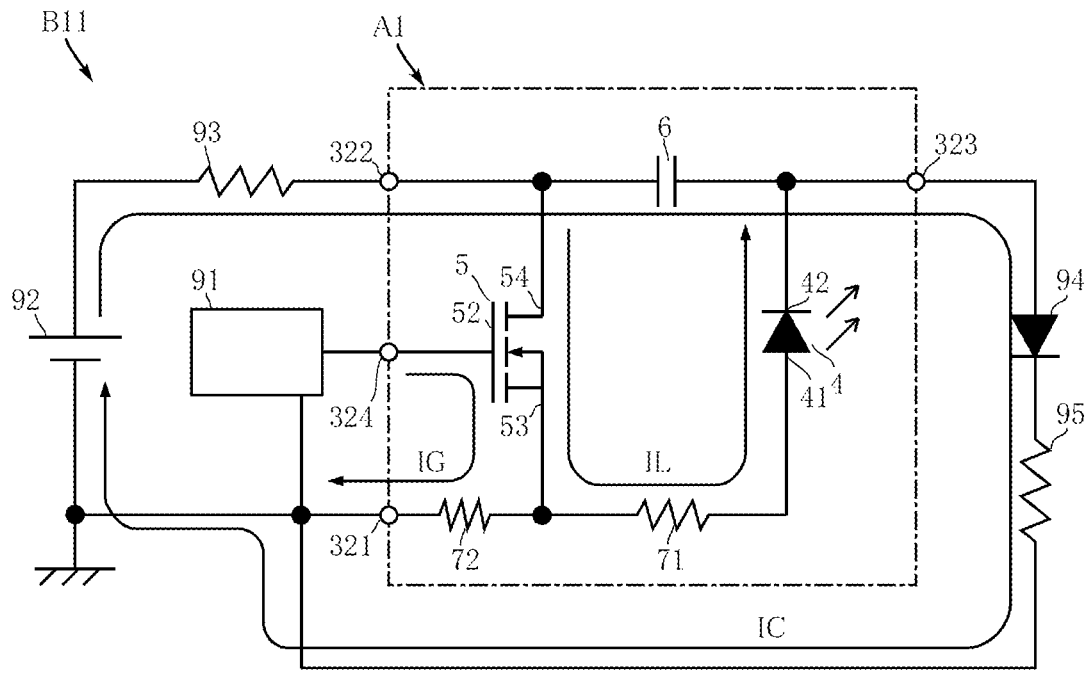
FIG. 9 is a circuit diagram showing a first variation of the laser system including the semiconductor laser device according to the first embodiment of the present disclosure.

FIG. 9 shows a first variation of the laser system B1. The laser system B11 of present variation includes a resistor 95. The resistor 95 is connected in series to the diode 94 between the back surface third section 323 and the back surface first section 321. The provision of the resistor 95 reduces oscillation of the current during the switching of the switching element 5 from the on state to the off state.

<Laser System B1 Second Variation>

Figure 10:
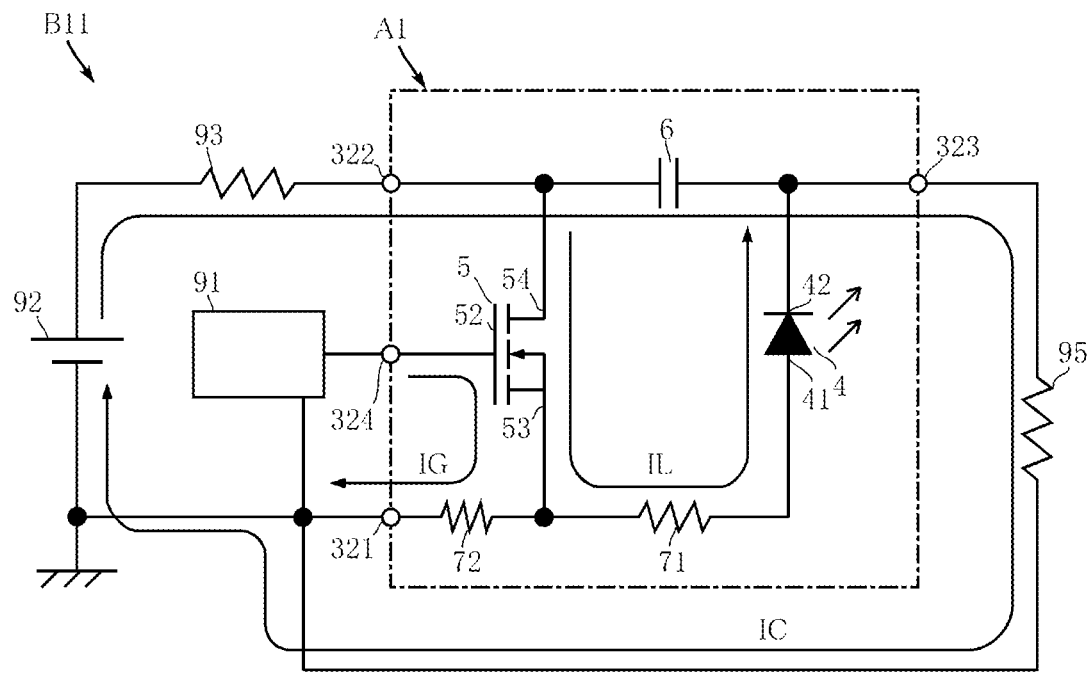
FIG. 10 is a circuit diagram showing a second variation of the laser system including the semiconductor laser device according to the first embodiment of the present disclosure.

FIG. 10 shows a second variation of the laser system B1. The laser system B12 of present variation does not include the above-described diode 94. The resistor 95 is provided between the back surface first section 321 and the back surface third section 323. Though the current can always flow from the back surface first section 321 to the back surface third section 323 in the present variation, the laser system 12 can be properly operated by adjusting the operation conditions.

First Embodiment First Variation

Figure 11:
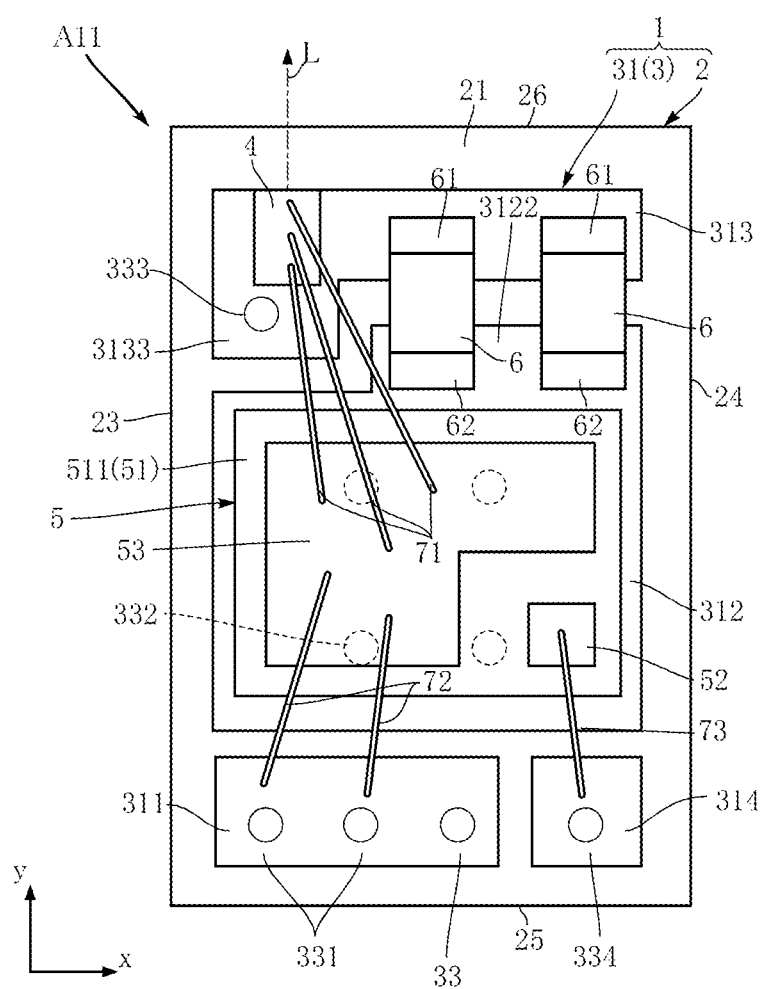
FIG. 11 is a schematic plan view showing a first variation of the semiconductor laser device according to the first embodiment of the present disclosure.
Figure 12:
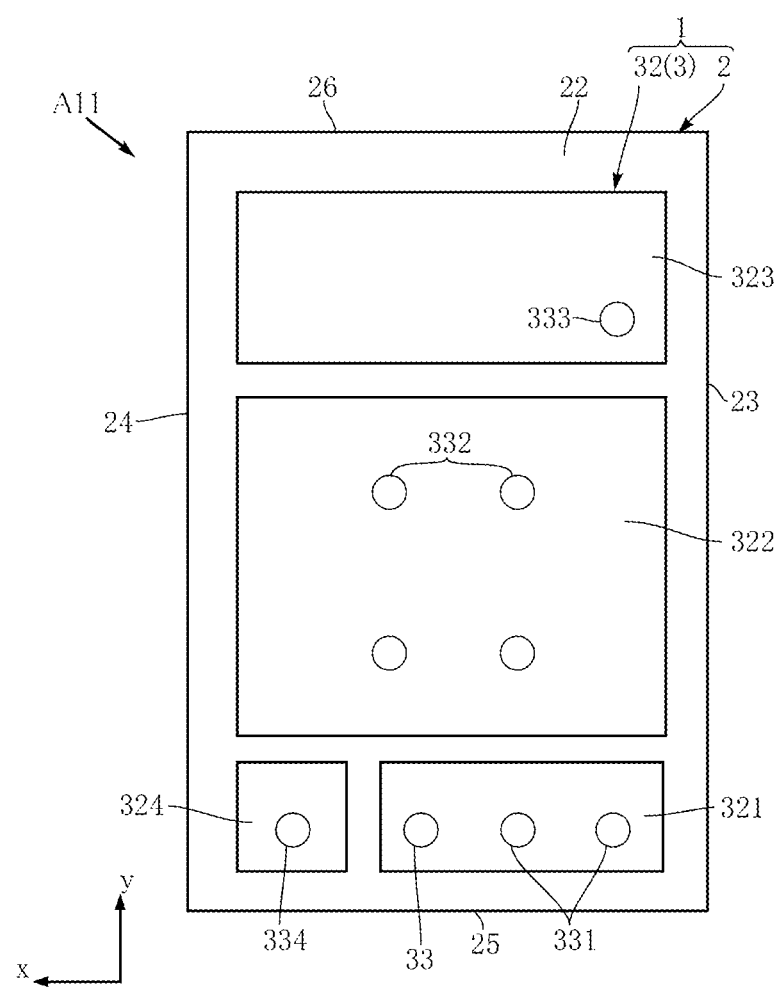
FIG. 12 is a bottom view showing the first variation of the semiconductor laser device according to the first embodiment of the present disclosure.

FIG. 11 is a schematic plan view showing a first variation of the semiconductor laser device A1. FIG. 12 is a bottom view showing the first variation of the semiconductor laser device A1. In the semiconductor laser device A11 of the present variation, on the front surface 21 of the base 2, the front surface first section 311 is offset toward the first surface 23 in the x direction, whereas the front surface fourth section 314 is offset toward the second surface 24 in the x direction. The front surface second section 312 is located closer to the fourth surface 26 than are the front surface first section 311 and the front surface fourth section 314 in the y direction. The front surface third section 313 is located closer to the fourth surface 26 than is the front surface second section 312 in the y direction. The dimensions of the front surface second section 312 and the front surface third section 313 in the x direction are generally the same.

On the back surface 22 of the base 2, the back surface first section 321 is offset toward the first surface 23 in the x direction, whereas the back surface fourth section 324 is offset toward the second surface 24 in the x direction. The back surface second section 322 is located closer to the fourth surface 26 than are the back surface first section 321 and the back surface fourth section 324 in the y direction. The back surface third section 323 is located closer to the fourth surface 26 than is the back surface second section 322 in the y direction. The dimensions of the back surface second section 322 and the back surface third section 323 in the x direction are generally the same.

In this example, the front surface second section 312 has a projection 3122. The projection 3122 is offset toward the second surface 24 in the x direction and projects toward the fourth surface 26 in the y direction. The front surface third section 313 has a projection 3133. The projection 3133 is offset toward the first surface 23 in the x direction and projects toward the third surface 25 in the y direction. The projection 3122 and the projection 3133 are arranged side by side in the x direction and overlap with each other as viewed in the x direction.

The switching element 5 is arranged such that its center in the x direction generally corresponds to the center of the front surface second section 312 in the x direction. The gate electrode 52 is offset toward the second surface 24 in the x direction. The source electrode 53 is arranged in a region offset from the gate electrode 52 toward the first surface 23 in the x direction and in a region offset from the gate electrode toward the fourth surface 26 in the y direction.

The semiconductor laser element 4 is disposed at a location overlapping with the projection 3133 as viewed in the y direction. The electrodes 62 of the capacitors 6 are bonded for electrical connection to the projection 3122 of the front surface second section 312. The semiconductor laser element 4 and the capacitors 6 are arranged side by side in x direction and overlap with each other as viewed in the x direction. As viewed in the y direction, the capacitors 6 overlap with the switching element 5.

The present variation can also reduce the inductance component. Arranging the switching element 5 and the capacitors 6 so as to overlap with each other as viewed in the y direction reduces the dimension of the semiconductor laser device A11 in the x direction. Also, arranging the projection 3122 and the projection 3133 so as to overlap with each other as viewed in the x direction reduces the dimension of the semiconductor laser device A11 in the y direction.

First Embodiment Second Variation

Figure 13:
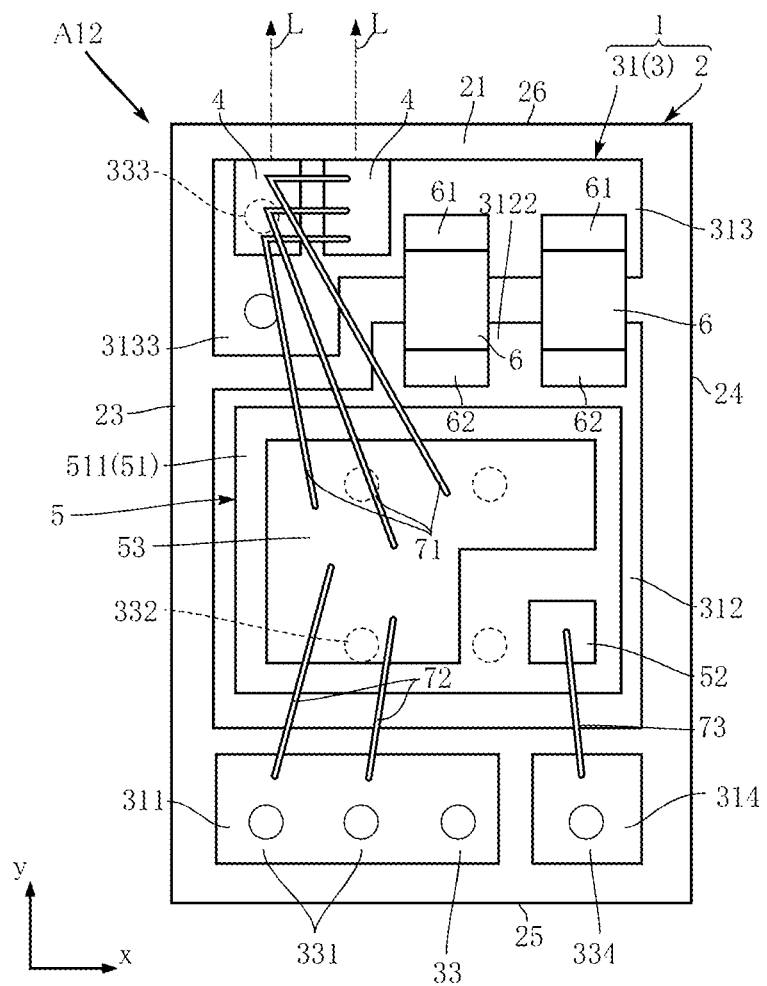
FIG. 13 is a schematic plan view showing a second variation of the semiconductor laser device according to the first embodiment of the present disclosure.
Figure 14:
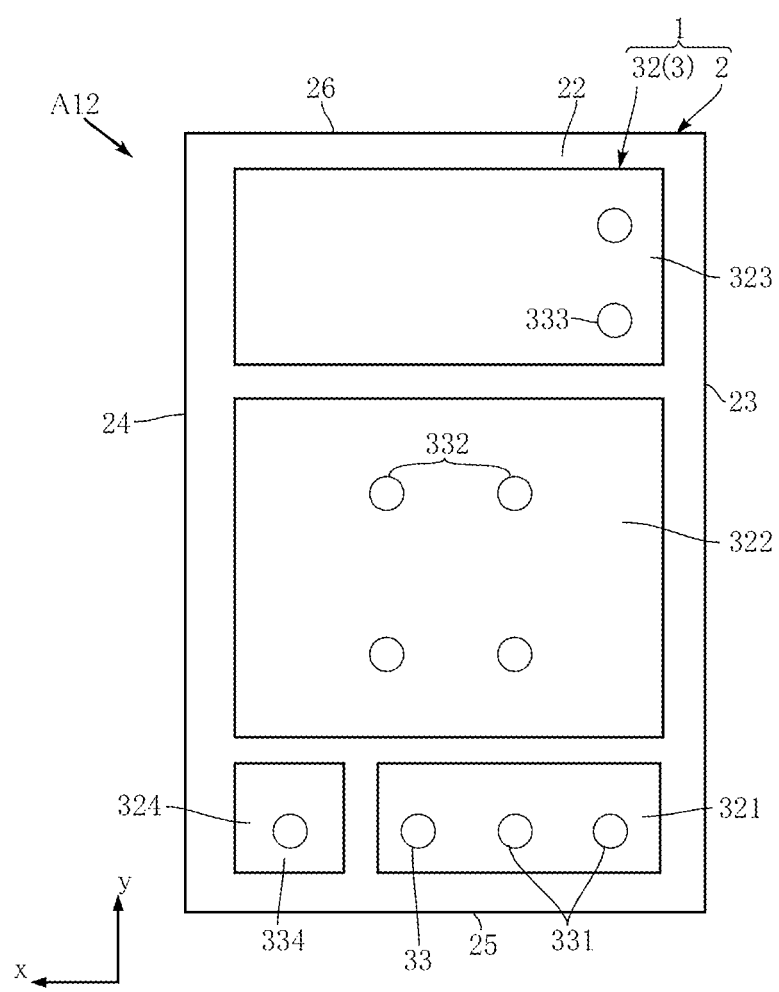
FIG. 14 is a bottom view showing the second variation of the semiconductor laser device according to the first embodiment of the present disclosure.

FIG. 13 is a schematic plan view showing a second variation of the semiconductor laser device A1. FIG. 14 is a bottom view showing the second variation of the semiconductor laser device A1. The semiconductor laser device A12 of the present variation differs from the semiconductor laser device A11 in that the semiconductor laser device A12 includes two semiconductor laser elements 4.

The two semiconductor laser elements 4 are arranged side by side in the x direction. Each of the two semiconductor laser elements 4 emits laser light L in the y direction.

Each of the first wires 71 is connected to the source electrode 53, the first laser electrode 41 of one of the semiconductor laser elements 4, and the first laser electrode 41 of the other semiconductor laser element 4, and has a bent shape.

The present variation can also reduce the inductance component. Moreover, the provision of the two semiconductor laser elements 4 increases the brightness.

First Embodiment Third Variation

Figure 15:
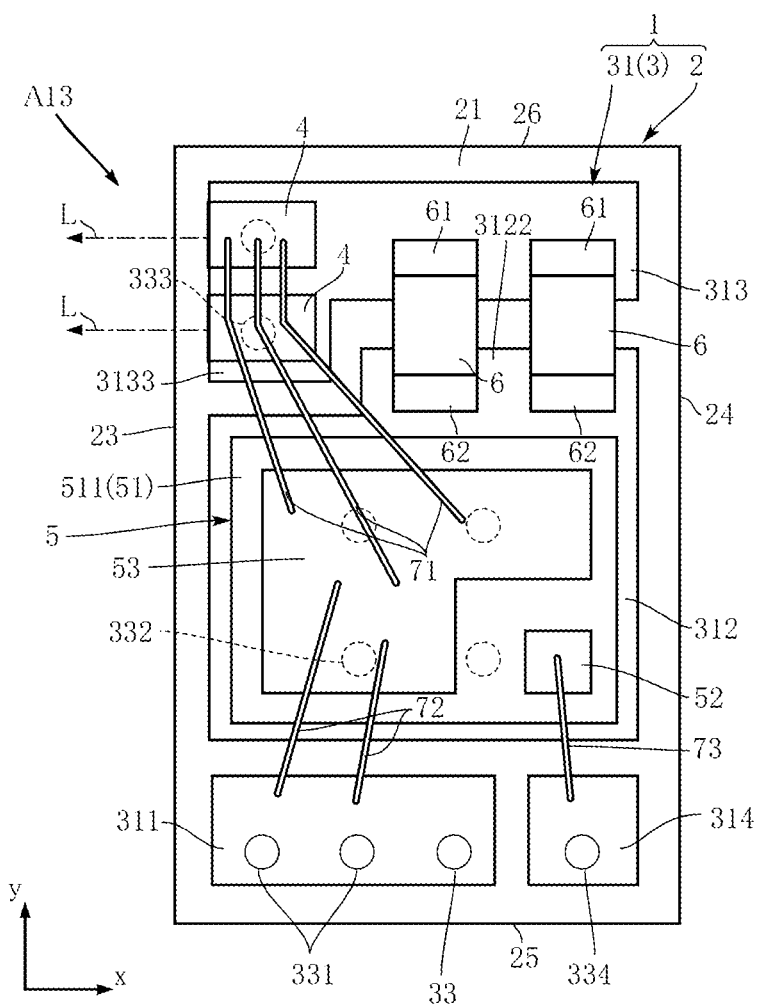
FIG. 15 is a schematic plan view showing a third variation of the semiconductor laser device according to the first embodiment of the present disclosure.
Figure 16:
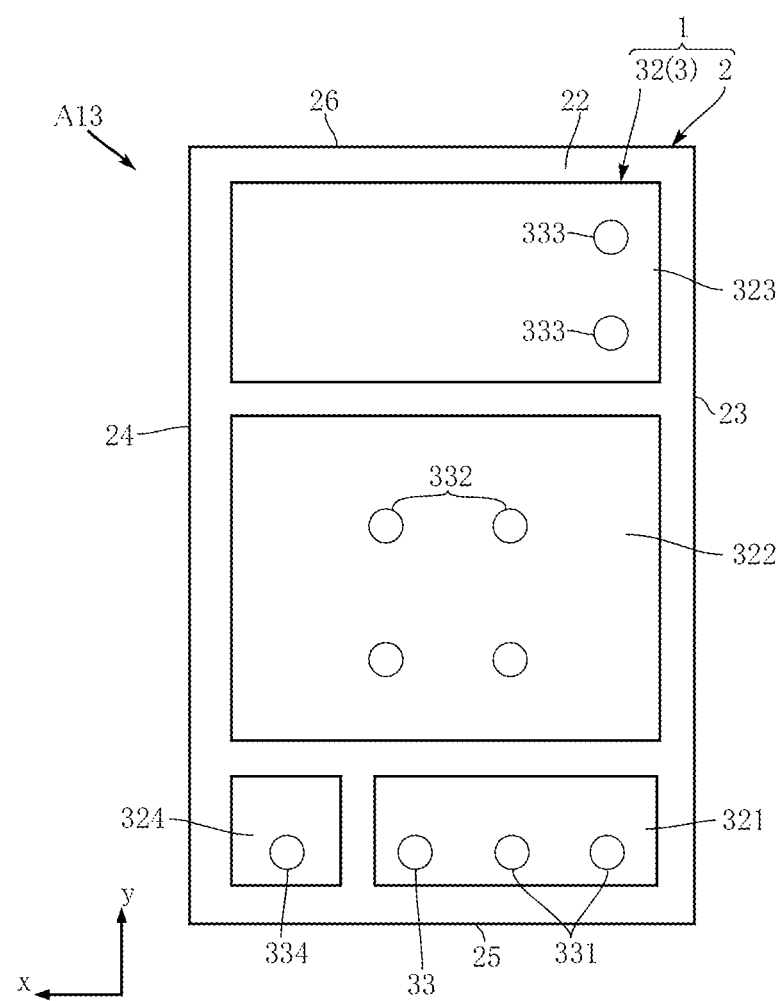
FIG. 16 is a bottom view showing the third variation of the semiconductor laser device according to the first embodiment of the present disclosure.

FIG. 15 is a schematic plan view showing a third variation of the semiconductor laser device A1. FIG. 16 is a bottom view showing the third variation of the semiconductor laser device A1. The semiconductor laser device A13 of the present variation differs from the semiconductor laser device A12 in that the two semiconductor laser elements 4 emit laser light L in the x direction.

The two semiconductor laser elements 4 are arranged side by side in the y direction. One of the semiconductor laser elements is disposed on the projection 3133. Each of the two semiconductor laser elements 4 emits laser light L in the x direction.

The present variation can also reduce the inductance component. Moreover, the provision of the two semiconductor laser elements 4 increases the brightness. As will be understood from the present variation, the emission direction of the laser light L can be set as appropriate.

First Embodiment Fourth Variation

Figure 17:
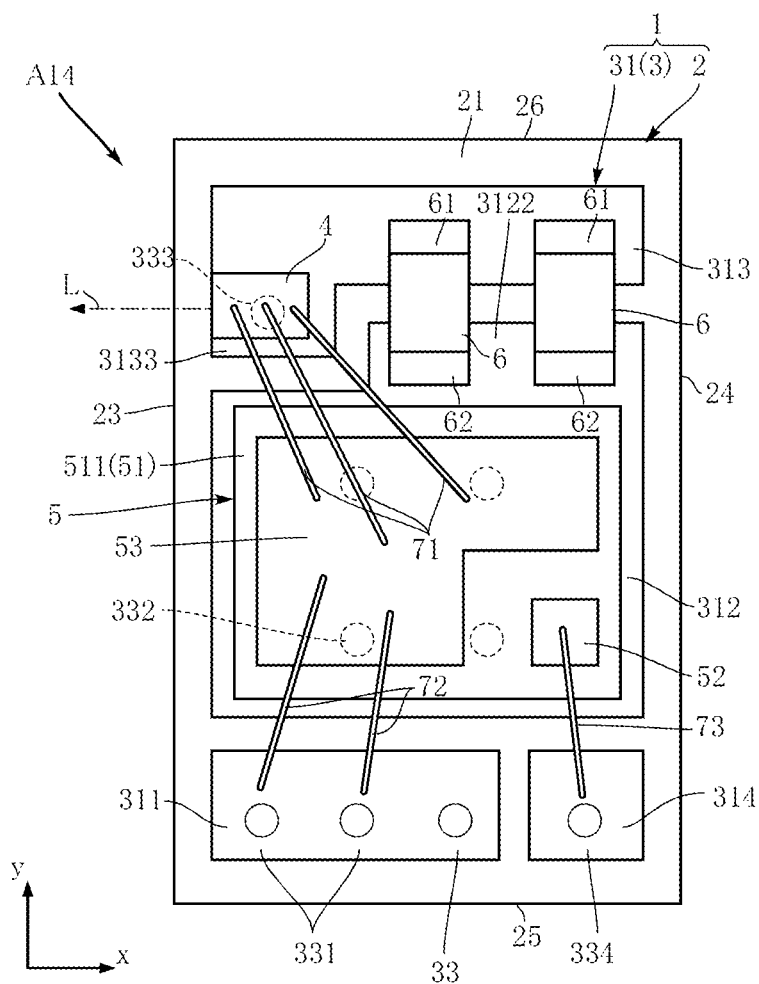
FIG. 17 is a schematic plan view showing a fourth variation of the semiconductor laser device according to the first embodiment of the present disclosure.
Figure 18:
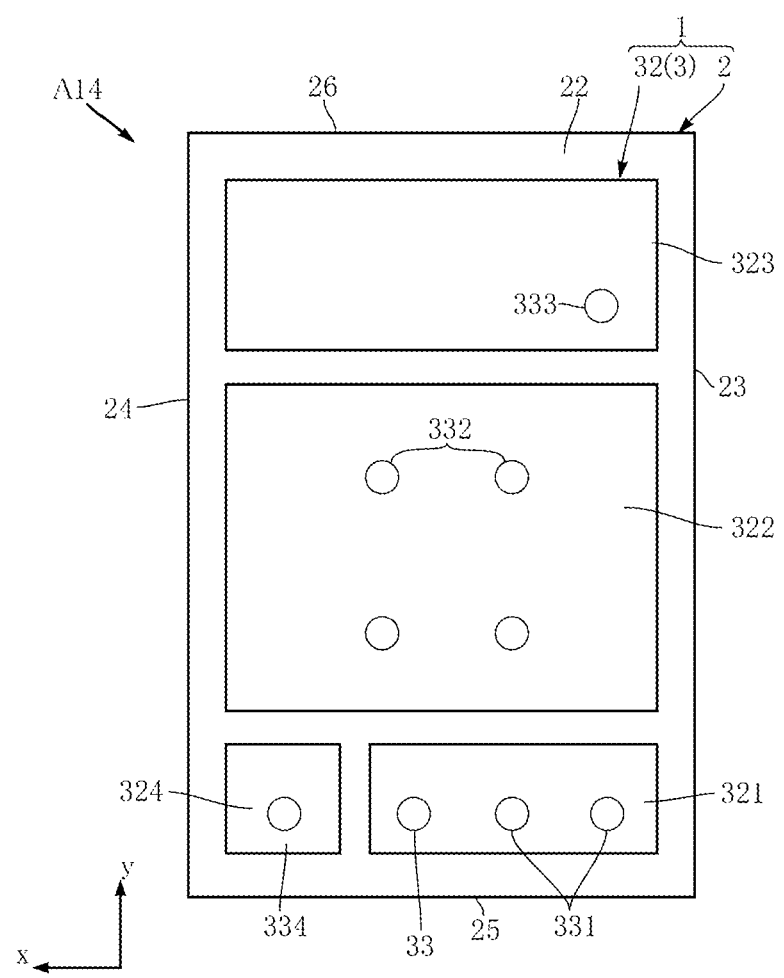
FIG. 18 is a bottom view showing the fourth variation of the semiconductor laser device according to the first embodiment of the present disclosure.

FIG. 17 is a schematic plan view showing a fourth variation of the semiconductor laser device A1. FIG. 18 is a bottom view showing the fourth variation of the semiconductor laser device A1. The semiconductor laser device A14 of the present variation differs from the semiconductor laser device A13 in the number of the semiconductor laser elements 4.

In the present variation, a single semiconductor laser element 4 is provided. The semiconductor laser element 4 is disposed on the projection 3133.

The present variation can also reduce the inductance component. As will be understood from the semiconductor laser device A13 and the present variation, the number of the semiconductor laser elements 4 can be set as appropriate.

First Embodiment Fifth Variation

Figure 19:
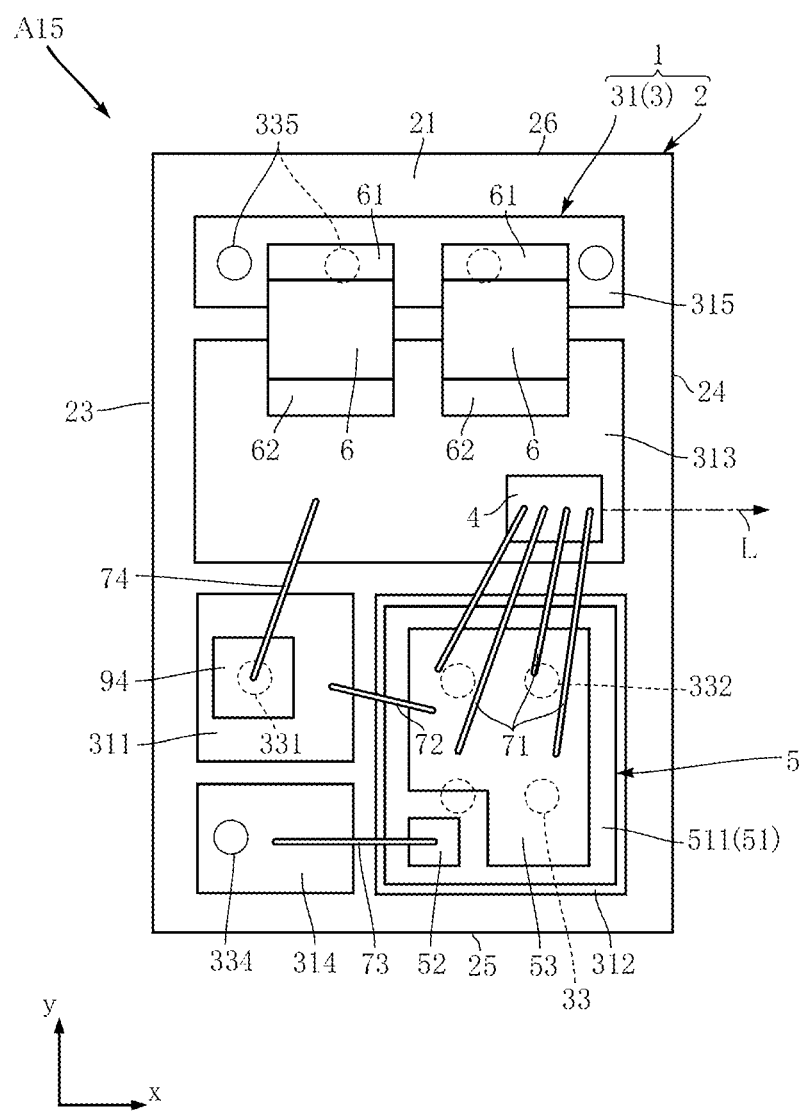
FIG. 19 is a schematic plan view showing a fifth variation of the semiconductor laser device according to the first embodiment of the present disclosure.
Figure 20:
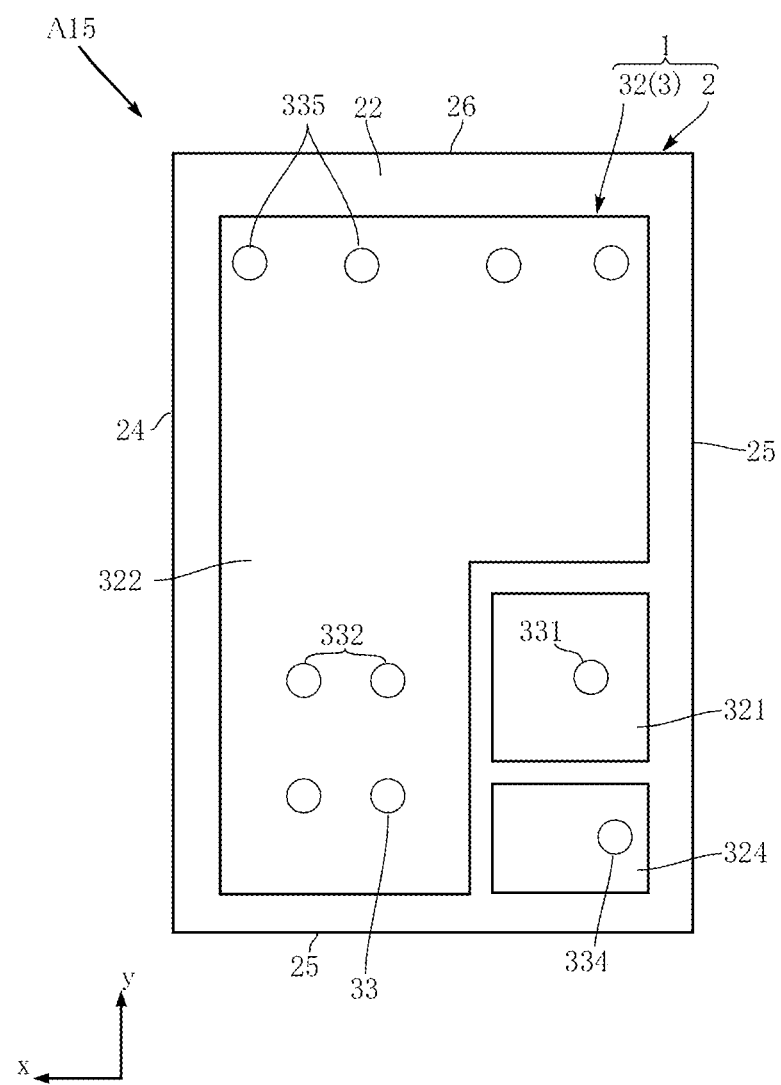
FIG. 20 is a bottom view showing the fifth variation of the semiconductor laser device according to the first embodiment of the present disclosure.

FIG. 19 is a schematic plan view showing a fifth variation of the semiconductor laser device A1. FIG. 20 is a bottom view showing the fifth variation of the semiconductor laser device A1. The semiconductor laser device A15 of the present variation includes a diode 94.

The diode 94 is provided in series between the front surface first section 311 and the front surface third section 313 and allows the current flow from the front surface third section 313 to the front surface first section 311. In the illustrated example, the diode 94 is mounted on the front surface first section 311.

Though the semiconductor laser element 4 in the illustrated example is configured to emit laser light L in the x direction, the semiconductor laser element is not limited to such a configuration and may emit laser light L in the y direction, for example. The arrangement of the front surface first section 311, the front surface second section 312, the front surface third section 313, the front surface fifth section 315, the back surface first section 321, the back surface second section 322 and the intermediate second section 342 may be varied as long as it can constitute the same circuit as that of the illustrate example.

The present variation can also reduce the inductance component. Incorporating the diode 94 in the semiconductor laser device A15 is particularly advantages in reducing the inductance component of the conduction path of the current IC, which flows through the diode 94.

Second Embodiment

Figure 21:
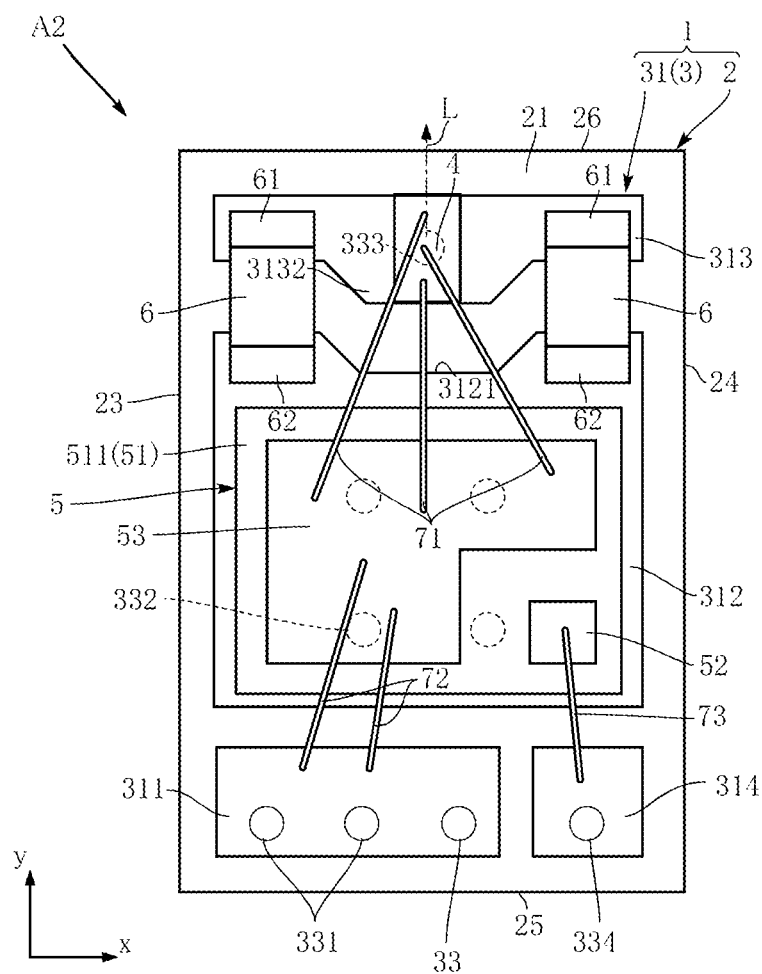
FIG. 21 is a schematic plan view showing a semiconductor laser device according to a second embodiment of the present disclosure.
Figure 22:
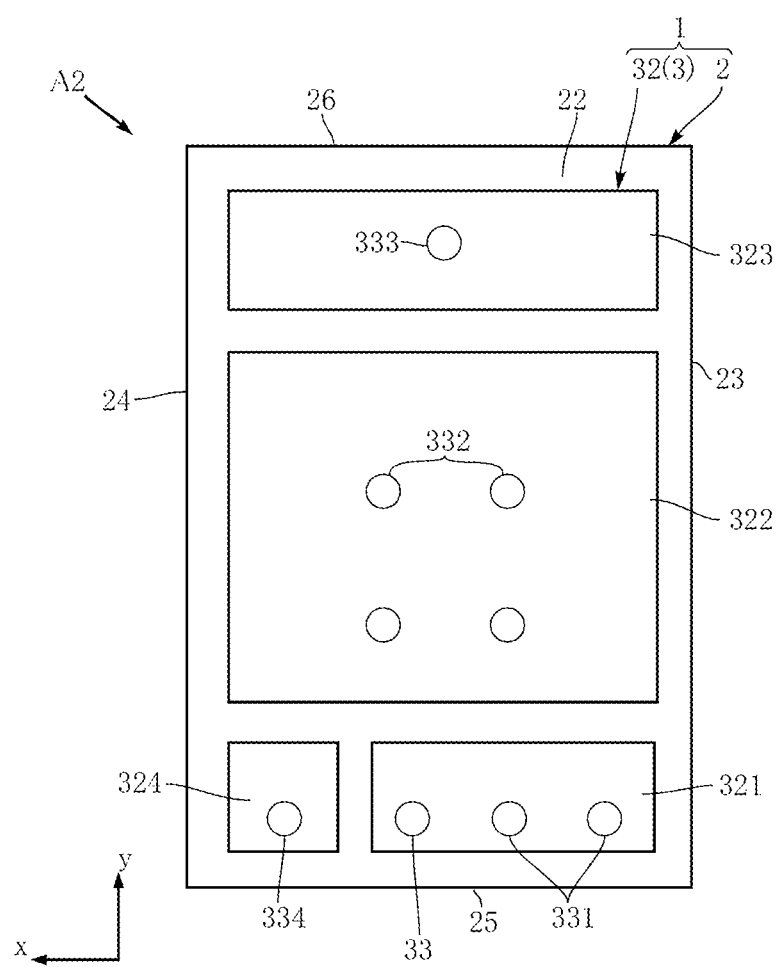
FIG. 22 is a bottom view showing the semiconductor laser device according to the second embodiment of the present disclosure.

FIG. 21 is a schematic plan view showing a semiconductor laser device according to a second embodiment of the present disclosure. FIG. 22 is a bottom view showing the semiconductor laser device according to the second embodiment of the present disclosure.

In the semiconductor laser device A2 of the present embodiment, the front surface second section 312 has a recess 3121. The recess 3121 is the portion at which the edge of the front surface second section 312 closer to the fourth surface 26 in the y direction is retreated toward the third surface 25 in the y direction. The recess 3121 is located at the center of the front surface second section 312 in the x direction.

The front surface third section 313 of the present embodiment has a projection 3132. The projection 3132 is the portion at which the edge of the front surface third section 313 closer to the third surface 25 in the y direction projects toward the third surface 25 in the y direction. The projection 3132 is located at the center of the front surface third section 313 in the x direction. The projection 3132 overlaps with the recess 3121 as viewed in the y direction.

The semiconductor laser element 4 is disposed at a location overlapping with the projection 3132 as viewed in the y direction and overlaps with at least a part of the projection 3132 as viewed in the z direction. The two capacitors 6 flank the semiconductor laser element 4 in the x direction. The two capacitors 6 do not overlap with the recess 3121 or the projection 3132 as viewed in the y direction.

The present embodiment can also reduce the inductance component. Arranging the semiconductor laser element 4 close to the center of the support member 1 in the x direction allows the laser light L to be emitted from the position closer to the center of the semiconductor laser device A2 in the x direction.

The front surface second section 312 is formed with the recess 3121, and the front surface third section 313 is formed with the projection 3132. The recess 3121 and the projection 3132 overlap with each other as viewed in the y direction, and the semiconductor laser element 4 overlaps with the recess 3121 and the projection 3132 as viewed in the y direction. Such an arrangement reduces the dimension of the semiconductor laser device A2 in the y direction.

Second Embodiment First Variation

Figure 23:
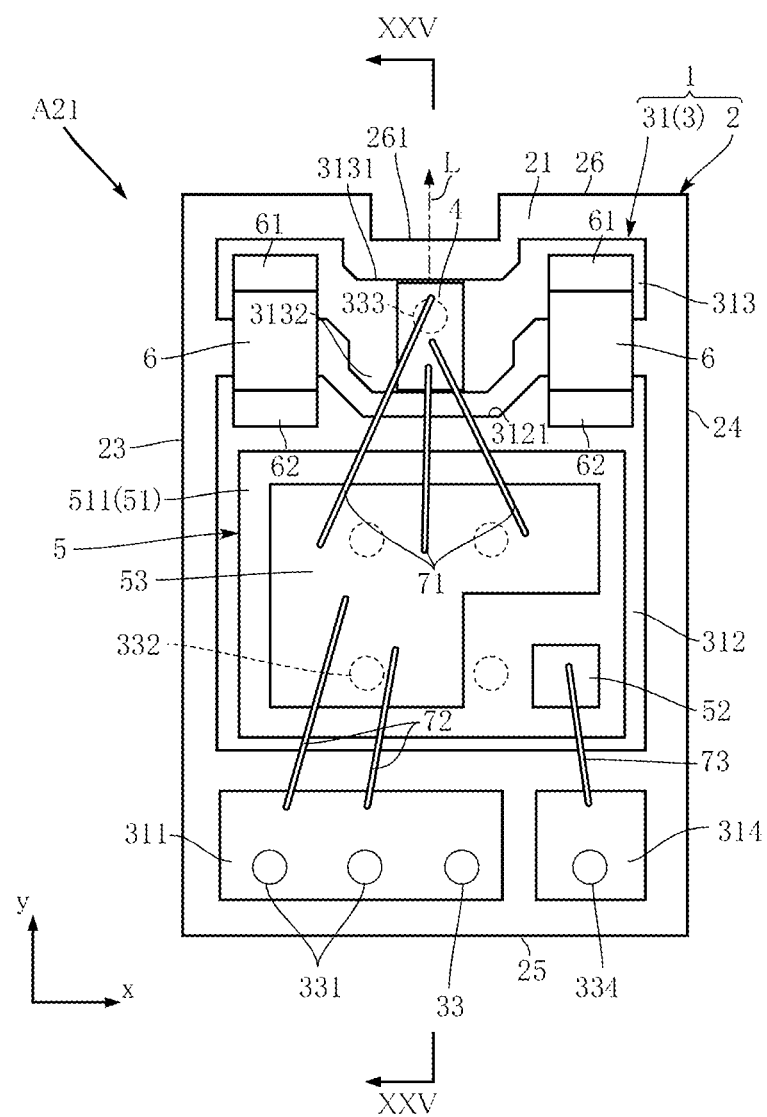
FIG. 23 is a schematic plan view showing a first variation of the semiconductor laser device according to the second embodiment of the present disclosure.
Figure 24:
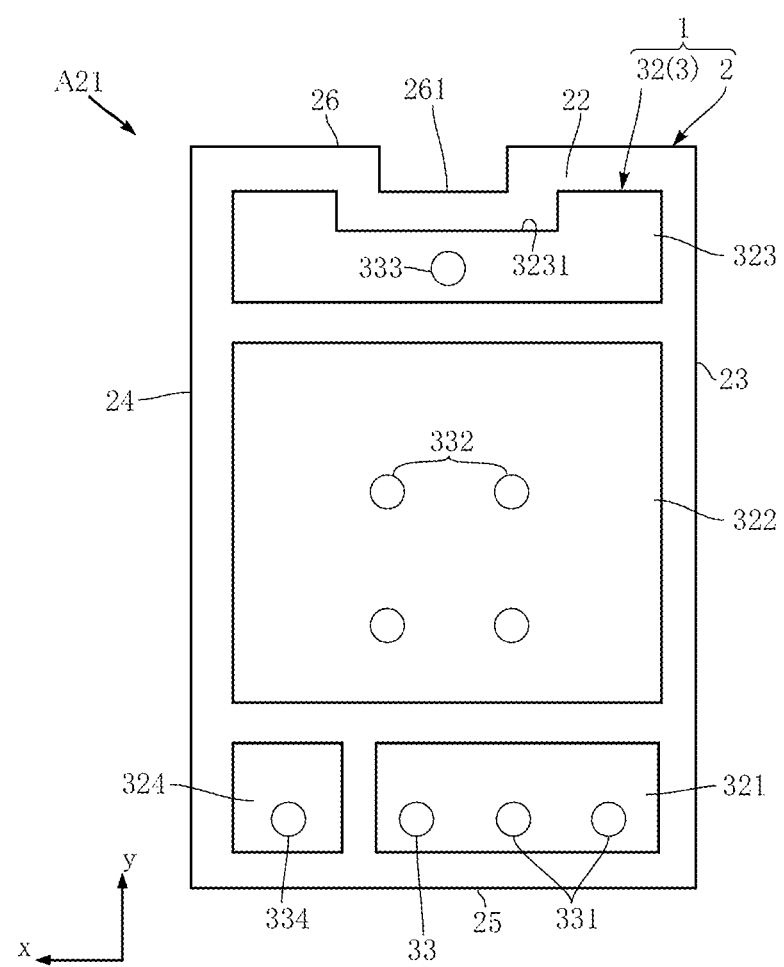
FIG. 24 is a schematic bottom view showing the first variation of the semiconductor laser device according to the second embodiment of the present disclosure.
Figure 25:
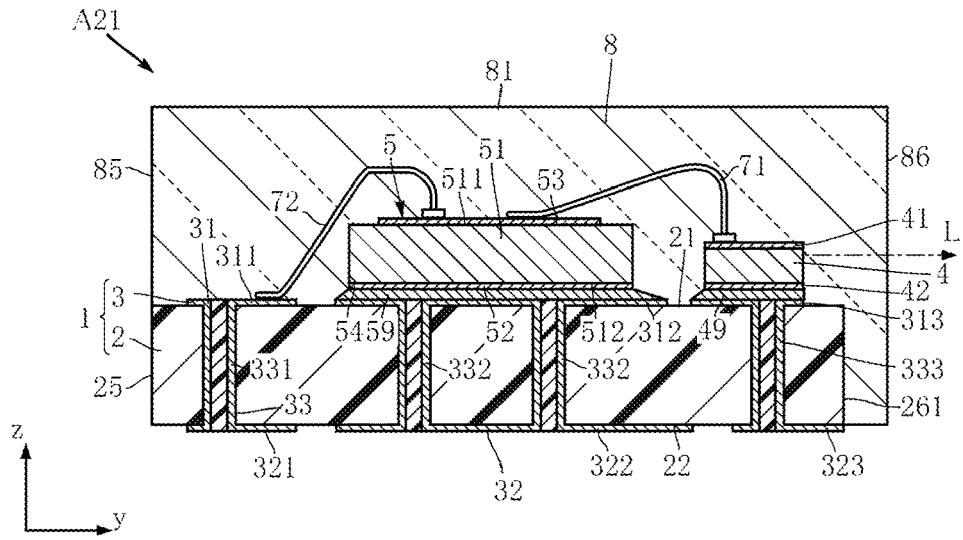
FIG. 25 is a sectional view taken along line XXV-XXV in FIG. 23.

FIG. 23 is a schematic plan view showing a first variation of the semiconductor laser device A2. FIG. 24 is a schematic bottom view showing the first variation of the semiconductor laser device A2. FIG. 25 is a sectional view taken along line XXV-XXV in FIG. 23.

In the semiconductor laser device A21 of the present variation, the base 2 has a recess 261. The recess 261 is the portion at which the fourth surface 26 is retreated toward the third surface 25 in the y direction. The recess 261 is provided close to the center of the base 2 in the x direction. The front surface third section 313 has a recess 3131 and a projection 3132. The recess 3131 is the portion at which the edge of the front surface third section 313 closer to the fourth surface 26 in the y direction is retreated toward the third surface 25 in the y direction. The projection 3132 is the portion at which the edge of the front surface third section 313 closer to the third surface 25 in the y direction projects toward the third surface 25 in the y direction. The recess 261, the recess 3131 and the projection 3132 overlap with each other as viewed in the y direction. Also, the recess 261 and the recess 3131 overlap with the semiconductor laser element 4.

As shown in FIG. 25, the recess 261 is recessed from the resin fourth surface 86 of the light-transmitting resin 8 toward the third surface 25 in the y direction. That is, the recess 261 is spaced apart from the resin fourth surface 86. The recess 261 is filled with the light-transmitting resin 8.

The present variation can also reduce the inductance component. The recess 261 is provided such that the bottom edge of the recess 261 is located close to the edge of the semiconductor laser element 4 in the y direction (i.e., the portion from which the laser light L is emitted). Such a configuration prevents the laser light L from interfering with the base 2. Since the resin fourth surface 86 is flat, the entire semiconductor laser device A21 has the shape of a simple rectangular parallelepiped, which facilitates the work such as transportation or mounting.

Second Embodiment Second Variation

Figure 26:
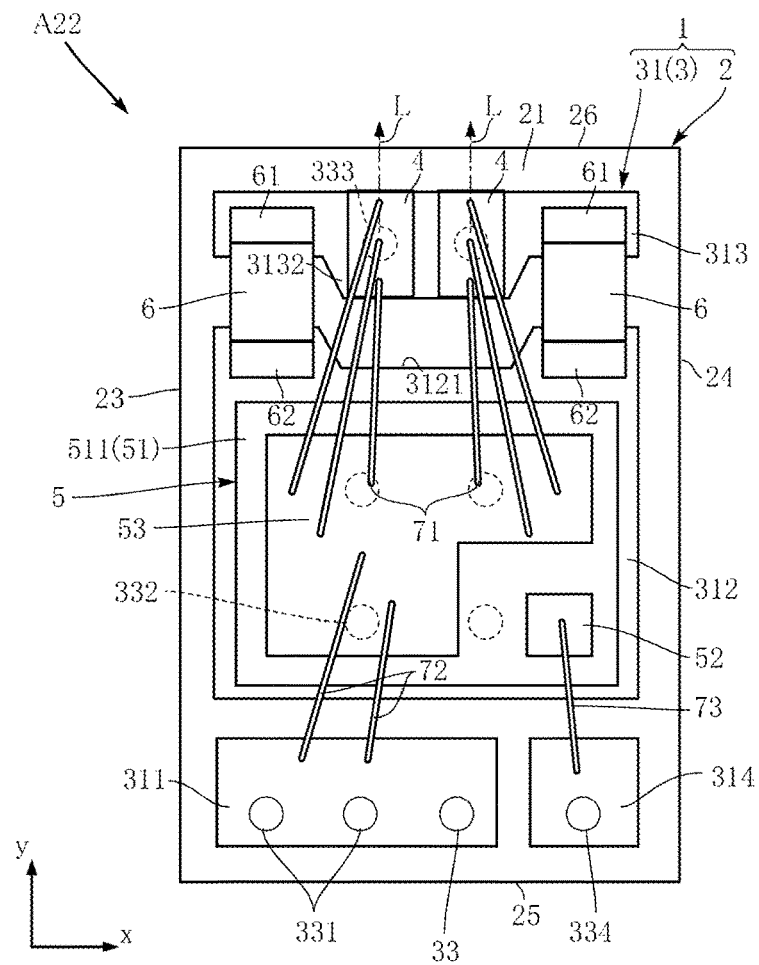
FIG. 26 is a schematic plan view showing a second variation of the semiconductor laser device according to the second embodiment of the present disclosure.
Figure 27:
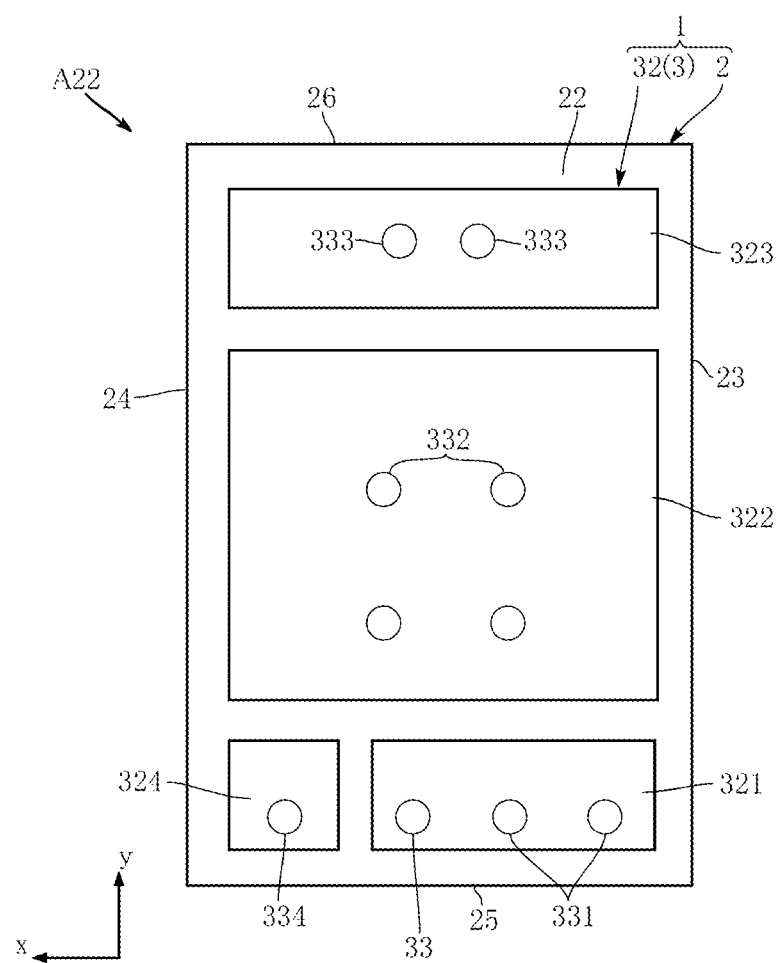
FIG. 27 is a schematic bottom view showing the second variation of the semiconductor laser device according to the second embodiment of the present disclosure.

FIG. 26 is a schematic plan view showing a second variation of the semiconductor laser device A2. FIG. 27 is a schematic bottom view showing the second variation of the semiconductor laser device A2.

The semiconductor laser device A22 of the present variation has two semiconductor laser elements 4, and the configurations of other parts are the same or similar to those of the semiconductor laser device A2. The two semiconductor laser elements 4 are mounted on the front surface third section 313 between two capacitors 6. The two semiconductor laser elements 4 are arranged side by side in the x direction and each emits laser light L in the y direction. Each of the two semiconductor laser elements 4 is connected to the source electrode 53 of the switching element 5 by a plurality of first wires 71.

The present variation can also reduce the inductance component. The provision of the two semiconductor laser elements 4 is advantageous for increasing the brightness. Collectively arranging the two semiconductor laser elements 4 close to the center of the semiconductor laser device A22 in the x direction is advantageous in reducing the size of an optical device configured to refract or reflect the light from the semiconductor laser device A22.

Second Embodiment Third Variation

Figure 28:
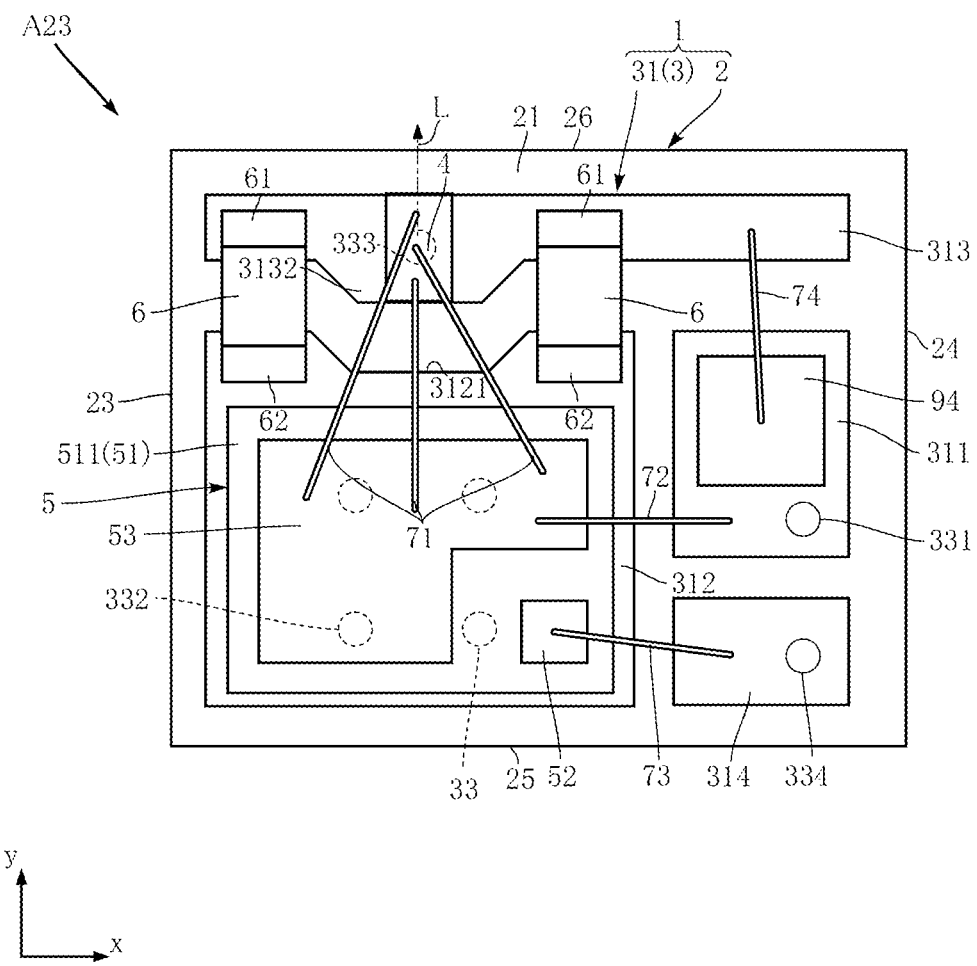
FIG. 28 is a schematic plan view showing a third variation of the semiconductor laser device according to the second embodiment of the present disclosure.
Figure 29:
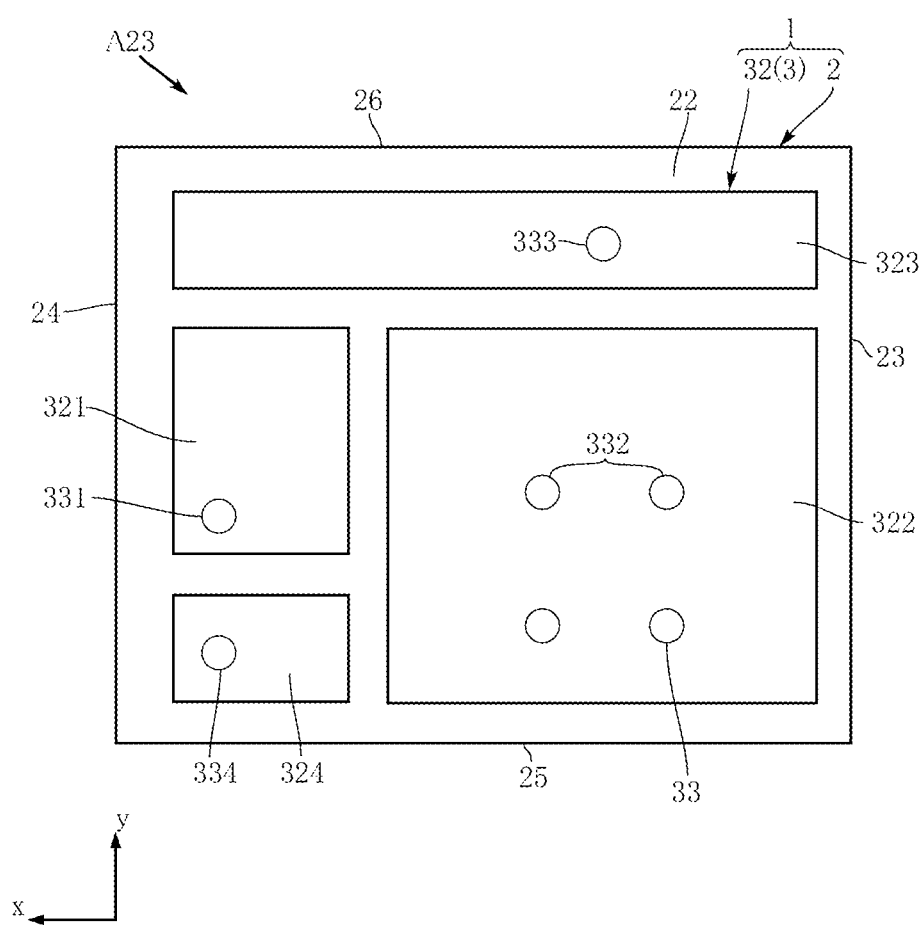
FIG. 29 is a schematic bottom view showing the third variation of the semiconductor laser device according to the second embodiment of the present disclosure.

FIG. 28 is a schematic plan view showing a third variation of the semiconductor laser device A2. FIG. 29 is a schematic bottom view showing the third variation of the semiconductor laser device A2.

The semiconductor laser device A23 of the present variation includes a diode 94, and the configurations of other parts are the same or similar to those of the semiconductor laser device A2.

The front surface first section 311 is located closer to the second surface 24 than is the front surface second section 312 in the x direction. The front surface fourth section 314 is located closer to the second surface 24 than is the front surface second section 312 in the x direction. The front surface fourth section 314 is located closer to the third surface 25 than is the front surface first section 311 in the y direction.

The diode 94 is provided in series between the front surface first section 311 and the front surface third section 313 and allows the current flow from the front surface third section 313 to the front surface first section 311. In the illustrated example, the diode 94 is mounted on the front surface first section 311. The diode 94 overlaps with the switching element 5 as viewed in the x direction. The diode 94 overlaps with the two capacitors 6 as viewed in the x direction. The diode 94 does not overlap with the semiconductor laser element 4 as viewed in the x direction.

Though the semiconductor laser element 4 in the illustrated example is configured to emit laser light L in the x direction, the semiconductor laser element is not limited to such a configuration and may emit laser light L in the y direction, for example. The arrangement of the front surface first section 311, the front surface second section 312, the front surface third section 313, the front surface fifth section 315, the back surface first section 321, the back surface second section 322, the back surface third section 323 and the intermediate second section 342 may be varied as long as it can constitute the same circuit as that of the illustrated example.

The present variation can also reduce the inductance component. Incorporating the diode 94 in the semiconductor laser device A23 is particularly advantages in reducing the inductance component of the conduction path of the current IC, which flows through the diode 94. Note that the laser system using the semiconductor laser device A23 can be constructed without the back surface third section 323. However, the provision of the back surface third section 323 improves the mounting strength and heat dissipation efficiency of the semiconductor laser device A23.

Third Embodiment

Figure 30:
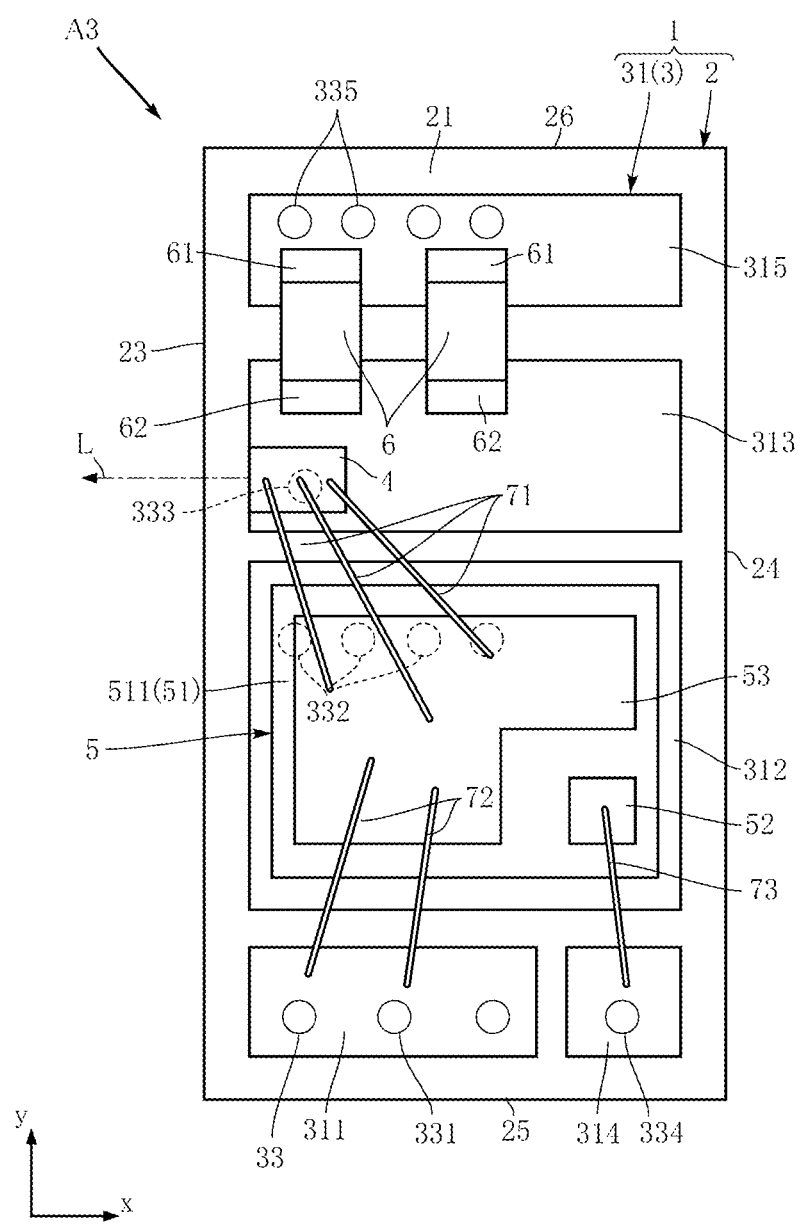
FIG. 30 is a schematic plan view showing a semiconductor laser device according to a third embodiment of the present disclosure.
Figure 31:
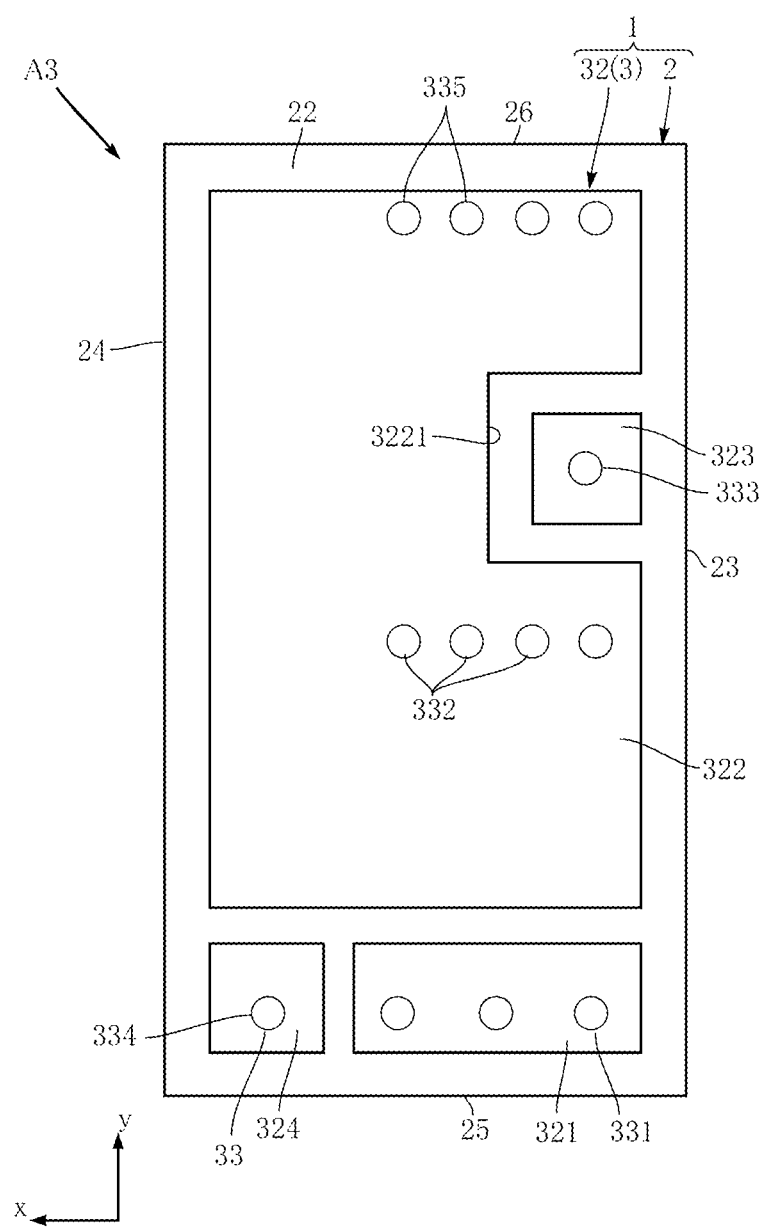
FIG. 31 is a bottom view showing the semiconductor laser device according to the third embodiment of the present disclosure.

FIG. 30 is a schematic plan view showing a semiconductor laser device according to a third embodiment of the present disclosure. FIG. 31 is a bottom view showing the semiconductor laser device according to the third embodiment of the present disclosure. The semiconductor laser device A3 of the present embodiment differs from the foregoing embodiments in configuration of the front surface portion 31, the back surface portion 32 and the connecting portion 33.

The front surface portion 31 of the present embodiment includes a front surface first section 311, a front surface second section 312, a front surface third section 313, a front surface fourth section 314 and a front surface fifth section 315. The arrangement of the front surface first section 311, the front surface second section 312, the front surface third section 313 and the front surface fourth section 314 is similar to that in the semiconductor laser device A11, for example. In the present embodiment, however, the front surface second section 312 does not have a projection 3122 and is rectangular as viewed in the z direction. Also, the front surface third section 313 does not have a projection 3133 and is rectangular as viewed in the z direction.

The front surface fifth section 315 is located closer to the fourth surface 26 than is the front surface third section 313 in the y direction. The shape of front surface fifth section 315 is not particularly limited and is an elongated rectangle with the longer side extending in the x direction in the illustrated example.

The semiconductor laser element 4 has a second laser electrode 42 disposed on the front surface third section 313 and bonded for electrical connection to the front surface third section 313. The electrodes 62 of the capacitors 6 are bonded for electrical connection to the front surface third section 313. The electrodes 61 of the capacitors 6 are bonded for electrical connection to the front surface fifth section 315.

As shown in FIG. 31, the back surface first section 321 is offset toward the third surface 25 in the y direction and toward the first surface 23 in the x direction. The back surface fourth section 324 is located closer to the second surface 24 than is the back surface first section 321 in the x direction.

The back surface second section 322 is located closer to the fourth surface 26 than are the back surface first section 321 and the back surface fourth section 324 in the y direction. The back surface second section 322 has a recess 3221. The recess 3221 is the portion at which the edge of the back surface second section 322 closer to the first surface 23 in the x direction is retreated toward the second surface 24 in the x direction.

The back surface third section 323 is arranged so as to overlap with the recess 3221 both as viewed in the x direction and as viewed in the y direction. The shape of back surface third section 323 is not particularly limited and is rectangular in the illustrated example.

The connecting portion 33 of the present embodiment includes first connecting portions 331, second connecting portions 332, a third connecting portion 333, a fourth connecting portion 334 and connecting portions 335. The first connecting portions 331 connect the front surface first section 311 and the back surface first section 321 to each other. The second connecting portion 332 connects the front surface second section 312 and the back surface second section 322 to each other. The third connecting portion 333 connects the front surface third section 313 and the back surface third section 323 to each other. The fourth connecting portion 334 connects the front surface fourth section 314 and the back surface fourth section 324 to each other. The connecting portions 335 connect the front surface fifth section 315 and the back surface second section 322 to each other.

As shown in FIG. 30, the second connecting portions 332 are connected to the front surface second section 312 at a location offset toward the fourth surface 26 in the y direction.

The present embodiment can also reduce the inductance component. In the present embodiment, the current IL flows through the path consisting of the first wires 71, the semiconductor laser element 4, the front surface third section 313, the capacitors 6, the front surface fifth section 315, the connecting portions 335 and the back surface second section 322. This path forms a loop as viewed in the x direction. Such a configuration can shorten the conduction path as compared with the case in which most part of the conduction path of the current IL is in a same plane.

Moreover, arranging the second connecting portions 332 at a location offset toward the fourth surface 26 in the y direction shortens the distance between the second connecting portions 332 and the connecting portions 335 in the y direction. This is advantageous in shortening the conduction path of the current IL.

Third Embodiment First Variation

Figure 32:
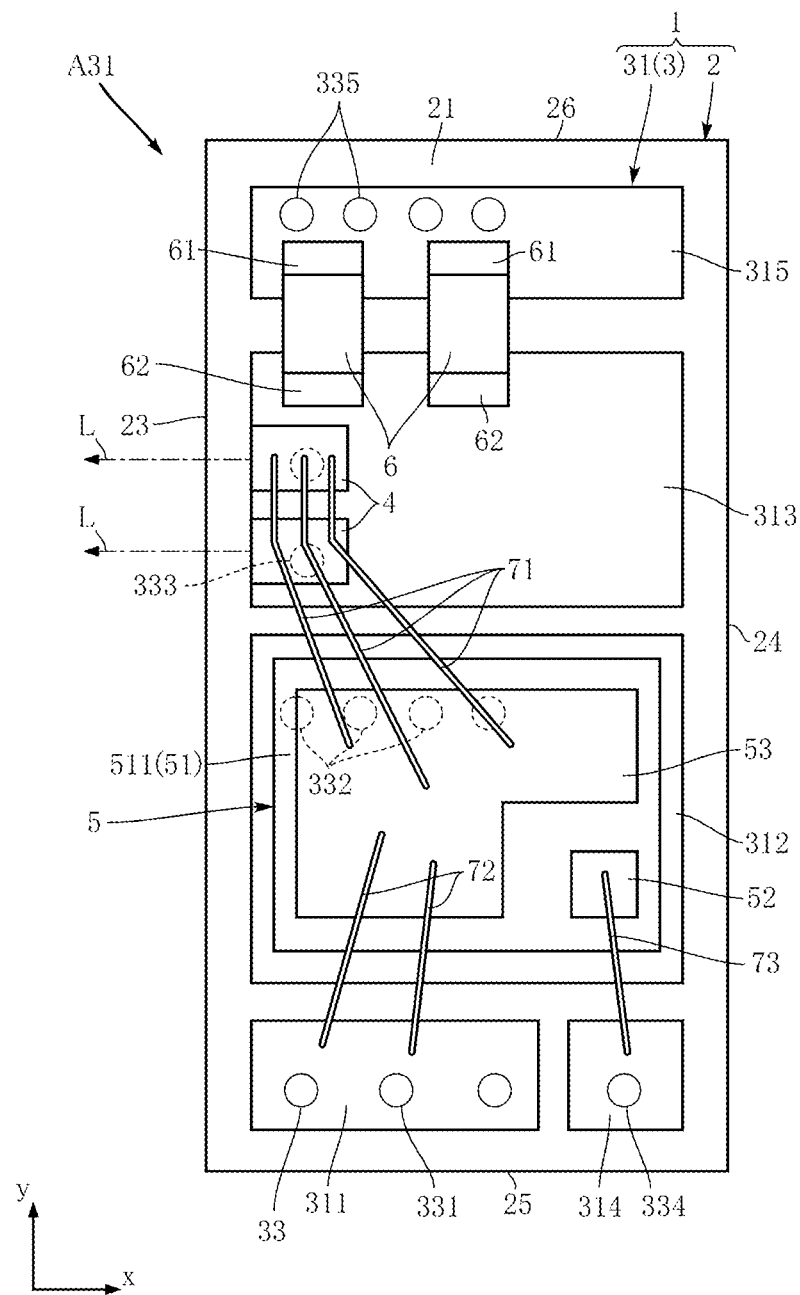
FIG. 32 is a schematic plan view showing a first variation of the semiconductor laser device according to the third embodiment of the present disclosure.
Figure 33:
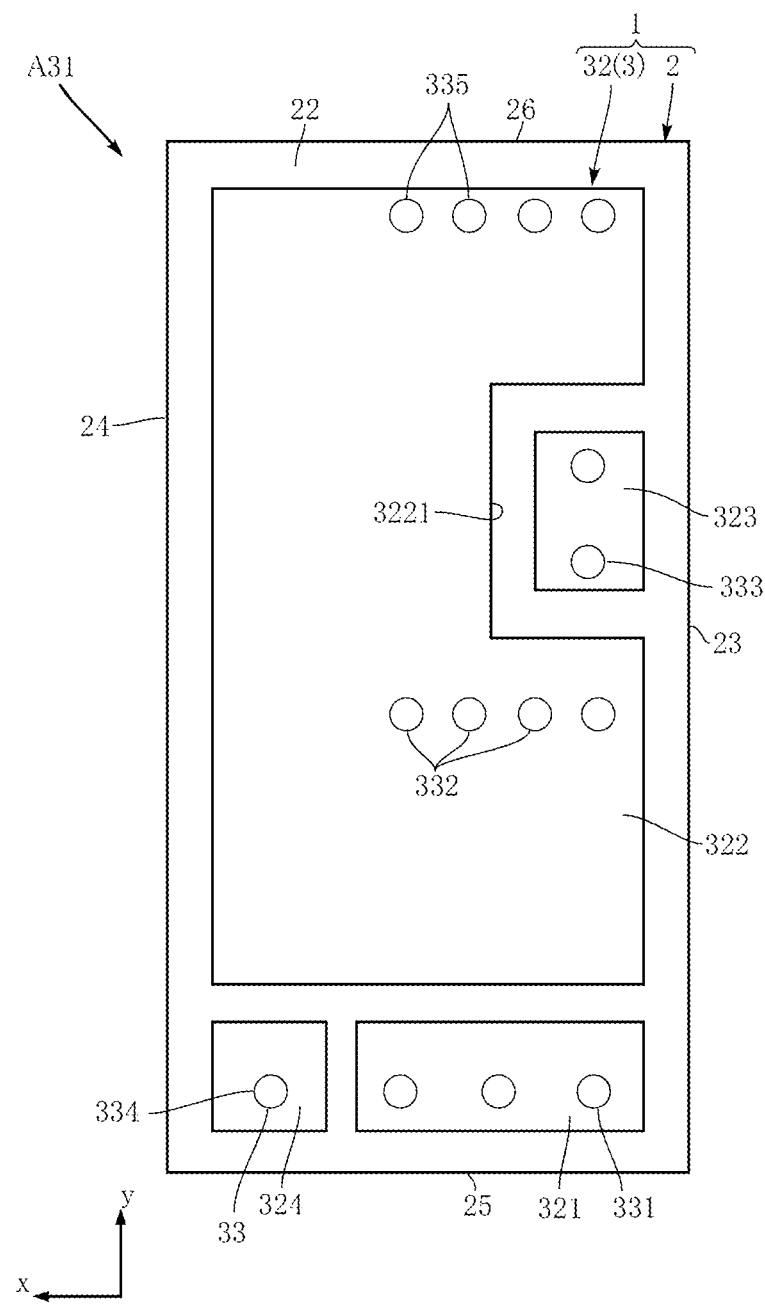
FIG. 33 is a bottom view showing the first variation of the semiconductor laser device according to the third embodiment of the present disclosure.

FIG. 32 is a schematic plan view showing a first variation of the semiconductor laser device A3. FIG. 33 is a bottom view showing the first variation of the semiconductor laser device A3. The semiconductor laser device A31 of the present variation differs from the semiconductor laser device A3 in that the semiconductor laser device A31 includes two semiconductor laser elements 4.

The present variation can also reduce the inductance component. Moreover, the provision of the two semiconductor laser elements 4 increases the brightness.

Fourth Embodiment

Figure 34:
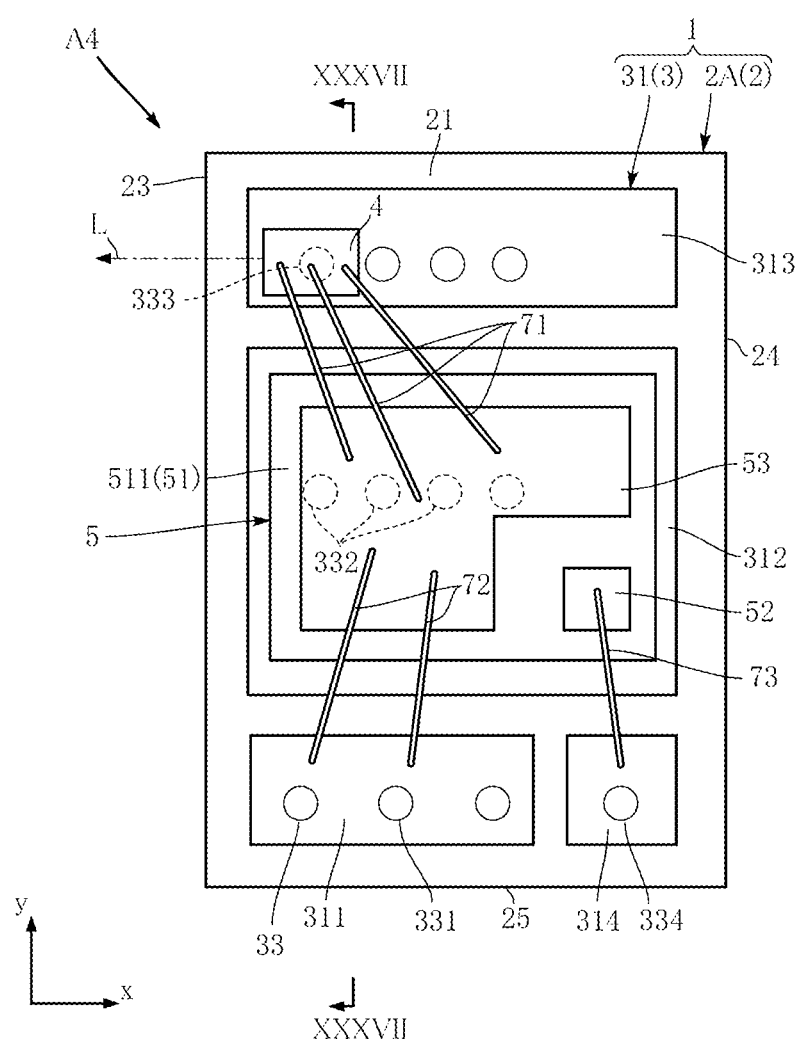
FIG. 34 is a schematic plan view showing a semiconductor laser device according to a fourth embodiment of the present disclosure.
Figure 35:
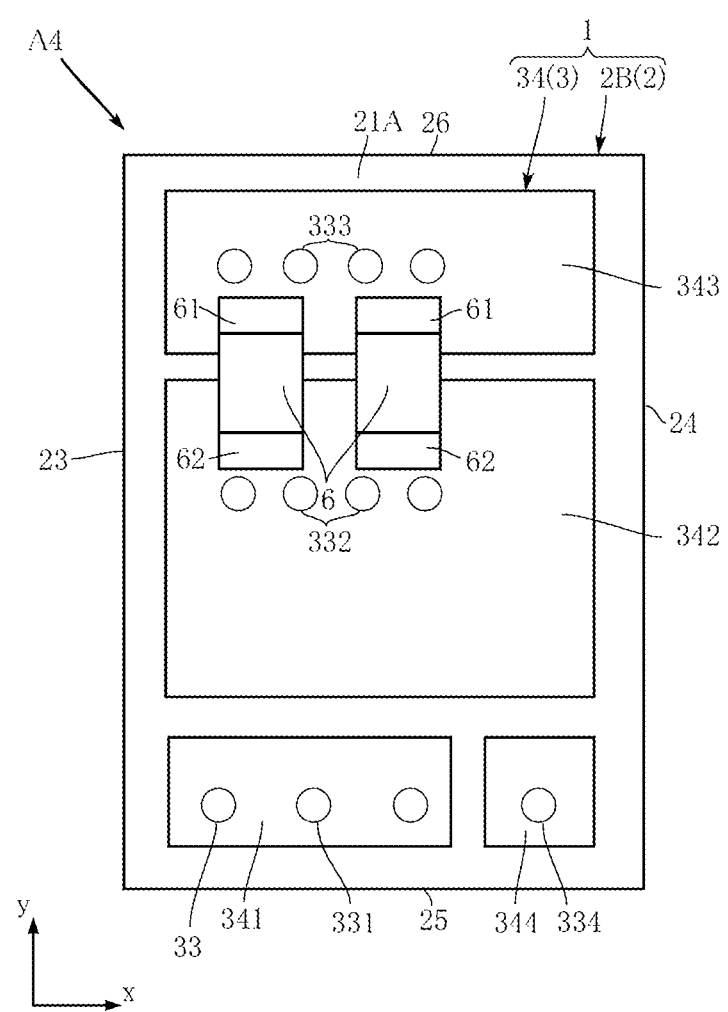
FIG. 35 is a schematic plan view showing a semiconductor laser device according to a fourth embodiment of the present disclosure.
Figure 36:
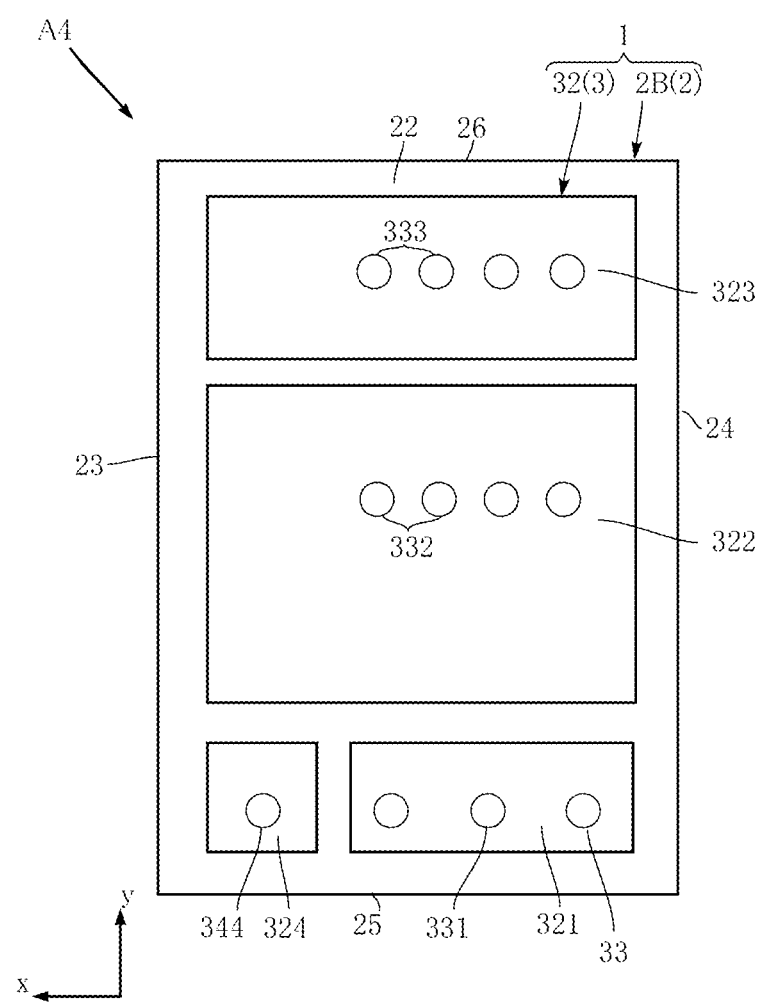
FIG. 36 is a bottom view showing a semiconductor laser device according to a fourth embodiment of the present disclosure.
Figure 37:
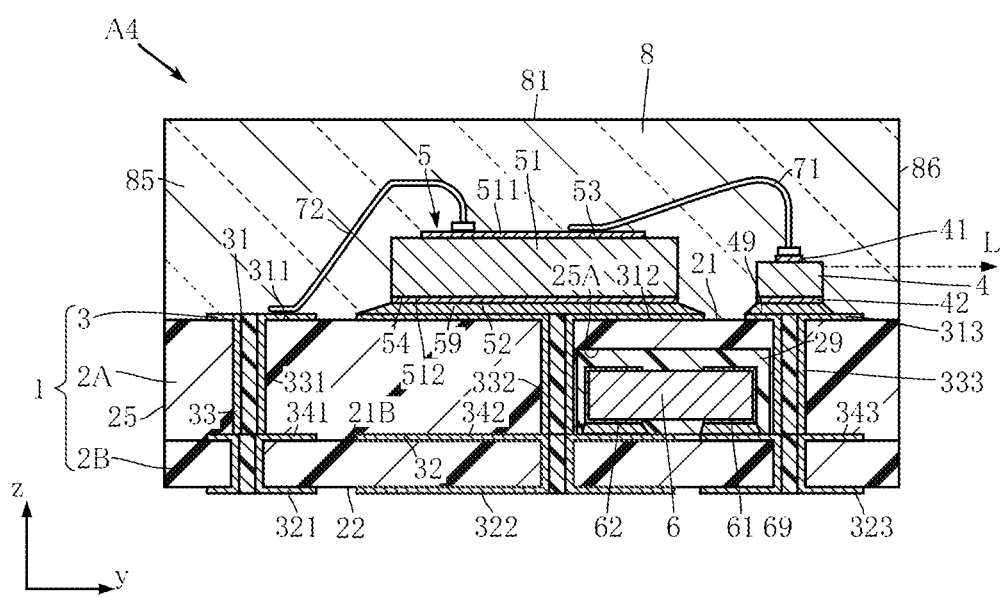
FIG. 37 is a sectional view taken along line XXXVII-XXXVII in FIG. 34.

FIG. 34 is a schematic plan view showing a semiconductor laser device according to a fourth embodiment of the present disclosure. FIG. 35 is a schematic plan view showing the semiconductor laser device according to the fourth embodiment of the present disclosure. FIG. 36 is a bottom view showing the semiconductor laser device according to the fourth embodiment of the present disclosure. FIG. 37 is a sectional view taken along line XXXVII-XXXVII in FIG. 34. In the semiconductor laser device A4 of the present embodiment, the conductive part 3 has a front surface portion 31, a back surface portion 32, a connecting portion 33 and an intermediate portion 34. Note that the illustration of the semiconductor laser element 4, the switching element 5, the front surface portion 31 and the first layer 2A, which will be described later, is omitted in FIG. 35.

The arrangement of the front surface first section 311, the front surface second section 312, the front surface third section 313 and the front surface fourth section 314 of the front surface portion 31 is the same as that in the semiconductor laser device A3. The arrangement of the back surface first section 321, the back surface second section 322, the back surface third section 323 and the back surface fourth section 324 is the same as that in the semiconductor laser device A2.

The base 2 of the present embodiment is made up of a first layer 2A and a second layer 2B. The first layer 2A and the second layer 2B are stacked in the z direction. The first layer 2A provides the front surface 21. The second layer 2B provides the back surface 22.

The intermediate portion 34 is disposed on a front surface 21B of the second layer 2B and sandwiched between the first layer 2A and the second layer 2B. The intermediate portion 34 includes an intermediate first section 341, an intermediate second section 342, an intermediate third section 343 and an intermediate fourth section 344. The arrangement of the intermediate first section 341, the intermediate second section 342, the intermediate third section 343 and the intermediate fourth section 344 is the same as that of the back surface first section 321, the back surface second section 322, the back surface third section 323 and the back surface fourth section 324.

In the present embodiment, the first connecting portions 331 connect the front surface first section 311, the back surface first section 321 and the intermediate first section 341 to each other. The second connecting portions 332 connect the front surface second section 312, the back surface second section 322 and the intermediate second section 342 to each other. The third connecting portions 333 connect the front surface third section 313, the back surface third section 323 and the intermediate third section 343 to each other. The fourth connecting portion 334 connects the front surface fourth section 314, the back surface fourth section 324 and the intermediate fourth section 344 to each other.

As shown in FIGS. 35 and 37, each of the capacitors 6 has an electrode 61 bonded for electrical connection to the intermediate third section 343 and an electrode 62 bonded for electrical connection to the intermediate second section 342. The first layer 2A is formed with a housing portion 25A. The housing portion 25A can house two capacitors 6. In the illustrated example, the space around the capacitors 6 in the housing portion 25A is filled with sealing resin 29.

The present embodiment can also reduce the inductance component. Moreover, mounting the capacitors 6 on the intermediate portion 34 makes it possible to arrange the switching element 5 and the capacitors 6 so as to overlap with each other as viewed in the z direction. Such an arrangement reduces the dimensions of the semiconductor laser device A4 in the x direction and the y direction.

In the path of the current IL, the back surface second section 322 and the intermediate second section 342 form a parallel path, and the back surface third section 323 and the intermediate third section 343 form a parallel path. This reduces the resistance and inductance of the path of the current IL.

Fourth Embodiment First Variation

Figure 38:
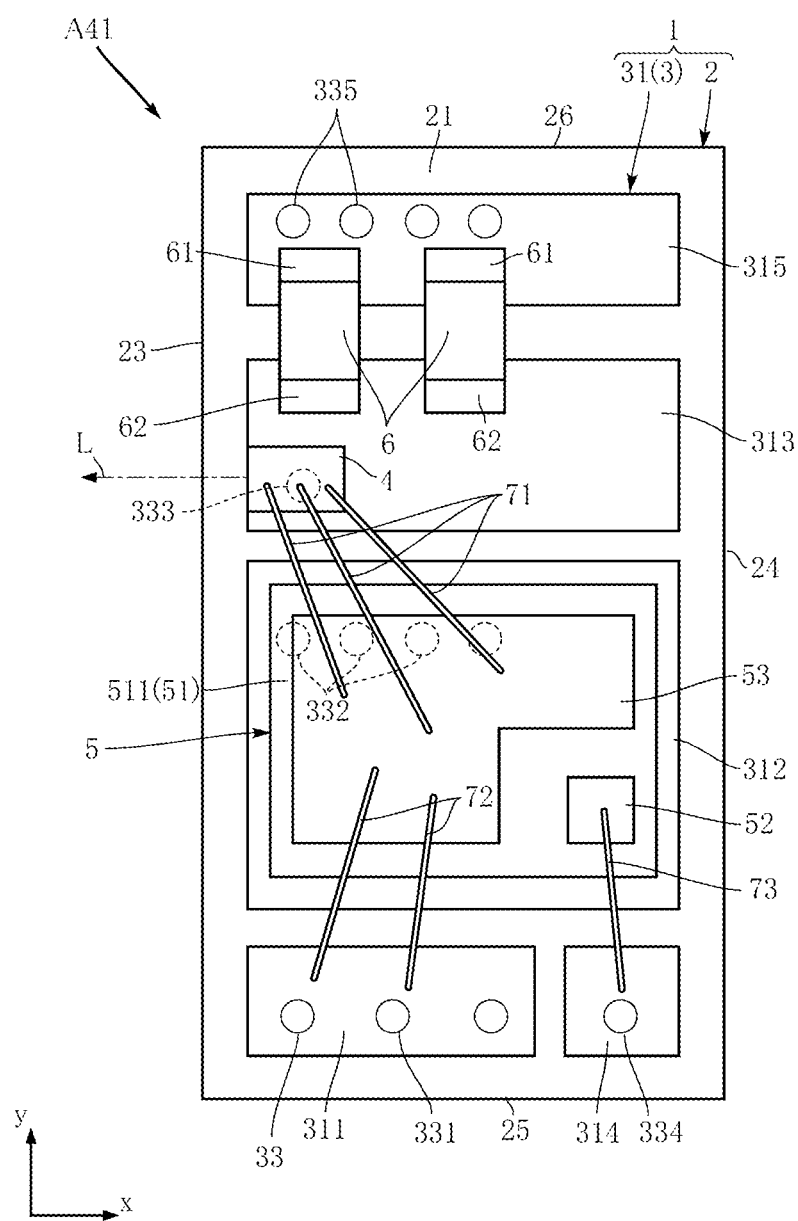
FIG. 38 is a schematic plan view showing a first variation of the semiconductor laser device according to the fourth embodiment of the present disclosure.
Figure 39:
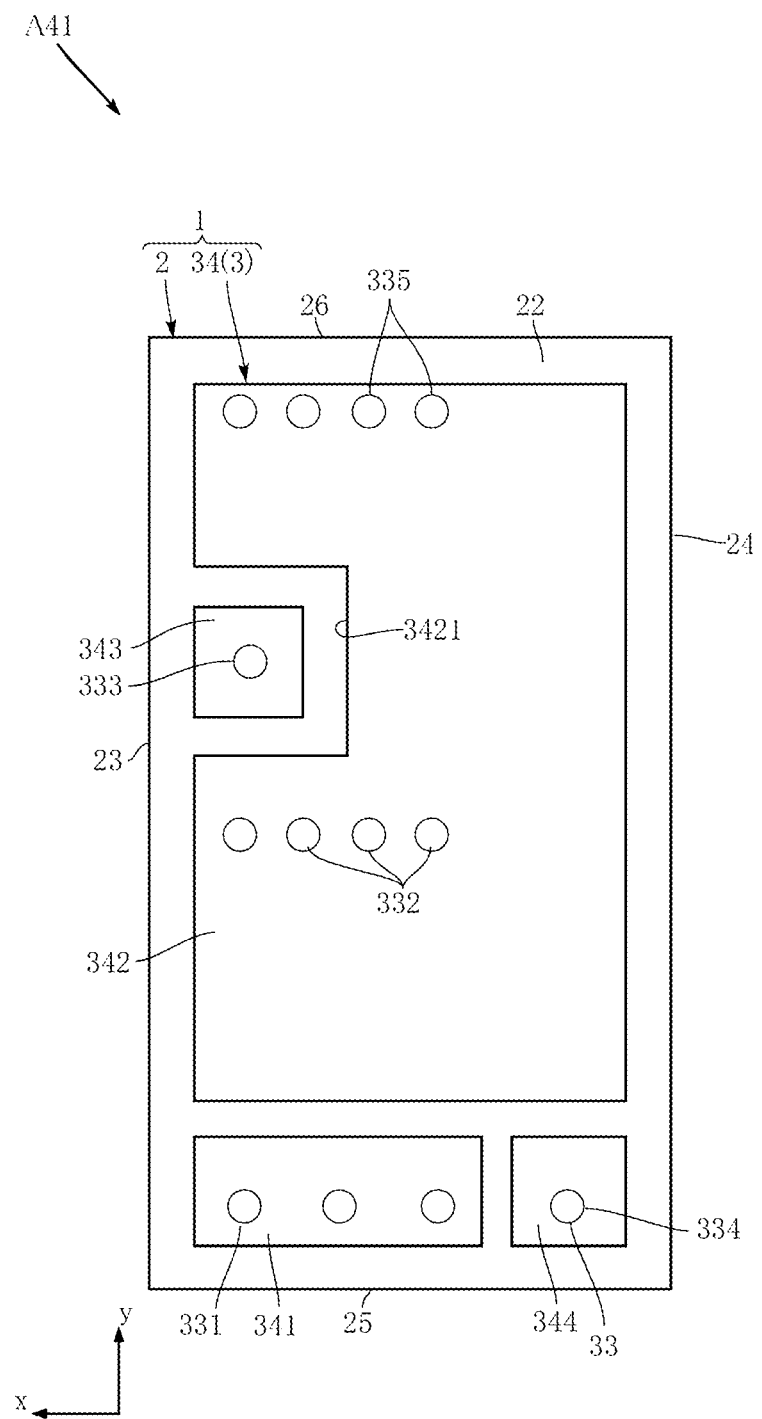
FIG. 39 is a schematic plan view showing the first variation of the semiconductor laser device according to the fourth embodiment of the present disclosure.
Figure 40:
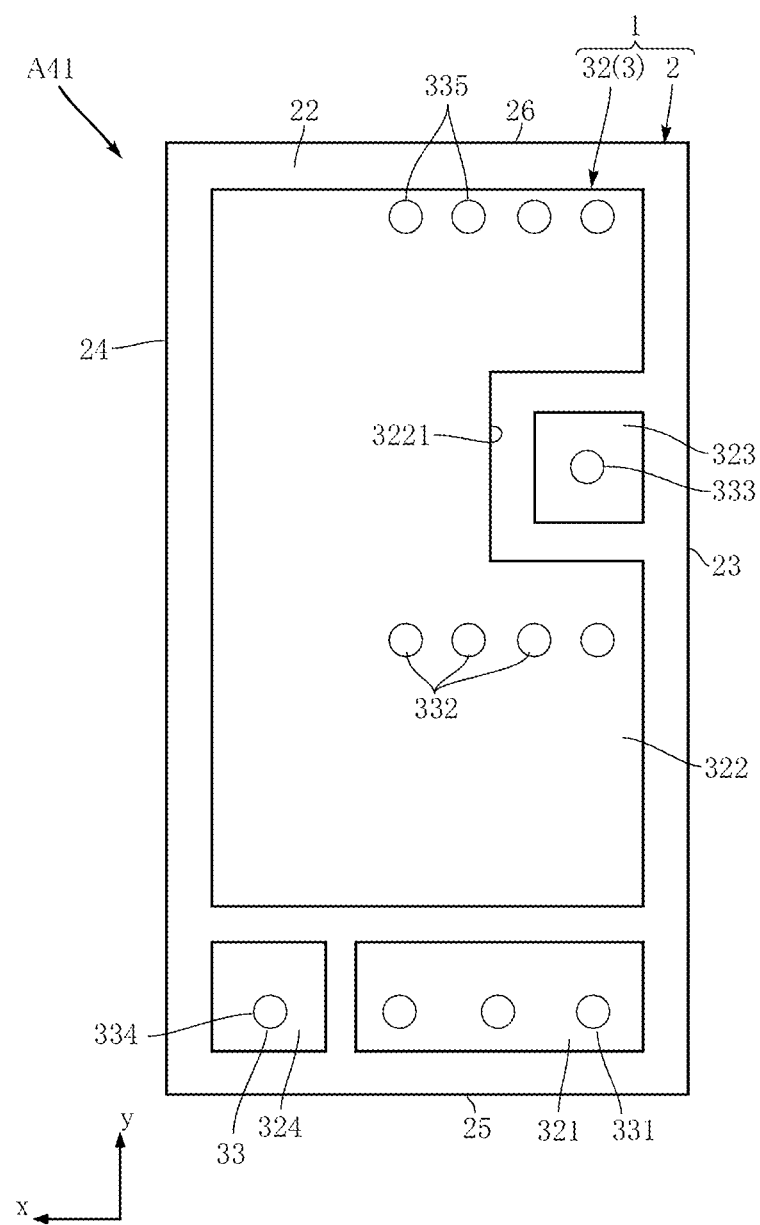
FIG. 40 is a bottom view showing the first variation of the semiconductor laser device according to the fourth embodiment of the present disclosure.

FIG. 38 is a schematic plan view showing a first variation of the semiconductor laser device A4. FIG. 39 is a schematic plan view showing the first variation of the semiconductor laser device A4. FIG. 40 is a bottom view showing the first variation of the semiconductor laser device A4. The semiconductor laser device A41 of the present variation is similar to the semiconductor laser device A3 in arrangement of the front surface portion 31 and the back surface portion 32. The semiconductor laser element 4, the switching element 5 and the capacitors 6 are disposed on the front surface portion 31.

The intermediate portion 34 of the present embodiment includes an intermediate first section 341, an intermediate second section 342, an intermediate third section 343 and an intermediate fourth section 344. The arrangement of the intermediate first section 341, the intermediate second section 342, the intermediate third section 343 and the intermediate fourth section 344 is the same as that of the back surface first section 321, the back surface second section 322, the back surface third section 323 and the back surface fourth section 324 of the back surface portion 32. In the present embodiment again, the second connecting portions 332 are connected to the front surface second section 312 at a location offset toward the fourth surface 26 in the y direction.

The present embodiment can also reduce the inductance component. Moreover, the provision of the intermediate portion 34 arranged or configured in a manner similar to the back surface portion 32 reduces the size of the semiconductor laser device A41 while also reducing the resistance and inductance of the path of the current IL.

Fifth Embodiment

Figure 41:
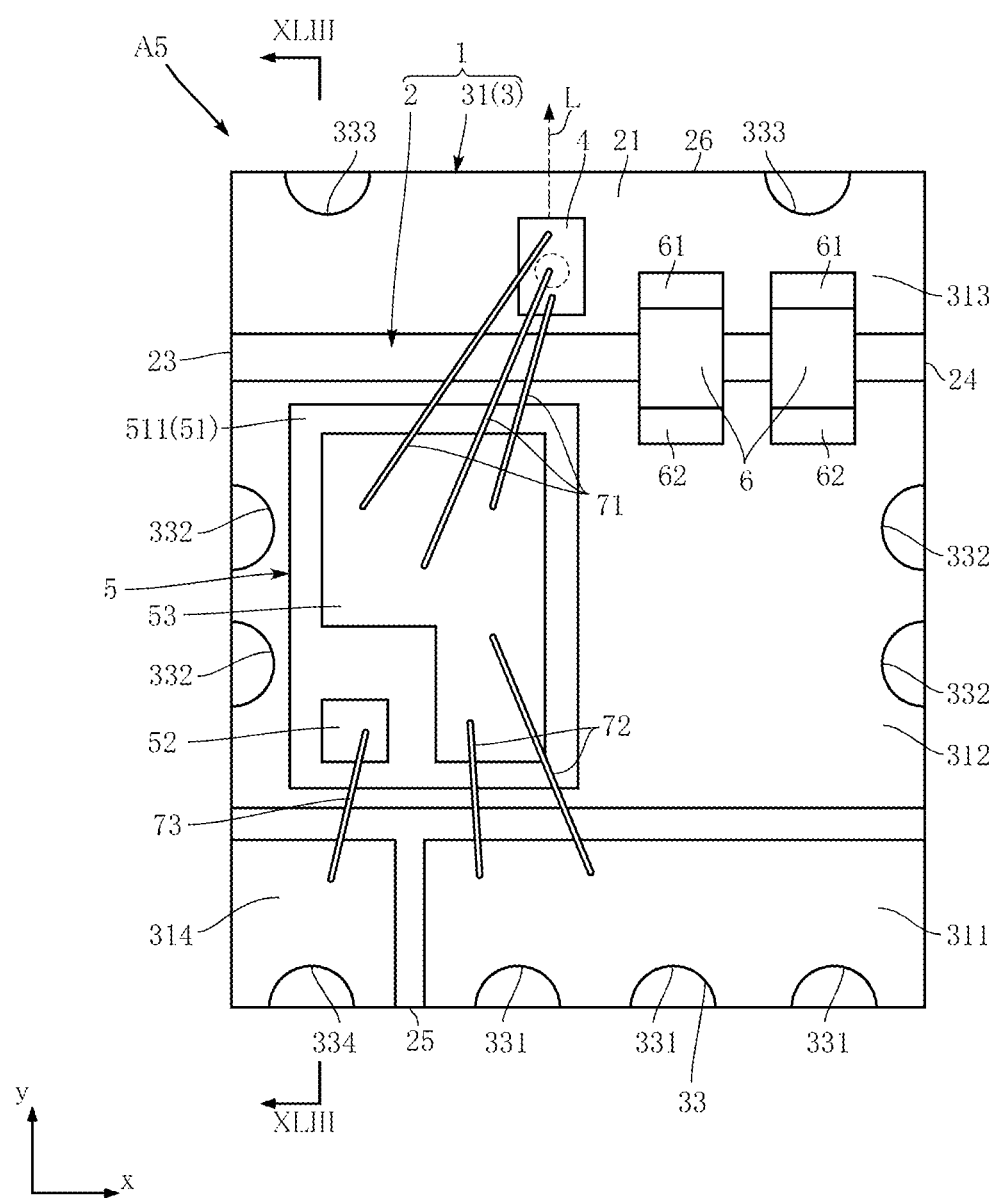
FIG. 41 is a schematic plan view showing a semiconductor laser device according to a fifth embodiment of the present disclosure.
Figure 42:
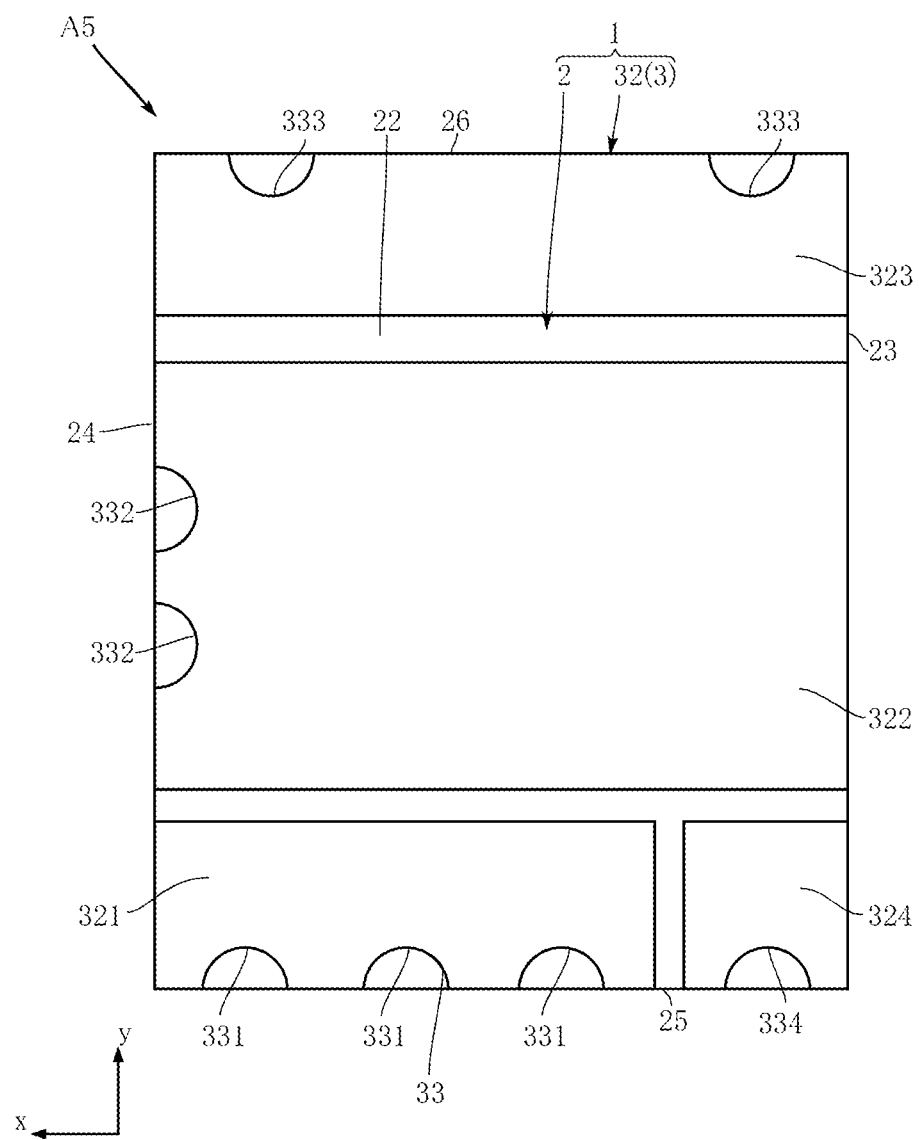
FIG. 42 is a bottom view showing the semiconductor laser device according to the fifth embodiment of the present disclosure.
Figure 43:
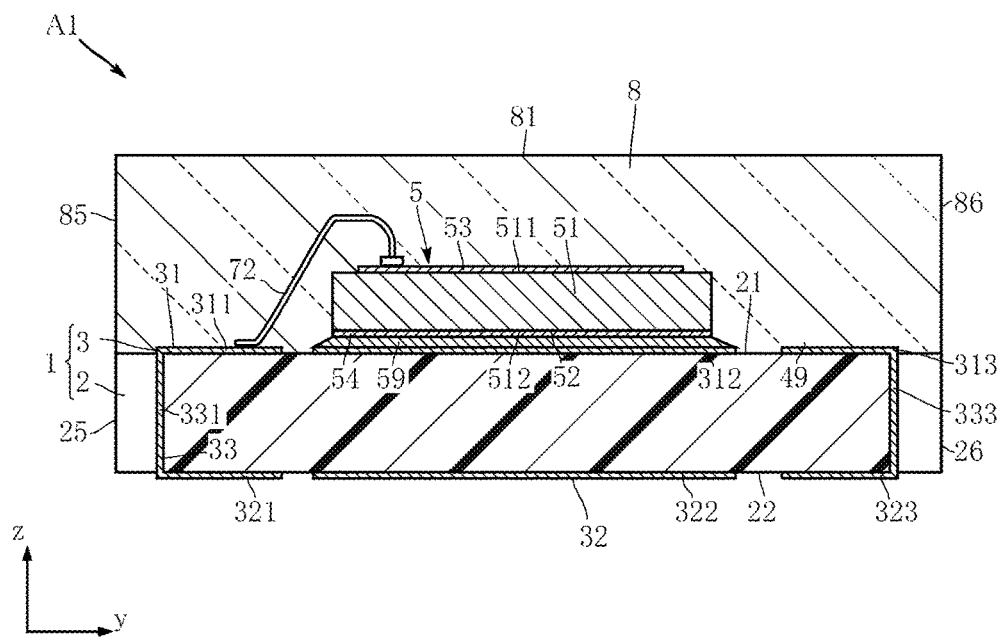
FIG. 43 is a sectional view taken along line XLIII-XLIII in FIG. 41.

FIG. 41 is a schematic plan view showing a semiconductor laser device according to a fifth embodiment of the present disclosure. FIG. 42 is a bottom view showing the semiconductor laser device according to the fifth embodiment of the present disclosure. FIG. 43 is a sectional view taken along line XLIII-XLIII in FIG. 41. The semiconductor laser device A5 of the present embodiment differs from the foregoing embodiments mainly in configuration of the connecting portion 33. Note that the connecting portion 33 in the semiconductor laser devices A1-A4 may be changed to the configuration of the connecting portion 33 of the present embodiment as appropriate.

The arrangement of the front surface portion 31, the back surface portion 32, the semiconductor laser element 4, the switching element 5, the capacitors 6, the first wires 71, the second wires 72 and the third wire 73 of the present embodiment is similar to that in the semiconductor laser device A1.

As shown in FIG. 41, in the present embodiment, the front surface first section 311 reaches the second surface 24 and the third surface 25. The front surface second section 312 reaches the first surface 23 and the second surface 24. The front surface third section 313 reaches the first surface 23, the second surface 24 and the fourth surface 26. The front surface fourth section 314 reaches the first surface 23 and the third surface 25.

As shown in FIG. 42, in the present embodiment, the back surface first section 321 reaches the second surface 24 and the third surface 25. The back surface second section 322 reaches the first surface 23 and the second surface 24. The back surface third section 323 reaches the first surface 23, the second surface 24 and the fourth surface 26. The back surface fourth section 324 reaches the first surface 23 and the third surface 25.

As represented by the first connecting portion 331 and the connecting portion 335 shown in FIG. 43, the connecting portion 33 of the present embodiment is provided by forming metal plating layers on the inner surfaces of the grooves formed in the base 2 along the z direction. Thus, the connecting portion 33 of the present embodiment is in contact with any of the first surface 23, the second surface 24, the third surface 25 and the fourth surface 26.

The first connecting portions 331 connect the front surface first section 311 and the back surface first section 321 to each other. The first connecting portions 331 are aligned in the x direction along the third surface 25.

The second connecting portions 332 connect the front surface second section 312 and the back surface second section 322 to each other. The second connecting portions 332 are arranged on the respective sides in the x direction. Some of the second connecting portion 332 are aligned in the y direction along the first surface 23. Others of the second connecting portion 332 are aligned in the y direction along the second surface 24.

The third connecting portions 333 connect the front surface third section 313 and the back surface third section 323 to each other. The third connecting portions 333 are aligned in the x direction along the fourth surface 26.

The fourth connecting portion 334 connects the front surface fourth section 314 and the back surface fourth section 324 to each other. The fourth connecting portion 334 adjoins the third surface 25.

The present embodiment can also reduce the inductance component and has the same advantages as those of the semiconductor laser device A1.

Fifth Embodiment First Variation

Figure 44:
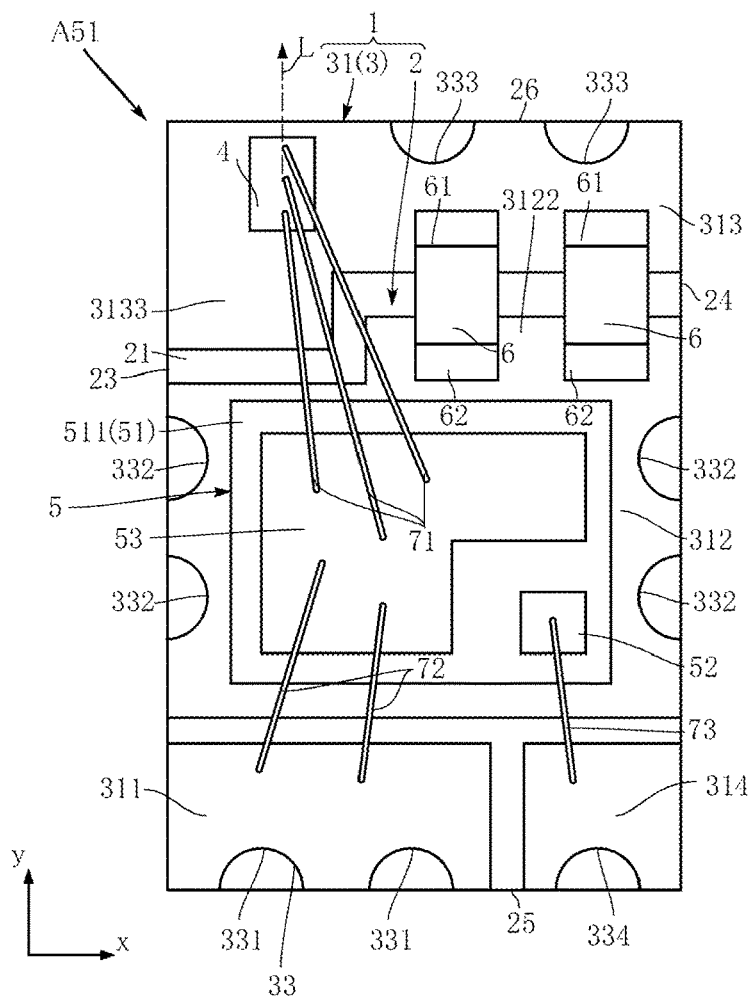
FIG. 44 is a schematic plan view showing a first variation of the semiconductor laser device according to the fifth embodiment of the present disclosure.
Figure 45:
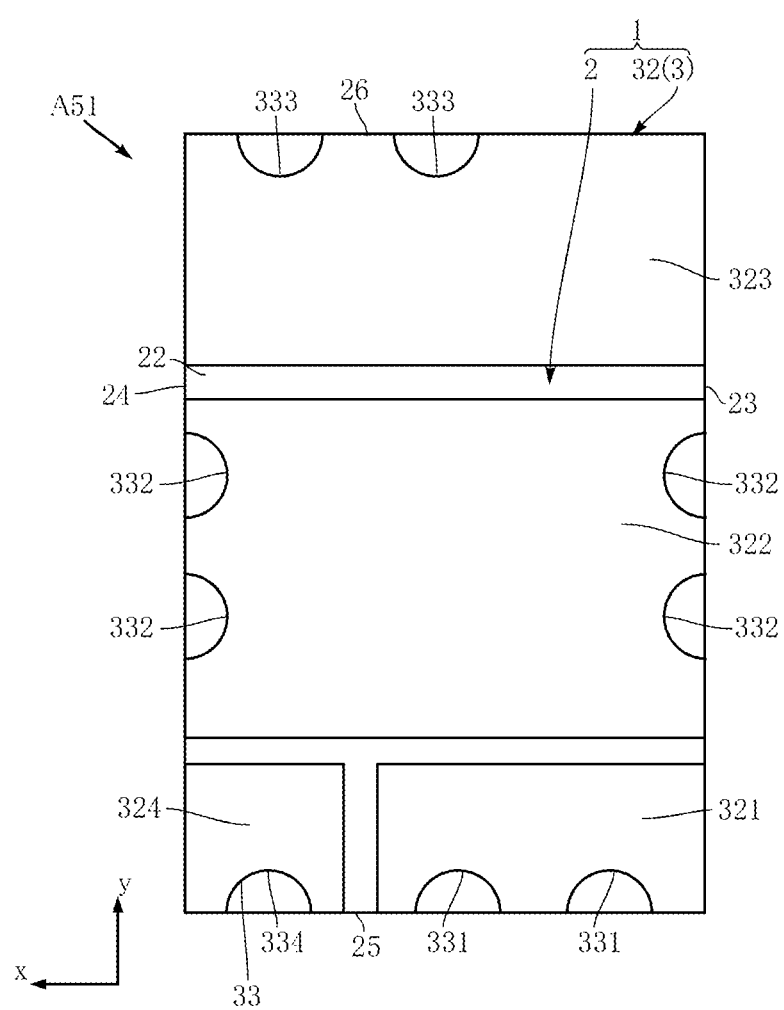
FIG. 45 is a bottom view showing the first variation of the semiconductor laser device according to the fifth embodiment of the present disclosure.

FIG. 44 is a schematic plan view showing a first variation of the semiconductor laser device A5. FIG. 45 is a bottom view showing the first variation of the semiconductor laser device A5.

The arrangement of the front surface portion 31, the back surface portion 32, the semiconductor laser element 4, the switching element 5, the capacitors 6, the first wires 71, the second wires 72 and the third wire 73 of the semiconductor laser device A51 of the present variation is similar to that in the semiconductor laser device A11. The configurations of the first connecting portions 331, the second connecting portions 332, the third connecting portions 333 and the fourth connecting portion 334 are the same as those in the semiconductor laser device A5.

The present embodiment can also reduce the inductance component and has the same advantages as those of the semiconductor laser device A11.

Fifth Embodiment Second Variation

Figure 46:
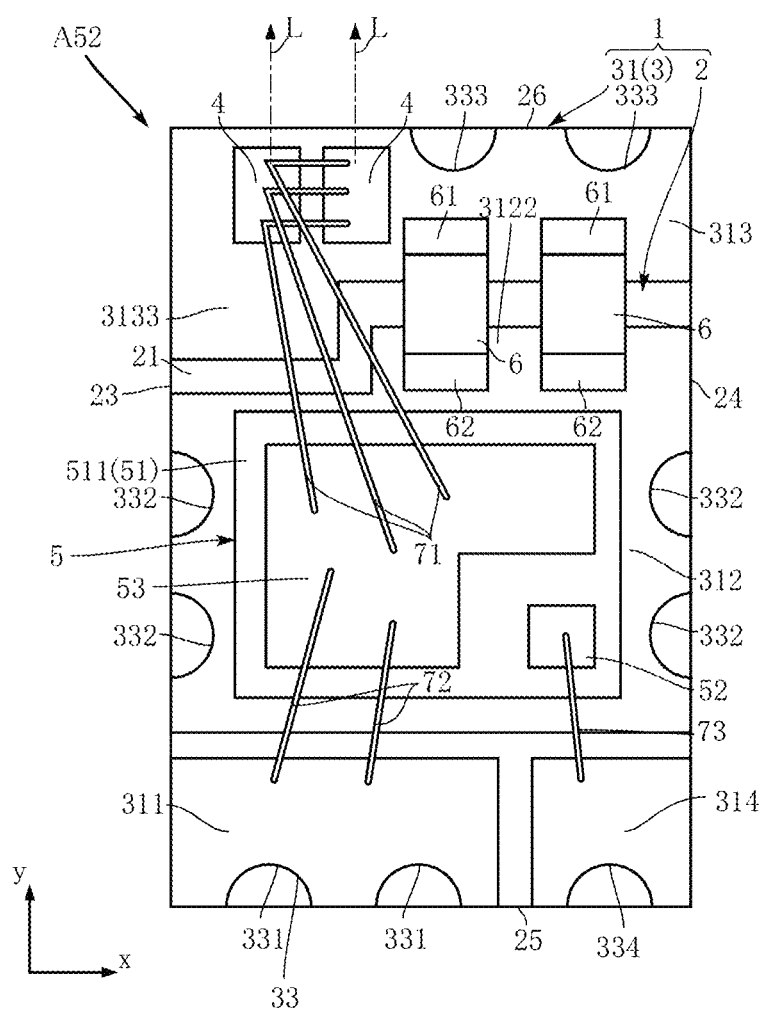
FIG. 46 is a schematic plan view showing a second variation of the semiconductor laser device according to the fifth embodiment of the present disclosure.
Figure 47:
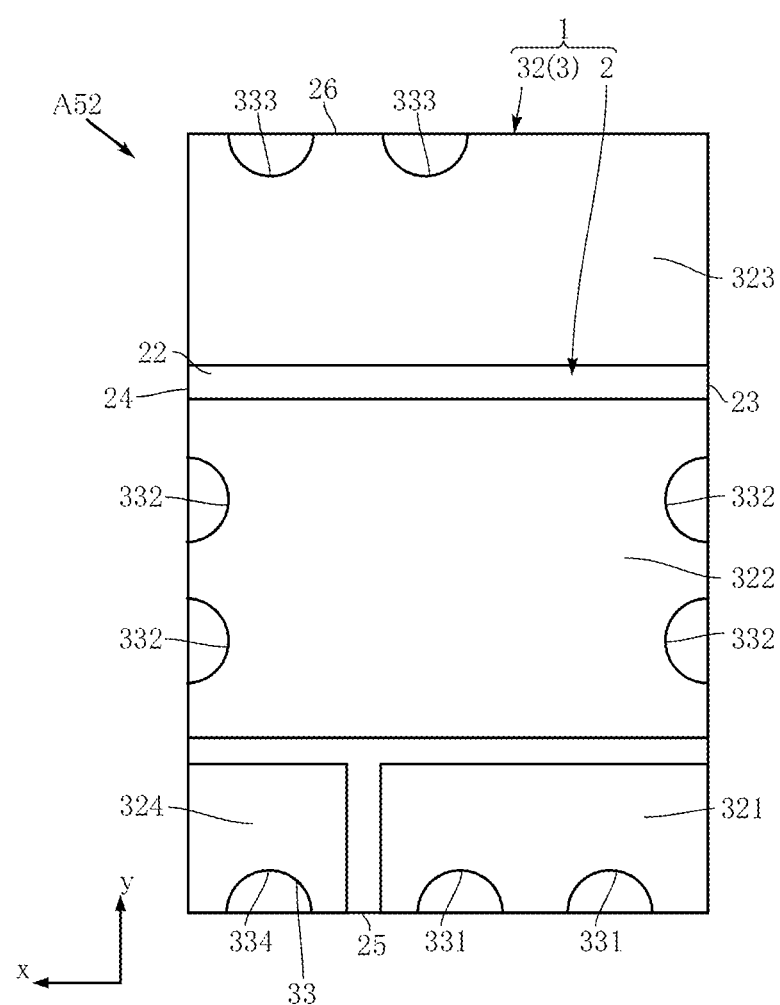
FIG. 47 is a bottom view showing the second variation of the semiconductor laser device according to the fifth embodiment of the present disclosure.

FIG. 46 is a schematic plan view showing a second variation of the semiconductor laser device A5. FIG. 47 is a bottom view showing the second variation of the semiconductor laser device A5.

The arrangement of the front surface portion 31, the back surface portion 32, the semiconductor laser elements 4, the switching element 5, the capacitors 6, the first wires 71, the second wires 72 and the third wire 73 of the semiconductor laser device A52 of the present variation is similar to that in the semiconductor laser device A12. The configurations of the first connecting portions 331, the second connecting portions 332, the third connecting portions 333 and the fourth connecting portion 334 are the same as those in the semiconductor laser device A5 and the semiconductor laser device A51.

In the present variation, the third connecting portions 333 do not overlap with the two semiconductor laser elements 4 as viewed in the y direction and are disposed at a location avoiding the two semiconductor laser elements 4. The third connecting portions 333 overlap with the capacitors 6 as viewed in the y direction.

The present embodiment can also reduce the inductance component and has the same advantages as those of the semiconductor laser device A12.

Fifth Embodiment Third Variation

Figure 48:
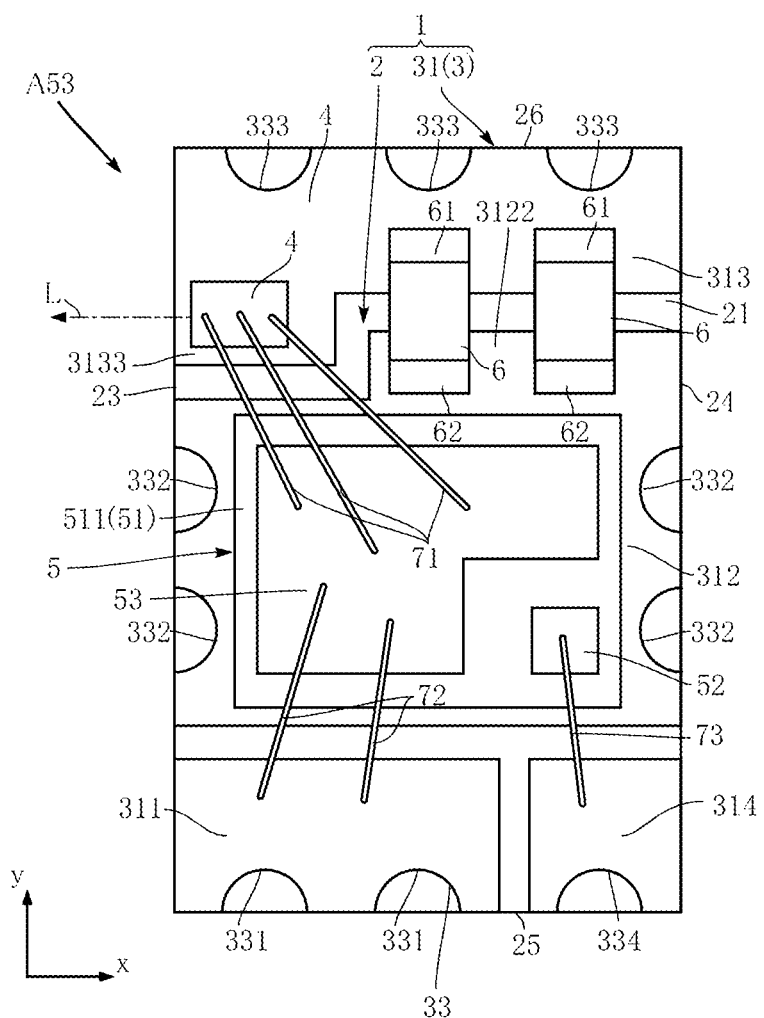
FIG. 48 is a schematic plan view showing a third variation of the semiconductor laser device according to the fifth embodiment of the present disclosure.
Figure 49:
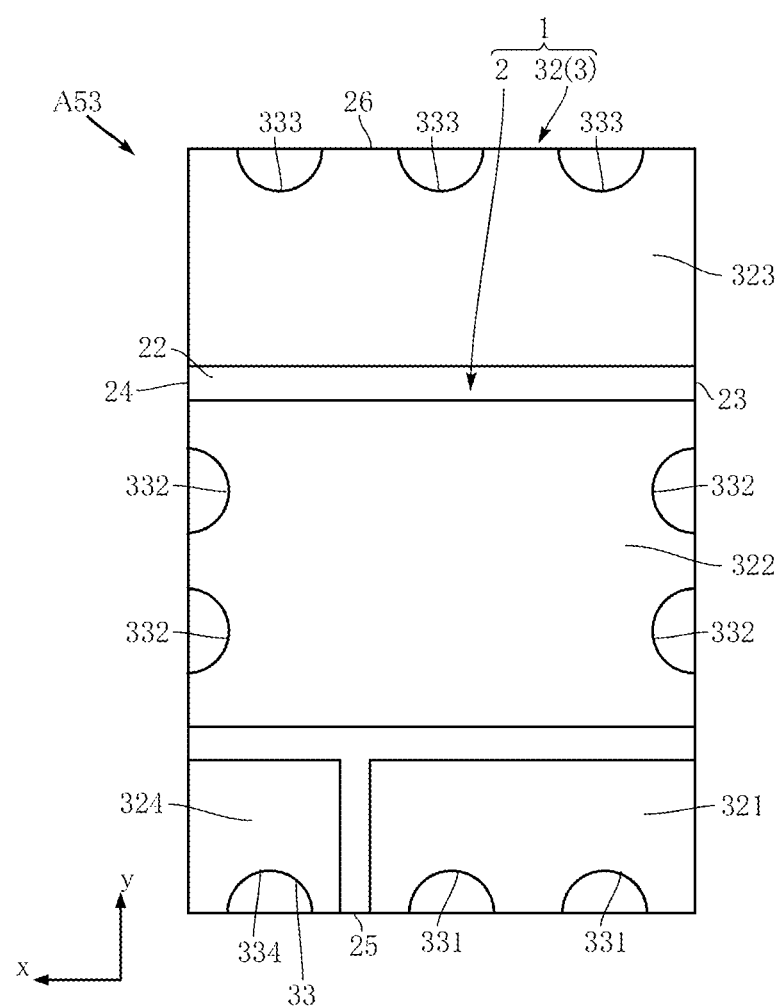
FIG. 49 is a bottom view showing the third variation of the semiconductor laser device according to the fifth embodiment of the present disclosure.

FIG. 48 is a schematic plan view showing a third variation of the semiconductor laser device according to the fifth embodiment of the present disclosure. FIG. 49 is a bottom view showing the third variation of the semiconductor laser device according to the fifth embodiment of the present disclosure.

The arrangement of the front surface portion 31, the back surface portion 32, the semiconductor laser element 4, the switching element 5, the capacitors 6, the first wires 71, the second wires 72 and the third wire 73 of the semiconductor laser device A53 of the present variation is similar to that in the semiconductor laser device A14. The configurations of the first connecting portions 331, the second connecting portions 332, the third connecting portions 333 and the fourth connecting portion 334 are the same as those in the semiconductor laser devices A5, A51 and A52.

In this variation, one of the third connecting portions 333 overlaps with the semiconductor laser element 4 as viewed in the y direction. The remaining two of the third connecting portions 333 overlap with the capacitors 6 as viewed in the y direction.

The present embodiment can also reduce the inductance component and has the same advantages as those of the semiconductor laser device A14.

Fifth Embodiment Fourth Variation

Figure 50:
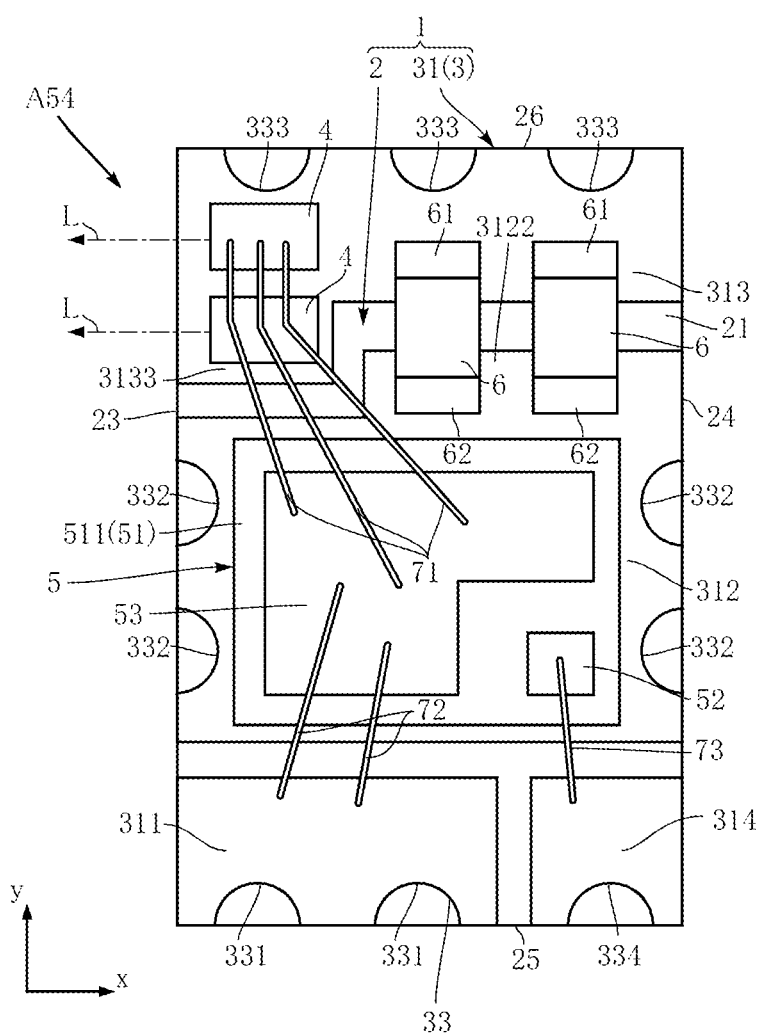
FIG. 50 is a schematic plan view showing a fourth variation of the semiconductor laser device according to the fifth embodiment of the present disclosure.
Figure 51:
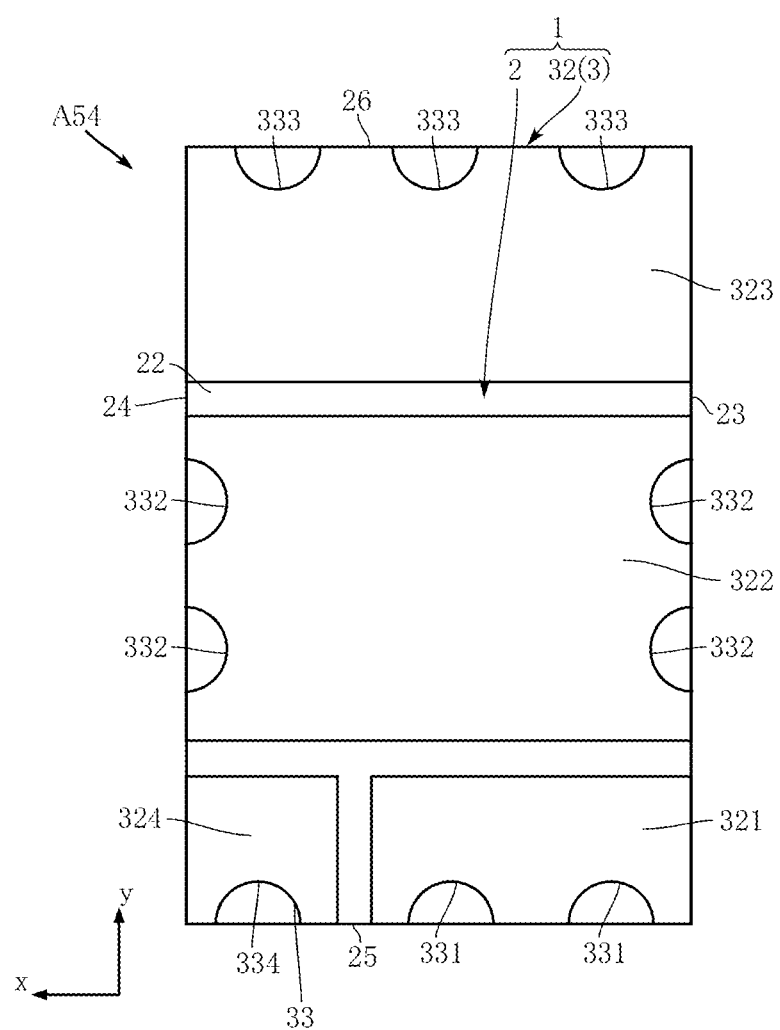
FIG. 51 is a bottom view showing the fourth variation of the semiconductor laser device according to the fifth embodiment of the present disclosure.

FIG. 50 is a schematic plan view showing a fourth variation of the semiconductor laser device A5. FIG. 51 is a bottom view showing the fourth variation of the semiconductor laser device A5.

The arrangement of the front surface portion 31, the back surface portion 32, the semiconductor laser elements 4, the switching element 5, the capacitors 6, the first wires 71, the second wires 72 and the third wire 73 of the semiconductor laser device A54 of the present variation is similar to that in the semiconductor laser device A13. The configurations of the first connecting portions 331, the second connecting portions 332, the third connecting portions 333 and the fourth connecting portion 334 are the same as those in the semiconductor laser devices A5, A51, A52 and A53.

In this variation, one of the third connecting portions 333 overlaps with two semiconductor laser elements 4 as viewed in the y direction. The remaining two of the third connecting portions 333 overlap with the capacitors 6 as viewed in the y direction.

The present variation can also reduce the inductance component and has the same advantages as those of the semiconductor laser device A13.

Sixth Embodiment

Figure 52:
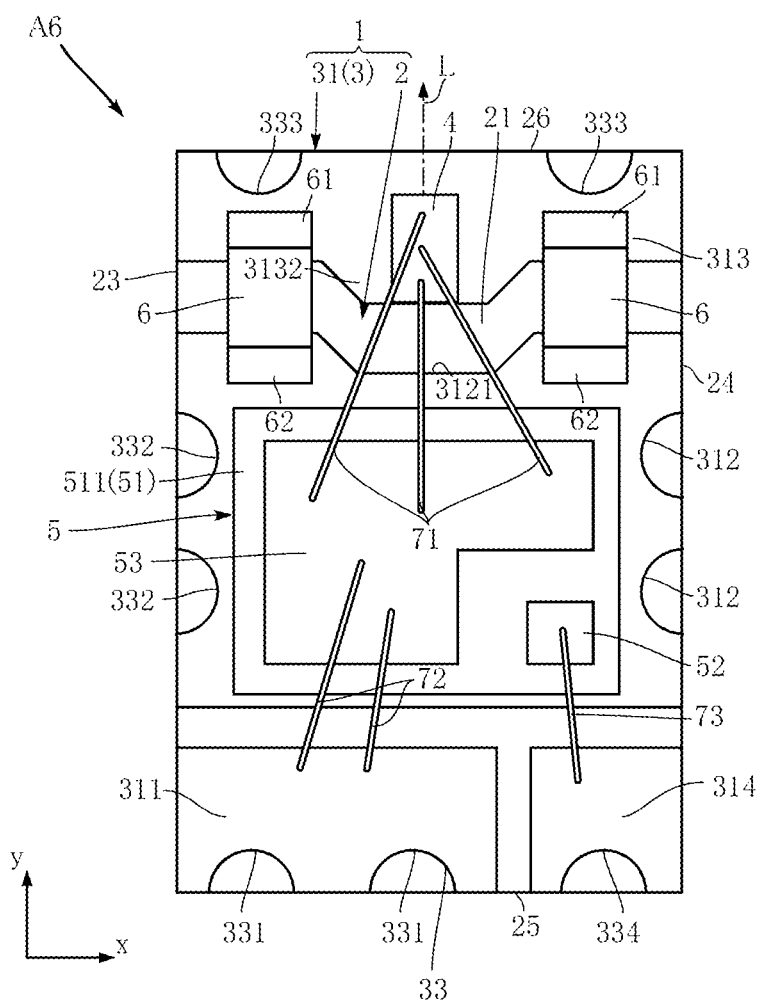
FIG. 52 is a schematic plan view showing a semiconductor laser device according to a sixth embodiment of the present disclosure.
Figure 53:
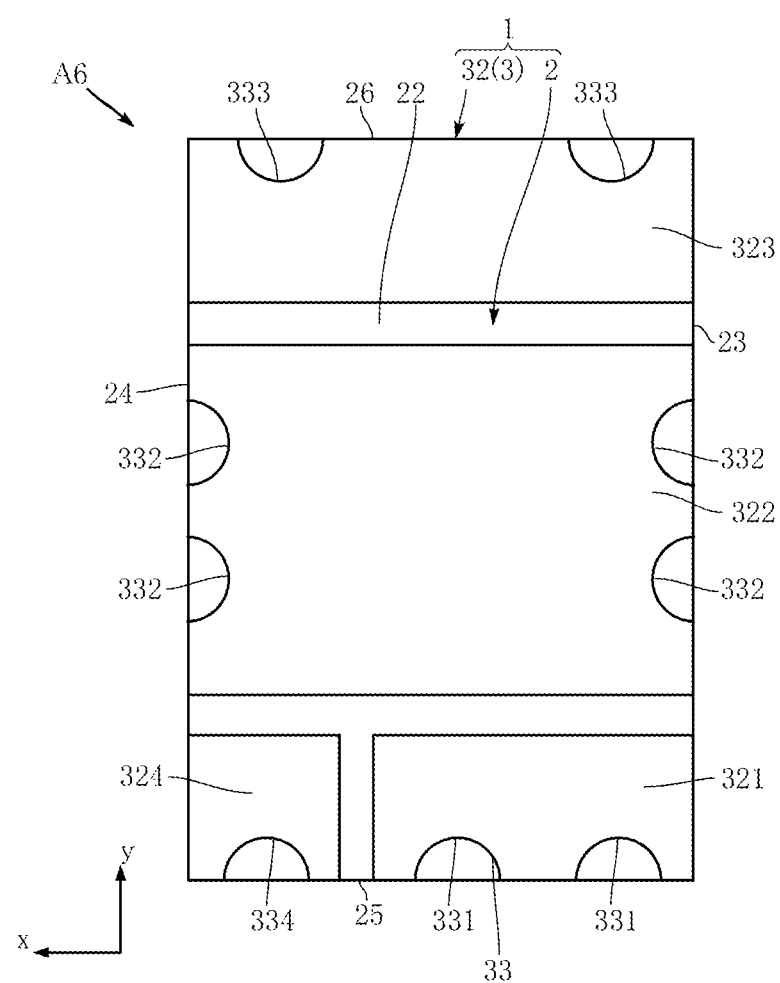
FIG. 53 is a bottom view showing the semiconductor laser device according to the sixth embodiment of the present disclosure.

FIG. 52 is a schematic plan view showing a semiconductor laser device according to a sixth embodiment of the present disclosure. FIG. 53 is a bottom view showing the semiconductor laser device according to the sixth embodiment of the present disclosure.

The arrangement of the front surface portion 31, the back surface portion 32, the semiconductor laser element 4, the switching element 5, the capacitors 6, the first wires 71, the second wires 72 and the third wire 73 of the semiconductor laser device A6 of the present embodiment is similar to that in the semiconductor laser device A2. The configurations of the first connecting portions 331, the second connecting portions 332, the third connecting portions 333 and the fourth connecting portion 334 are the same as those in the semiconductor laser device A5.

In the present embodiment, the two third connecting portions 333 are spaced apart from each other in the x direction. As viewed in the y direction, the two third connecting portions 333 overlap with the two capacitors 6 but do not overlap with the semiconductor laser element 4. That is, the semiconductor laser element 4 is located between the two third connecting portions 333 in the x direction.

The present embodiment can also reduce the inductance component and has the same advantages as those of the semiconductor laser device A2.

Sixth Embodiment First Variation

Figure 54:
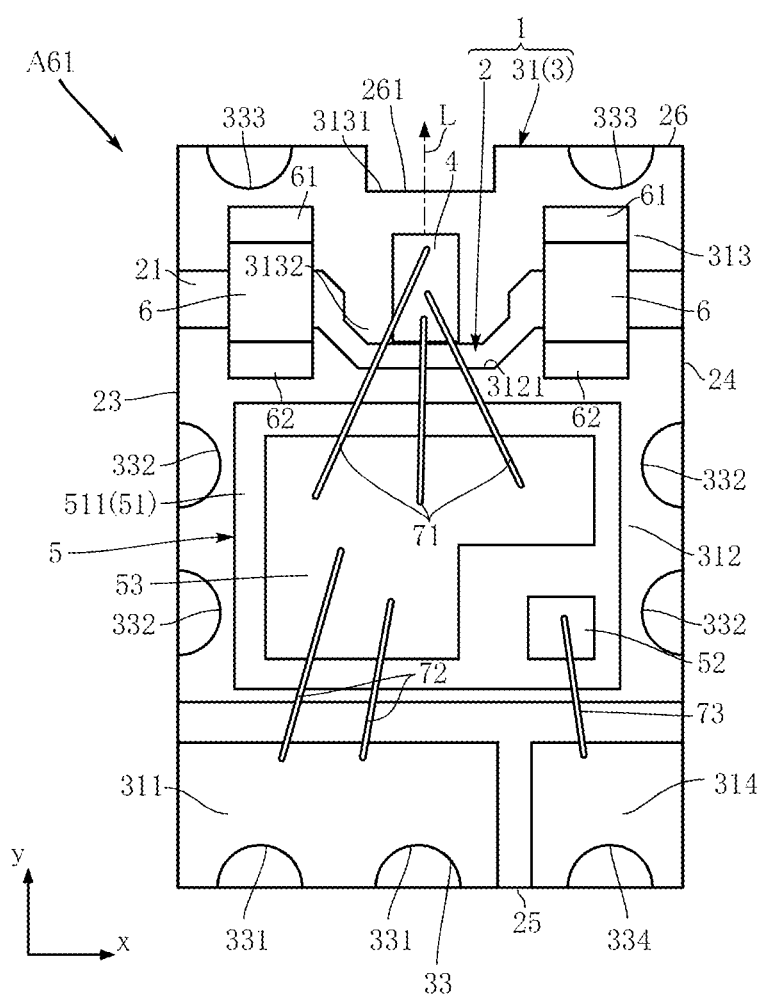
FIG. 54 is a schematic plan view showing a first variation of the semiconductor laser device according to the sixth embodiment of the present disclosure.
Figure 55:
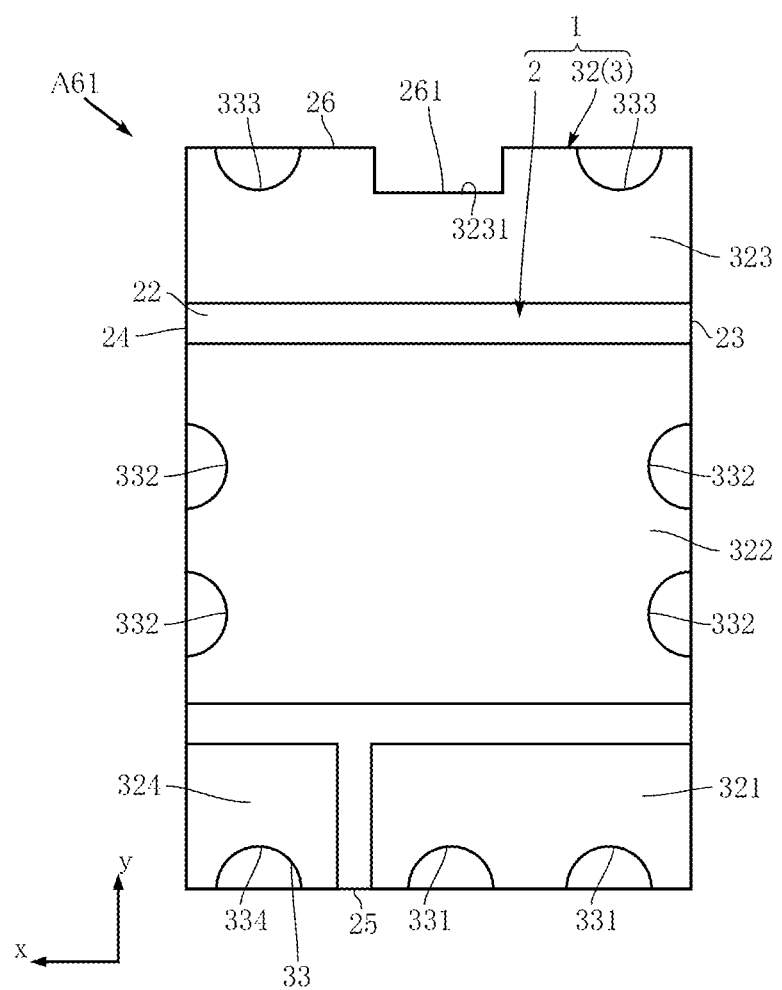
FIG. 55 is a schematic bottom view showing the first variation of the semiconductor laser device according to the sixth embodiment of the present disclosure.

FIG. 54 is a schematic plan view showing a first variation of the semiconductor laser device A6. FIG. 55 is a schematic bottom view showing the first variation of the semiconductor laser device A6.

The arrangement of the front surface portion 31, the back surface portion 32, the semiconductor laser element 4, the switching element 5, the capacitors 6, the first wires 71, the second wires 72 and the third wire 73 of the semiconductor laser device A61 of the present variation is similar to that in the semiconductor laser device A21. The configurations of the first connecting portions 331, the second connecting portions 332, the third connecting portions 333 and the fourth connecting portion 334 are the same as those in the semiconductor laser device A6.

In the present embodiment, the two third connecting portions 333 are spaced apart from each other in the x direction. As viewed in the y direction, the two third connecting portions 333 overlap with the two capacitors 6 but do not overlap with the semiconductor laser element 4 or the recess 261. That is, the semiconductor laser element 4 and the recess 261 are located between the two third connecting portions 333 in the x direction.

The present variation can also reduce the inductance component and has the same advantages as those of the semiconductor laser device A21.

Seventh Embodiment

Figure 56:
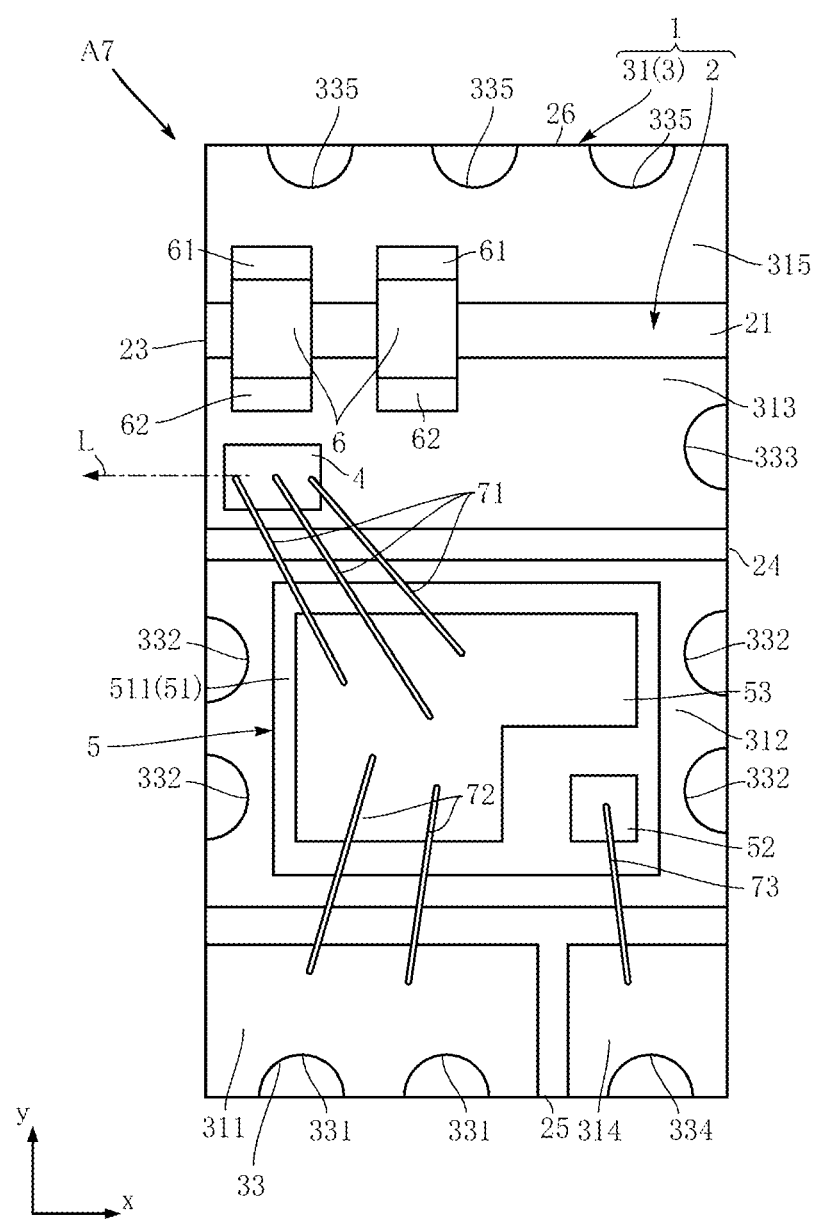
FIG. 56 is a schematic plan view showing a semiconductor laser device according to a seventh embodiment of the present disclosure.
Figure 57:
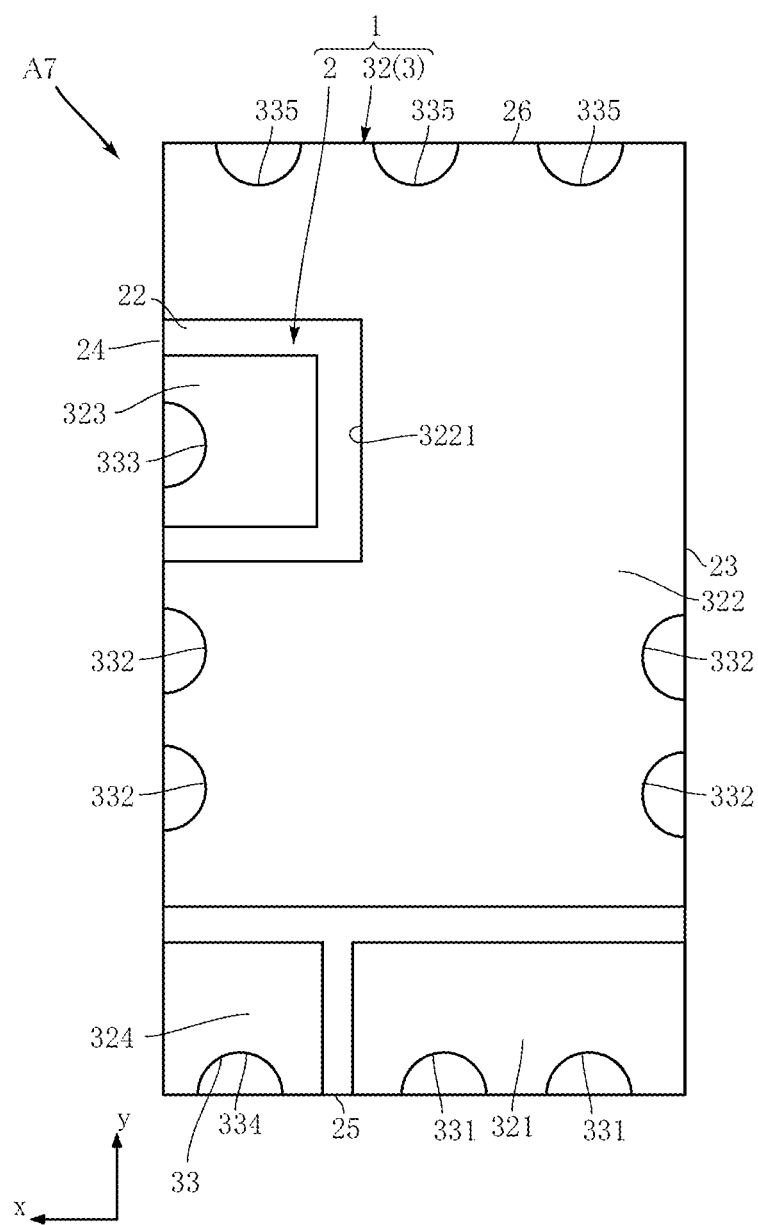
FIG. 57 is a bottom view showing the semiconductor laser device according to the seventh embodiment of the present disclosure.

FIG. 56 is a schematic plan view showing a semiconductor laser device according to a seventh embodiment of the present disclosure. FIG. 57 is a bottom view showing the semiconductor laser device according to the seventh embodiment of the present disclosure.

The arrangement of the front surface portion 31, the back surface portion 32, the semiconductor laser element 4, the switching element 5, the capacitors 6, the first wires 71, the second wires 72 and the third wire 73 of the semiconductor laser device A7 of the present embodiment is similar to that in the semiconductor laser device A3. The configurations of the first connecting portions 331, the second connecting portions 332, the third connecting portions 333 and the fourth connecting portion 334 are the same as those in the semiconductor laser devices A6 and A61.

In the present embodiment, the connecting portion 33 further includes connecting portions 335. The connecting portions 335 connect the front surface fifth section 315 and the back surface second section 322 to each other. Two of the connecting portions 335 overlap with the two capacitors 6 as viewed in the y direction. The remaining one of the connecting portions 335 does not overlap with the capacitors 6 as viewed in the y direction. The third connecting portion 333 is provided only on the side opposite the semiconductor laser element 4 in the x direction.

The present embodiment can also reduce the inductance component and has the same advantages as those of the semiconductor laser device A3. Since the third connecting portion 333 is provided only on the side opposite the semiconductor laser element 4 in the x direction, the semiconductor laser element 4 can be arranged closer to the first surface 23. Such an arrangement prevents the laser light L from the semiconductor laser element 4 from interfering with the support member 1.

Seventh Embodiment First Variation

Figure 58:
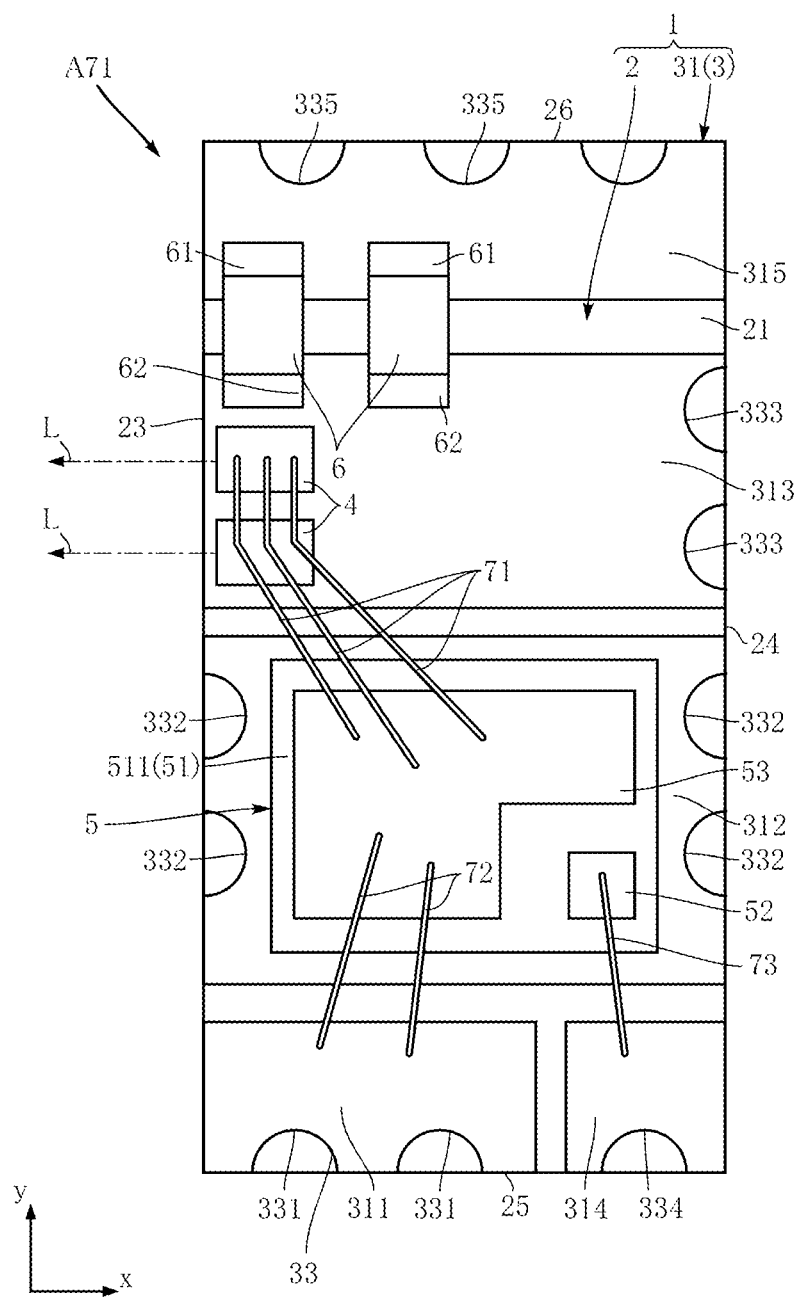
FIG. 58 is a schematic plan view showing a first variation of the semiconductor laser device according to the seventh embodiment of the present disclosure.
Figure 59:
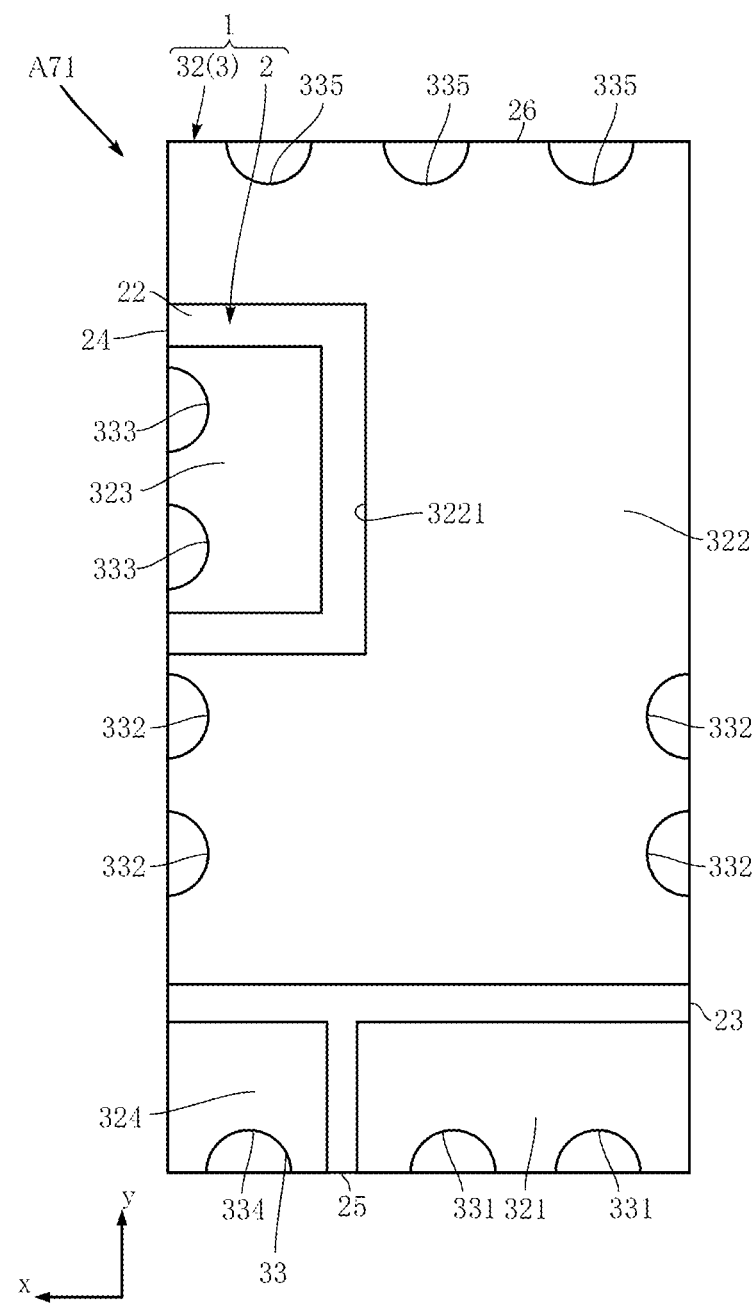
FIG. 59 is a bottom view showing the first variation of the semiconductor laser device according to the seventh embodiment of the present disclosure.

FIG. 58 is a schematic plan view showing a first variation of the semiconductor laser device A7. FIG. 59 is a bottom view showing the first variation of the semiconductor laser device A7.

The arrangement of the front surface portion 31, the back surface portion 32, the semiconductor laser elements 4, the switching element 5, the capacitors 6, the first wires 71, the second wires 72 and the third wire 73 of the present variation is similar to that in the semiconductor laser device A31. The configurations of the first connecting portions 331, the second connecting portions 332, the third connecting portions 333, the fourth connecting portion 334 and the connecting portions 335 are the same as those in the semiconductor laser device A7.

The two connecting portions 335 overlap with the two capacitors 6 as viewed in the y direction. The remaining one of the connecting portions 335 does not overlap with the capacitors 6 as viewed in the y direction.

In the present variation, two third connecting portions 333 are provided only on the side opposite the semiconductor laser element 4 in the x direction. The two third connecting portions 333 are aligned in the y direction.

The present variation can also reduce the inductance component and has the same advantages as those of the semiconductor laser device A31. Since the third connecting portions 333 are provided only on the side opposite the semiconductor laser element 4 in the x direction, the semiconductor laser element 4 can be arranged closer to the first surface 23. Such an arrangement prevents the laser light L from the semiconductor laser element 4 from interfering with the support member 1.

The semiconductor laser device according to the present disclosure is not limited to the foregoing embodiments. The specific configuration of each part of the semiconductor laser device according to the present disclosure may be varied in design in many ways.

The present disclosure includes the configurations described in the following clauses.

Clause 1.
A semiconductor laser device comprising:
a semiconductor laser element;
a switching element having a gate electrode, a source electrode and a drain electrode; and
a support member having a conductive part that forms a conduction path to the switching element and the semiconductor laser element and supports the semiconductor laser element and the switching element,
wherein the conductive part has a first section spaced apart from the semiconductor laser element,
the semiconductor laser device further comprising: at least one first wire connected to the source electrode of the switching element and the semiconductor laser element; and
at least one second wire connected to the source electrode of the switching element and the first section of the conductive part.

Clause 2.
The semiconductor laser device according to clause 1, wherein an electrical resistance of said at least one first wire is lower than an electrical resistance of said at least one second wire.

Clause 3.
The semiconductor laser device according to clause 2, wherein said at least one first wire and said at least one second wire are made of a same material,
a plurality of said first wires are provided, and the number of said first wires is larger than the number of said at least one second wire.

Clause 4.
The semiconductor laser device according to any of clauses 1-3, wherein the switching element has an element body made of a semiconductor material,
the element body has an element front surface and an element back surface that face away from each other in a first direction corresponding to a thickness direction,
the gate electrode and the source electrode are disposed on the element front surface, and
the drain electrode is disposed on the element back surface.

Clause 5.
The semiconductor laser device according to clause 4, wherein the semiconductor laser element has a first laser electrode on a side in the first direction to which the element front surface faces and a second laser electrode on a side in the first direction to which the element back surface faces, and
said at least one first wire is connected to the first laser electrode.

Clause 6.
The semiconductor laser device according to clause 5, wherein the support member has a base having a front surface and a back surface that face away from each other in the first direction.

Clause 7.
The semiconductor laser device according to clause 6, wherein the conductive part has a front surface portion disposed on the front surface and a back surface portion disposed on the back surface.

Clause 8.
The semiconductor laser device according to clause 7, wherein the conductive part includes a plurality of connecting portions that electrically connect the front surface portion and the back surface portion.

Clause 9.
The semiconductor laser device according to clause 8, wherein the front surface portion includes a front surface first section as the first section.

Clause 10.
The semiconductor laser device according to clause 9, wherein the front surface portion includes a front surface second section to which the drain electrode of the switching element is bonded for electrical connection.

Clause 11.
The semiconductor laser device according to clause 10, wherein the front surface portion includes a front surface third section to which the second laser electrode of the semiconductor laser element is bonded for electrical connection.

Clause 12.
The semiconductor laser device according to clause 11, wherein the front surface portion includes a front surface fourth section, and
the semiconductor laser device further comprises a third wire connected to the gate electrode and the front surface fourth section.

Clause 13.
The semiconductor laser device according to clause 12, further comprises a capacitor electrically intervening between the front surface second section and the front surface third section.

Clause 14.
The semiconductor laser device according to clause 13, wherein the capacitor is bonded for electrical connection to the front surface second section and the front surface third section.

Clause 15.
The semiconductor laser device according to clause 14, wherein the back surface portion includes a back surface first section electrically connected to the front surface first section, a back surface second section electrically connected to the front surface second section, a back surface third section electrically connected to the front surface third section, and a back surface fourth section electrically connected to the front surface fourth section.

Clause 16.
The semiconductor laser device according to clause 13, wherein the front surface portion includes a front surface fifth section, and
the capacitor is bonded for electrical connection to the front surface third section and the front surface fifth section.

Clause 17.
The semiconductor laser device according to clause 16, wherein the back surface portion includes a back surface first section electrically connected to the front surface first section, a back surface second section electrically connected to the front surface second section and the front surface fifth section, a back surface third section electrically connected to the front surface third section, and a back surface fourth section electrically connected to the front surface fourth section.

Clause 18.
The semiconductor laser device according to clause 11, further comprising a diode that is provided in series between the front surface first section and the front surface third section and allows an electric current to pass from the front surface third section toward the front surface first section.

Clause 19.

The semiconductor laser device according to clause 18, wherein the diode is mounted on the front surface first section.

The invention claimed is:

1. A semiconductor laser device comprising:
a semiconductor laser element;
a switching element with a gate electrode, a source electrode and a drain electrode; and
a support member including a conductive part that forms a conduction path to the switching element and the semiconductor laser element and supports the semiconductor laser element and the switching element,
wherein the conductive part has a first section spaced apart from the semiconductor laser element,
the semiconductor laser device further comprising:
at least one first wire connected to the source electrode of the switching element and the semiconductor laser element; and
at least one second wire connected to the source electrode of the switching element and the first section of the conductive part.

2. The semiconductor laser device according to claim 1, wherein an electrical resistance of said at least one first wire is lower than an electrical resistance of said at least one second wire.

3. The semiconductor laser device according to claim 2, wherein said at least one first wire and said at least one second wire are made of a same material,
a plurality of said first wires are provided, and said first wires are greater in number than said at least one second wire.

4. The semiconductor laser device according to claim 1, wherein the switching element has an element body made of a semiconductor material,
the element body has an element front surface and an element back surface that face away from each other in a first direction corresponding to a thickness direction,
the gate electrode and the source electrode are disposed on the element front surface, and
the drain electrode is disposed on the element back surface.

5. The semiconductor laser device according to claim 4, wherein the semiconductor laser element has a first laser electrode on a side in the first direction to which the element front surface faces and a second laser electrode on a side in the first direction to which the element back surface faces, and
said at least one first wire is connected to the first laser electrode.

6. The semiconductor laser device according to claim 5, wherein the support member has a base having a front surface and a back surface that face away from each other in the first direction.

7. The semiconductor laser device according to claim 6, wherein the conductive part has a front surface portion disposed on the front surface and a back surface portion disposed on the back surface.

8. The semiconductor laser device according to claim 7, wherein the conductive part includes a plurality of connecting portions that electrically connect the front surface portion and the back surface portion.

9. The semiconductor laser device according to claim 8, wherein the front surface portion includes a front surface first section as the first section.

10. The semiconductor laser device according to claim 9, wherein the front surface portion includes a front surface second section to which the drain electrode of the switching element is bonded for electrical connection.

11. The semiconductor laser device according to claim 10, wherein the front surface portion includes a front surface third section to which the second laser electrode of the semiconductor laser element is bonded for electrical connection.

12. The semiconductor laser device according to claim 11, wherein the front surface portion includes a front surface fourth section, and
the semiconductor laser device further comprises a third wire connected to the gate electrode and the front surface fourth section.

13. The semiconductor laser device according to claim 12, further comprises a capacitor electrically intervening between the front surface second section and the front surface third section.

14. The semiconductor laser device according to claim 13, wherein the capacitor is bonded for electrical connection to the front surface second section and the front surface third section.

15. The semiconductor laser device according to claim 14, wherein the back surface portion includes a back surface first section electrically connected to the front surface first section, a back surface second section electrically connected to the front surface second section, a back surface third section electrically connected to the front surface third section, and a back surface fourth section electrically connected to the front surface fourth section.

16. The semiconductor laser device according to claim 13, wherein the front surface portion includes a front surface fifth section, and
the capacitor is bonded for electrical connection to the front surface third section and the front surface fifth section.

17. The semiconductor laser device according to claim 16, wherein the back surface portion includes a back surface first section electrically connected to the front surface first section, a back surface second section electrically connected to the front surface second section and the front surface fifth section, a back surface third section electrically connected to the front surface third section, and a back surface fourth section electrically connected to the front surface fourth section.

18. The semiconductor laser device according to claim 11, further comprising a diode that is provided in series between the front surface first section and the front surface third section and allows an electric current to pass from the front surface third section toward the front surface first section.

19. The semiconductor laser device according to claim 18, wherein the diode is mounted on the front surface first section.

* * * * *